US010056492B2

(12) United States Patent
Yamazaki et al.

(10) Patent No.: US 10,056,492 B2
(45) Date of Patent: Aug. 21, 2018

(54) SEMICONDUCTOR DEVICE, DISPLAY DEVICE INCLUDING THE SEMICONDUCTOR DEVICE, DISPLAY MODULE INCLUDING THE DISPLAY DEVICE, AND ELECTRONIC APPLIANCE INCLUDING THE SEMICONDUCTOR DEVICE, THE DISPLAY DEVICE, OR THE DISPLAY MODULE

(71) Applicant: Semiconductor Energy Laboratory Co., Ltd., Atsugi-shi, Kanagawa-ken (JP)

(72) Inventors: Shunpei Yamazaki, Tokyo (JP); Junichi Koezuka, Tochigi (JP); Masami Jintyou, Tochigi (JP); Daisuke Kurosaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/597,297

(22) Filed: May 17, 2017

(65) Prior Publication Data
US 2017/0256648 A1 Sep. 7, 2017

Related U.S. Application Data

(63) Continuation of application No. 14/632,177, filed on Feb. 26, 2015, now Pat. No. 9,660,087.

(30) Foreign Application Priority Data

Feb. 28, 2014 (JP) .................................. 2014-039139

(51) Int. Cl.
*H01L 29/786* (2006.01)
*H01L 29/26* (2006.01)
*H01L 29/66* (2006.01)

(52) U.S. Cl.
CPC ........ *H01L 29/78606* (2013.01); *H01L 29/26* (2013.01); *H01L 29/66969* (2013.01); *H01L 29/7869* (2013.01); *H01L 29/78648* (2013.01)

(58) Field of Classification Search
CPC ......... H01L 29/66969; H01L 29/78606; H01L 29/7869
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 103545318 A 1/2014
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Thomas L Dickey
(74) *Attorney, Agent, or Firm* — Fish & Richardson P.C.

(57) ABSTRACT

A semiconductor device including a transistor is provided. The transistor includes a gate electrode, a first insulating film over the gate electrode, a second insulating film over the first insulating film, an oxide semiconductor film over the second insulating film, a source electrode and a drain electrode electrically connected to the oxide semiconductor film, a third insulating film over the source electrode, and a fourth insulating film over the drain electrode. A fifth insulating film including oxygen is provided over the transistor. The
(Continued)

third insulating film includes a first portion, the fourth insulating film includes a second portion, and the fifth insulating film includes a third portion. The amount of oxygen molecules released from each of the first portion and the second portion is smaller than the amount of oxygen molecules released from the third portion when the amounts are measured by thermal desorption spectroscopy.

33 Claims, 52 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 8,148,721 B2 | 4/2012 | Hayashi et al. |
| 8,551,824 B2 | 10/2013 | Yamazaki et al. |
| 8,785,258 B2 | 7/2014 | Yamazaki |
| 8,828,794 B2 | 9/2014 | Yamazaki et al. |
| 8,828,811 B2 | 9/2014 | Yamazaki |
| 8,865,534 B2 | 10/2014 | Yamazaki |
| 8,945,982 B2 | 2/2015 | Yamazaki |
| 9,048,324 B2 | 6/2015 | Miyamoto et al. |
| 9,412,874 B2 | 8/2016 | Miyamoto et al. |
| 9,831,325 B2 | 11/2017 | Miyamoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0284844 A1 | 11/2011 | Endo et al. |
| 2012/0018727 A1 | 1/2012 | Endo et al. |
| 2012/0261664 A1 | 10/2012 | Saito |
| 2012/0319175 A1 | 12/2012 | Endo et al. |
| 2013/0075735 A1* | 3/2013 | Watanabe ........... H01L 29/7869 257/57 |
| 2013/0137232 A1 | 5/2013 | Ito et al. |
| 2014/0001467 A1 | 1/2014 | Yamazaki et al. |
| 2014/0004656 A1* | 1/2014 | Sasagawa ......... H01L 29/66969 438/104 |
| 2014/0021466 A1 | 1/2014 | Yamazaki et al. |
| 2014/0151686 A1 | 6/2014 | Yamazaki et al. |
| 2014/0154837 A1 | 6/2014 | Yamazaki |
| 2014/0225103 A1 | 8/2014 | Tezuka et al. |
| 2014/0291672 A1 | 10/2014 | Yamazaki et al. |
| 2014/0306221 A1 | 10/2014 | Yamazaki et al. |
| 2014/0374908 A1 | 12/2014 | Koezuka et al. |
| 2015/0249157 A1 | 9/2015 | Yamazaki et al. |
| 2015/0372022 A1 | 12/2015 | Okazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2012-009836 A | 1/2012 |
| JP | 2014-022492 A | 2/2014 |
| JP | 2014-209613 A | 11/2014 |
| JP | 2014-220493 A | 11/2014 |
| JP | 2015-026831 A | 2/2015 |
| KR | 2014-0123428 A | 10/2014 |
| TW | 201351649 | 12/2013 |
| WO | WO-2004/114391 | 12/2004 |
| WO | WO-2013/168687 | 11/2013 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS"; SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B); 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '03 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2015/051147) dated Jun. 9, 2015.

Written Opinion (Application No. PCT/IB2015/051147) dated Jun. 9, 2015.

Taiwanese Office Action (Application No. 104106352) dated Apr. 23, 2018.

* cited by examiner

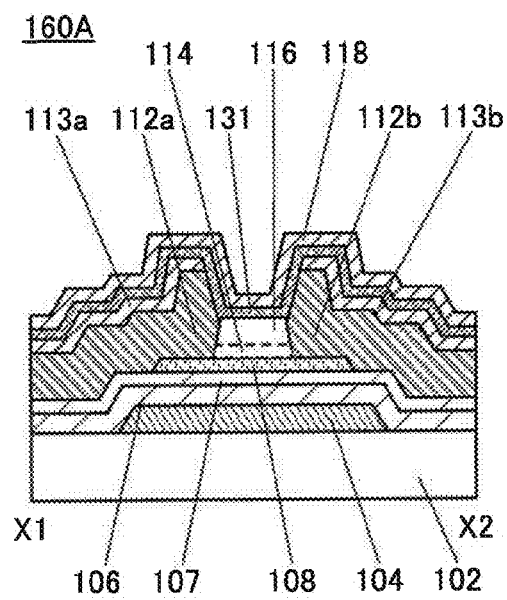
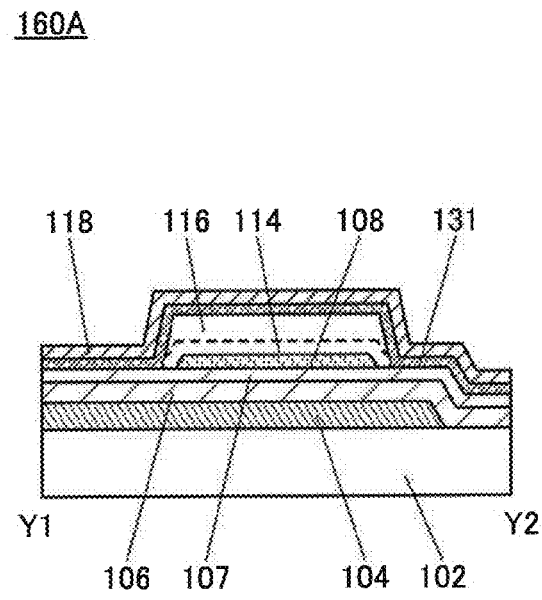
FIG. 7A
FIG. 7B

FIG. 26A initial state ($V_oH$)
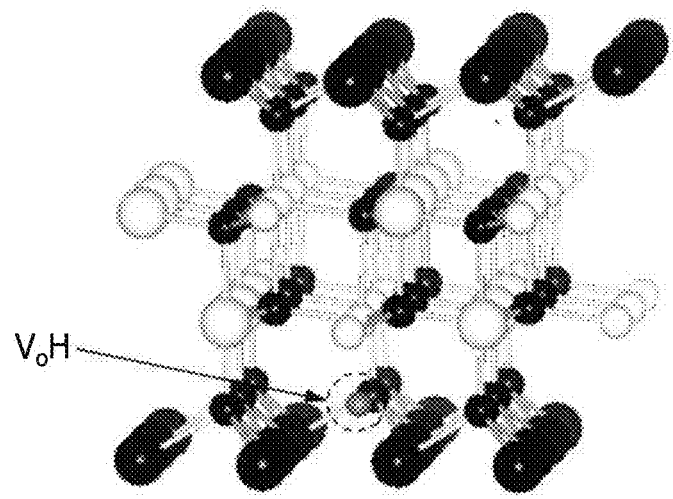
FIG. 26B final state ($V_o$, H-O)
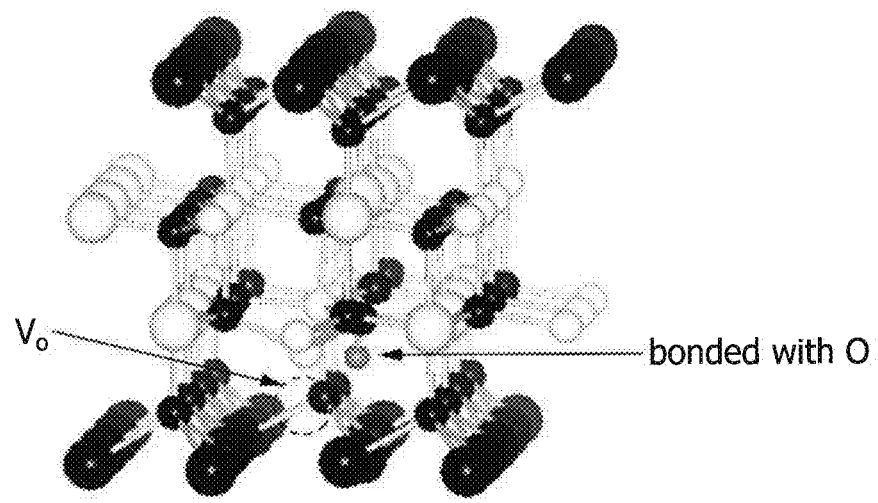

FIG. 28A  initial state ($V_oH$)
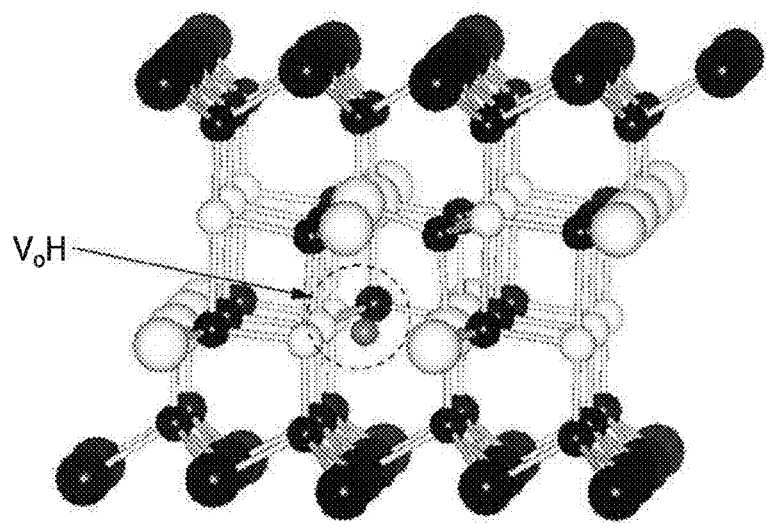
FIG. 28B  final state ($V_o$, H-O)
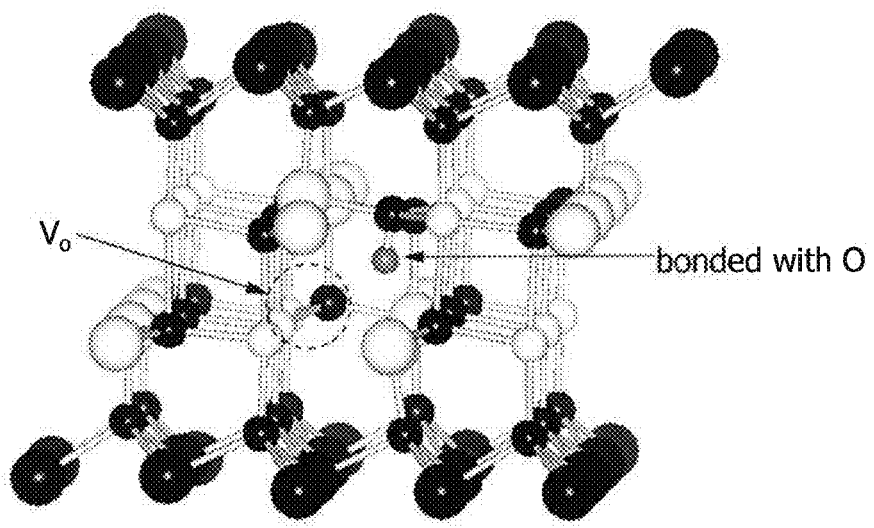

InGaZnO₄

FIG. 47A
100 psec after collision of Ar
FIG. 47B
100 psec after collision of O
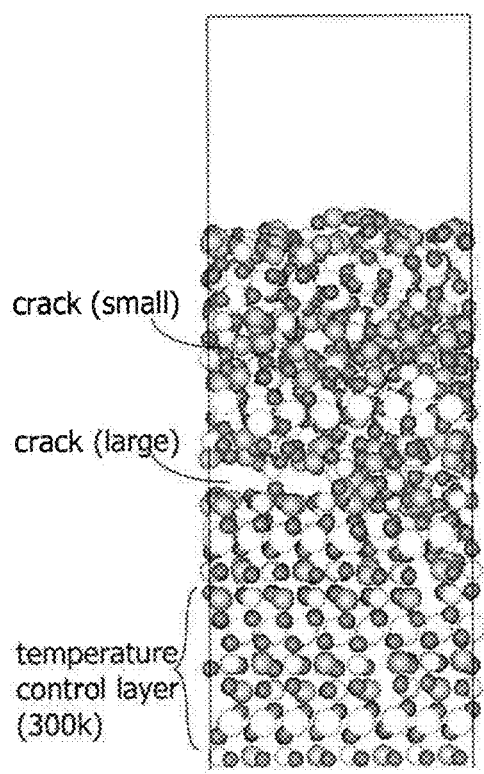
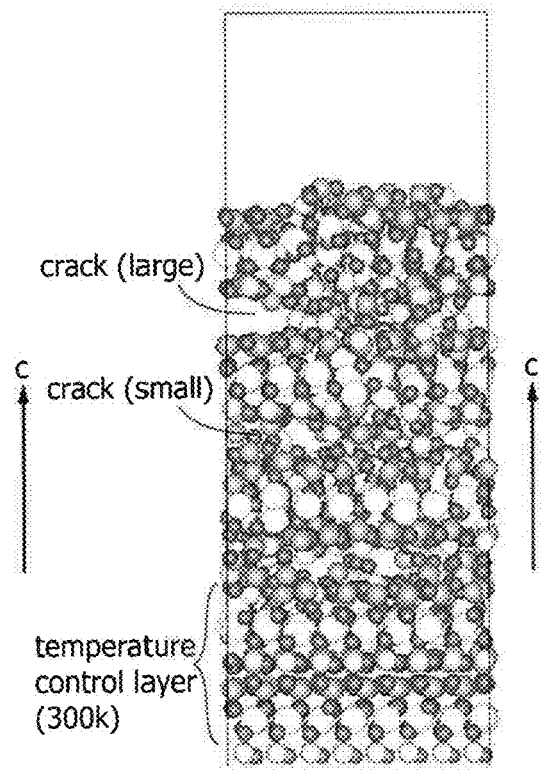
In : ◌  Ga : ○  Zn : ◎  O : ● trajectories of atoms
0-0.3 psec after the incidence of Ar

Zn, originally in the 3rd layer
(Ga-Zn-O layer), reaches the
vcinity of the 6th layer
Ga-Zn-O layer)

trajectories of atoms
0-0.3 psec after the incidence of O

Zn, originally in the 3rd layer
(Ga-Zn-O layer), does not
reach the 5th layer (In-O layer)

CAAC-OS film target

SEMICONDUCTOR DEVICE, DISPLAY DEVICE INCLUDING THE SEMICONDUCTOR DEVICE, DISPLAY MODULE INCLUDING THE DISPLAY DEVICE, AND ELECTRONIC APPLIANCE INCLUDING THE SEMICONDUCTOR DEVICE, THE DISPLAY DEVICE, OR THE DISPLAY MODULE

CROSS-REFERENCE TO RELATED APPLICATIONS

This application is a continuation of U.S. application Ser. No. 14/632,177, filed Feb. 26, 2015, now allowed, which claims the benefit of a foreign priority application filed in Japan as Serial No. 2014-039139 on Feb. 28, 2014, both of which are incorporated by reference.

TECHNICAL FIELD

One embodiment of the present invention relates to a semiconductor device including an oxide semiconductor and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

Furthermore, for example, Patent document 2 discloses a semiconductor device in which, to reduce oxygen vacancy in an oxide semiconductor layer, an insulating film which releases oxygen by heating is used as a base insulating layer of the oxide semiconductor layer where a channel is formed.

REFERENCE

Patent Document

[Patent Document 1] Japanese Published Patent Application No. 2006-165529
[Patent Document 2] Japanese Published Patent Application No. 2012-009836

In the case where a transistor is manufactured using an oxide semiconductor film for a channel region, oxygen vacancy formed in the oxide semiconductor film adversely affects the transistor characteristics; therefore, the oxygen vacancy causes a problem. For example, oxygen vacancy formed in the oxide semiconductor film is bonded with hydrogen to serve as a carrier supply source. The carrier supply source generated in the oxide semiconductor film causes a change in the electrical characteristics, typically, shift in the threshold voltage, of the transistor including the oxide semiconductor film. Furthermore, there is a problem in that electrical characteristics fluctuate among the transistors. Therefore, it is preferable that the amount of oxygen vacancy in the channel region of the oxide semiconductor film be as small as possible.

In view of the above problem, an object of one embodiment of the present invention is to inhibit a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all the objects. Objects other than the above objects will be apparent from and can be derived from the description of the specification and the like.

Means for Solving the Problems

One embodiment of the present invention is a semiconductor device including a transistor. The transistor includes a gate electrode, a first insulating film over the gate electrode, a second insulating film over the first insulating film, an oxide semiconductor film over the second insulating film, a source electrode electrically connected to the oxide semiconductor film, a drain electrode electrically connected to the oxide semiconductor film, a third insulating film over the source electrode, and a fourth insulating film over the drain electrode. A fifth insulating film is provided over the transistor. The fifth insulating film includes oxygen. The third insulating film includes a first portion, the fourth insulating film includes a second portion, and the fifth insulating film includes a third portion. The amount of oxygen molecules released from the first portion is smaller than the amount of oxygen molecules released from the third portion, and the amount of oxygen molecules released from the second portion is smaller than the amount of oxygen molecules released from the third portion when the amounts are measured by thermal desorption spectroscopy (TDS).

Another embodiment of the present invention is a semiconductor device including a transistor. The transistor includes a gate electrode, a first insulating film over the gate electrode, a second insulating film over the first insulating film, an oxide semiconductor film over the second insulating film, a source electrode electrically connected to the oxide semiconductor film, a drain electrode electrically connected to the oxide semiconductor film, a third insulating film over the source electrode, and a fourth insulating film over the drain electrode. A fifth insulating film is provided over the transistor. A sixth insulating film is provided over the fifth insulating film. The fifth insulating film includes oxygen. The sixth insulating film includes metal. The sixth insulating film includes at least one of oxygen and nitrogen. The third insulating film includes a first portion, the fourth insulating film includes a second portion, and the fifth insulating film includes a third portion. The amount of oxygen molecules released from the first portion is smaller than the amount of oxygen molecules released from the third portion, and the amount of oxygen molecules released from the second portion is smaller than the amount of oxygen molecules released from the third portion when the amounts are measured by thermal desorption spectroscopy.

Another embodiment of the present invention is a semiconductor device including a transistor. The transistor includes a gate electrode, a first insulating film over the gate electrode, a second insulating film over the first insulating film, an oxide semiconductor film over the second insulating film, a source electrode electrically connected to the oxide semiconductor film, a drain electrode electrically connected to the oxide semiconductor film, a third insulating film over the source electrode, a fourth insulating film over the drain electrode, and a fifth insulating film over the oxide semiconductor film. The fifth insulating film includes oxygen. The third insulating film includes a first portion, the fourth insulating film includes a second portion, and the fifth insulating film includes a third portion. The amount of oxygen molecules released from the first portion is smaller than the amount of oxygen molecules released from the third portion, and the amount of oxygen molecules released from the second portion is smaller than the amount of oxygen molecules released from the third portion when the amounts are measured by thermal desorption spectroscopy.

Another embodiment of the present invention is a semiconductor device including a transistor. The transistor includes a gate electrode, a first insulating film over the gate electrode, a second insulating film over the first insulating film, an oxide semiconductor film over the second insulating film, a source electrode electrically connected to the oxide semiconductor film, a drain electrode electrically connected to the oxide semiconductor film, a third insulating film over the source electrode, a fourth insulating film over the drain electrode, and a fifth insulating film over the oxide semiconductor film. A sixth insulating film is provided over the transistor. The sixth insulating film includes metal. The sixth insulating film includes at least one of oxygen and nitrogen. The fifth insulating film includes oxygen. The third insulating film includes a first portion, the fourth insulating film includes a second portion, and the fifth insulating film includes a third portion. The amount of oxygen molecules released from the first portion is smaller than the amount of oxygen molecules released from the third portion, and the amount of oxygen molecules released from the second portion is smaller than the amount of oxygen molecules released from the third portion when the amounts are measured by thermal desorption spectroscopy.

Another embodiment of the present invention is a semiconductor device including a transistor. The transistor includes a gate electrode, a first insulating film over the gate electrode, a second insulating film over the first insulating film, an oxide semiconductor film over the second insulating film, a source electrode electrically connected to the oxide semiconductor film, a drain electrode electrically connected to the oxide semiconductor film, a third insulating film over the source electrode, and a fourth insulating film over the drain electrode. A fifth insulating film is provided over the transistor. The fifth insulating film includes oxygen. The amount of oxygen that is released from a region of the third insulating film by heating is smaller than the amount of oxygen that is released from a region of the fifth insulating film by heating. The amount of oxygen that is released from a region of the fourth insulating film by heating is smaller than the amount of oxygen that is released from the region of the fifth insulating film by heating.

In any of the above structures, a region where an end portion of the third insulating film is aligned with an end portion of the source electrode is provided, and a region where an end portion of the fourth insulating film is aligned with an end portion of the drain electrode is provided.

In any of the above structures, the amount of oxygen molecules released from the first portion measured by thermal desorption spectroscopy is less than $1 \times 10^{19}/cm^3$, the amount of oxygen molecules released from the second portion measured by the thermal desorption spectroscopy is less than $1 \times 10^{19}/cm^3$, and the amount of oxygen molecules released from the third portion measured by the thermal desorption spectroscopy is greater than or equal to $1 \times 10^{19}/cm^3$.

In any of the above structures, the fifth insulating film preferably includes oxygen, nitrogen, and silicon. In any of the above structures, the third insulating film and the fourth insulating film preferably include nitrogen and silicon In any of the above structures, the metal included in the sixth insulating film preferably includes at least one of indium, zinc, titanium, aluminum, tungsten, tantalum, and molybdenum.

In any of the above structures, the oxide semiconductor film preferably includes O, In, Zn, and M (M is Ti, Ga, Y, Zr, La, Ce, Nd, or Hf). In any of the above structures, it is preferable that the oxide semiconductor film include a crystal part, the crystal part include a portion, and the c-axis of the portion be parallel to a normal vector of a surface where the oxide semiconductor film is formed.

Another embodiment of the present invention is a display device including the semiconductor device according to any of the above structures and a display element. Another embodiment of the present invention is a display module including the display device and a touch sensor. Another embodiment of the present invention is an electronic appliance including the semiconductor device according to any of the above structures, the display device, or the display module, and an operation key or a battery.

According to one object of one embodiment of the present invention, a change in electrical characteristics can be inhibited and reliability can be improved in a semiconductor device using a transistor including an oxide semiconductor. Alternatively, according to one embodiment of the present invention, a semiconductor device with low power consumption can be provided. According to one embodiment of the present invention, a novel semiconductor device can be provided. According to one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 7A and 7B are cross-sectional views illustrating one embodiment of a semiconductor device.

FIGS. 26A and 26B illustrate an initial state and a final state, respectively.

FIGS. 28A and 28B illustrate an initial state and a final state, respectively.

FIGS. 47A and 47B show a structure and the like of $InGaZnO_4$ after collision of an atom.

BEST MODE FOR CARRYING OUT THE INVENTION

Figure 1A:
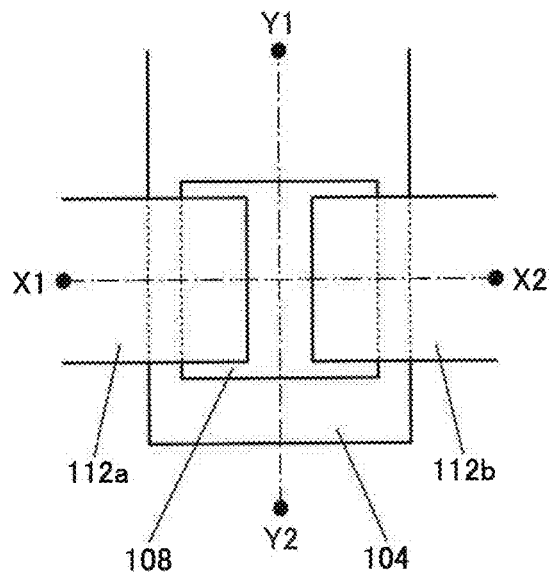
FIGS. 1A to 1C are a top view and cross-sectional views illustrating one embodiment of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale.

Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an □object having any electric function□ as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

Embodiment 1

In this embodiment, a semiconductor device of one embodiment of the present invention is described with reference to FIGS. 1A to 1C, FIGS. 2A to 2C, FIGS. 3A to 3D, FIGS. 4A to 4C, FIGS. 5A and 5B, FIGS. 6A to 6C, FIGS. 7A and 7B, FIGS. 8A to 8C, FIGS. 9A to 9D, FIGS. 10A to 10D, FIGS. 11A and 11B, FIGS. 12A to 12D, FIGS. 13A to 13D, FIGS. 14A to 14C, FIGS. 15A to 15D, FIGS. 16A to 16D, FIGS. 17A to 17C, FIGS. 18A to 18C, FIGS. 19A to 19D, and FIGS. 20A to 20D.

<Structural Example 1 of Semiconductor Device>

Figure 1B:
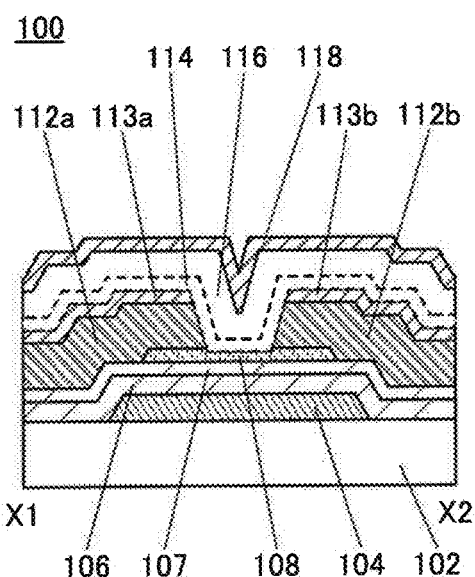
Figure 1C:
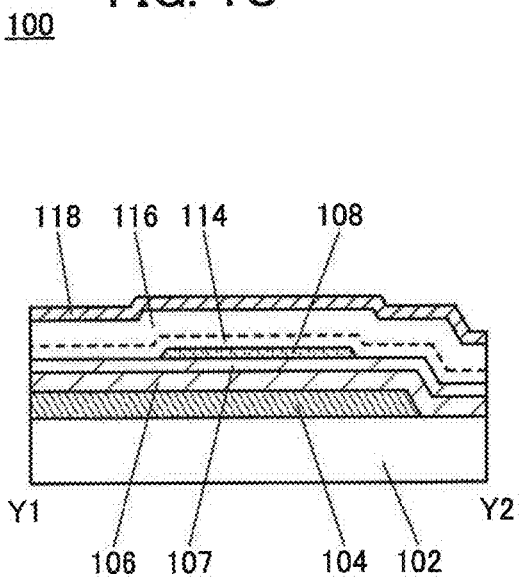

FIG. 1A is a top view of a transistor 100 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. Furthermore, the direction of the dashed dotted line X1-X1 may be called a channel length direction, and the direction of the dashed dotted line Y1-Y2 may be called a channel width direction. As in FIG. 1A, some components are not illustrated in some cases in top views of transistors described below.

The transistor 100 includes a conductive film 104 functioning as a gate electrode over a substrate 102, an insulating film 106 (also referred to as a first insulating film) over the substrate 102 and the conductive film 104, an insulating film 107 (also referred to as a second insulating film) over the insulating film 106, an oxide semiconductor film 108 over the insulating film 107, conductive films 112a and 112b functioning as a source electrode and a drain electrode electrically connected to the oxide semiconductor film 108, an insulating film 113a (also referred to as a third insulating film) over the conductive film 112a, and an insulating film 113b (also referred to as a fourth insulating film) over the conductive film 112b. Furthermore, over the transistor 100, specifically, over the insulating films 113a and 113b and the oxide semiconductor film 108, insulating films 114 and 116 (also referred to as fifth insulating films) and an insulating film 118 are provided. The insulating films 114, 116, and 118 function as protective insulating films for the transistor 100. Furthermore, the insulating films 106 and 107 function as gate insulating films of the transistor 100.

When oxygen vacancy is formed in the oxide semiconductor film 108 included in the transistor 100, electrons serving as carriers are generated; as a result, the transistor 100 tends to be normally-on. Therefore, to obtain stable transistor characteristics, it is important to reduce oxygen vacancy in the oxide semiconductor film 108. In the structure of the transistor of one embodiment of the present invention, excess oxygen is introduced into an insulating film over the oxide semiconductor film 108, here, the insulating film 114 over the oxide semiconductor film 108, whereby oxygen is moved from the insulating film 114 to the oxide semiconductor film 108 to fill oxygen vacancy in the oxide semiconductor film 108. Alternatively, excess oxygen is introduced into the insulating film 116 over the oxide semiconductor film 108, whereby oxygen is moved from the insulating film 116 to the oxide semiconductor film 108 through the insulating film 114 to fill oxygen vacancy in the oxide semiconductor film 108. Alternatively, excess oxygen is introduced into the insulating films 114 and 116 over the oxide semiconductor film 108, whereby oxygen is moved from both the insulating films 114 and 116 to the oxide semiconductor film 108 to fill oxygen vacancy in the oxide semiconductor film 108.

Therefore, the insulating films 114 and 116 include oxygen. Specifically, the insulating films 114 and 116 include oxygen that is easily moved to the oxide semiconductor film 108. Examples of the oxygen are O and $O_2$. It is preferable that the insulating films 114 and 116 include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

However, at the time of introducing oxygen into the insulating films 114 and 116, oxygen might reach the conductive films 112a and 112b, so that the conductive films 112a and 112b might be oxidized. Furthermore, after the oxygen excess region is provided in the insulating films 114 and 116, when oxygen is moved to the oxide semiconductor film 108, the conductive films 112a and 112b may adsorb oxygen, so that sufficient oxygen cannot be supplied to the oxide semiconductor film 108 in some cases.

Therefore, in the structure of the semiconductor device of one embodiment of the present invention, the insulating films 113a and 113b are provided over the conductive films 112a and 112b. When oxygen is introduced into the insulating films 114 and 116, the insulating films 113a and 113b function as protective insulating films for the conductive films 112a and 112b. Furthermore, when the conductive films 112a and 112b and the insulating films 113a and 113b are processed by the same process, they may have substantially the same top surface shapes.

By processing the conductive films 112a and 112b and the insulating films 113a and 113b by the same process, it is possible to manufacture the transistor 100 without an increase in the number of masks; therefore, the manufacturing cost can be low.

Note that in this specification and the like, the case where the conductive films 112a and 112b and the insulating films 113a and 113b have substantially the same top surface shapes includes a case where the areas of the insulating films 113a and 113b are greater than or equal to 80% and less than or equal to 120% of the areas of the conductive films 112a and 112b.

Figure 2A:
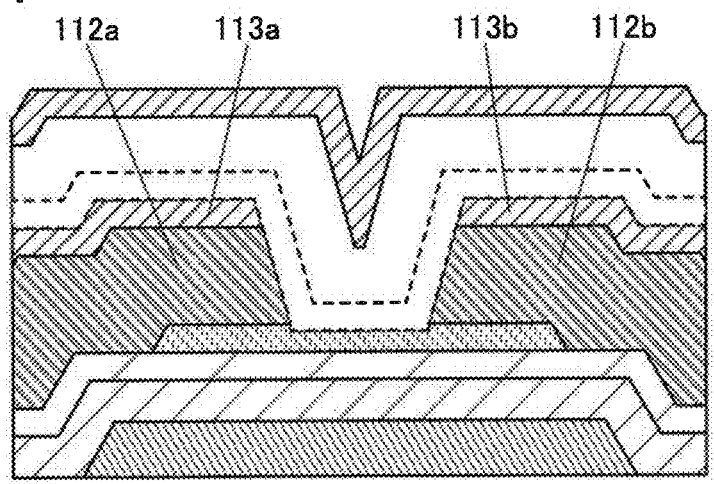
FIGS. 2A to 2C are cross-sectional views each illustrating one embodiment of a semiconductor device.
Figure 2B:
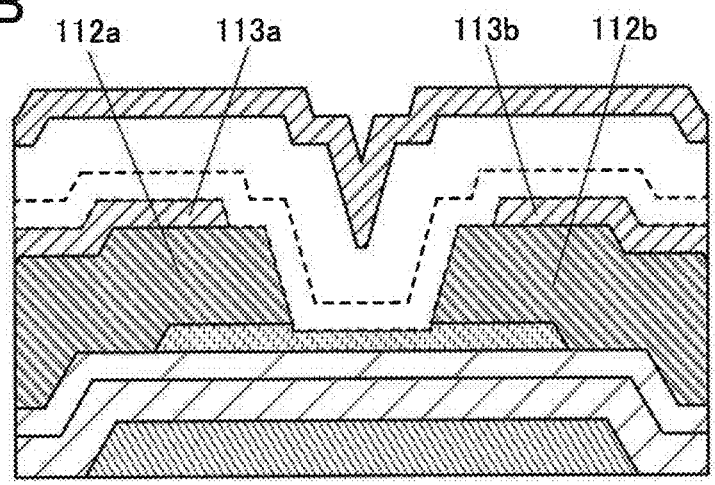
Figure 2C:
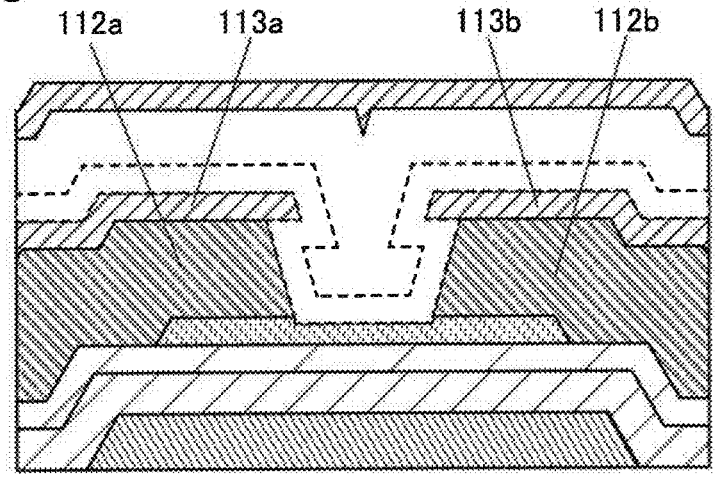

Here, enlarged views of the transistor 100 in FIG. 1B are illustrated in FIGS. 2A to 2C. FIGS. 2A to 2C each illustrate a cross-sectional view of the vicinity of the conductive films 112a and 112b and the insulating films 113a and 113b of the transistor 100 in FIG. 1B.

In the cross-sectional view of FIG. 2A, there are a region where an end portion of the insulating film 113a is aligned with an end portion of the conductive film 112a, and a region where an end portion of the insulating film 113b is aligned with an end portion of the conductive film 112b. In the cross-sectional view of FIG. 2B, there are a region where the end portion of the insulating film 113a is positioned on the inner side than the end portion of the conductive film 112a, and a region where the end portion of the insulating film 113b is positioned on the inner side than the end portion of the conductive film 112b. In the cross-sectional view of FIG. 2C, there are a region where the end portion of the insulating film 113a is positioned on the outer side than the end portion of the conductive film 112a, and a region where the end portion of the insulating film 113b is positioned on the outer side than the end portion of the conductive film 112b.

As illustrated in FIGS. 2A to 2C, in the case where the conductive films 112a and 112b and the insulating films 113a and 113b are processed by the same process, the areas of the conductive films 112a and 112b may be smaller than those of the insulating films 113a and 113b owing to a difference in etching rate therebetween or the like. Alternatively, the areas of the conductive films 112a and 112b may be larger than those of the insulating films 113a and 113b.

The insulating films 113a and 113b are capable of inhibiting permeation of oxygen. Furthermore, the insulating films 113a and 113b release a small amount of oxygen in TDS. In other words, the insulating films 113a and 113b each have a region which releases a smaller amount of oxygen than a region of the insulating films 114 and 116. When the insulating films 113a and 113b are measured by TDS, the amount of released oxygen molecules is less than $1\times10^{19}/cm^3$. Note that the insulating films 113a and 113b may include a region which releases a smaller amount of oxygen than at least a region of the insulating films 114 and 116. In particular, it is preferable that the amount of oxygen molecules released from regions of the insulating films 113a and 113b which are positioned in the vicinity of the channel region of the oxide semiconductor film 108 be smaller than the amount of oxygen molecules released from a region of the insulating films 114 and 116 which is positioned in the vicinity of the channel region of the oxide semiconductor film 108. For example, the region which releases a small amount of oxygen can be measured in such a manner that an area of 10 $mm^2$, preferably 5 $mm^2$, and preferably 1 $mm^2$ of each of the insulating films 113a and 113b and the insulating films 114 and 116 are subjected to TDS analysis. In other words, the amount of oxygen released from part of the insulating films 113a and 113b by heating is smaller than the amount of oxygen released from part of the insulating films 114 and 116 by heating.

The amount of oxygen molecules released from the insulating films 114 and 116 is greater than or equal to $1\times10^{19}/cm^3$ when measured by TDS. Oxygen can exist between lattices uniformly or substantially uniformly in the insulating films 114 and 116. Oxygen in the insulating films 114 and 116 is released to the oxide semiconductor film 108 by heat treatment.

When the insulating films 114 and 116 are provided over the oxide semiconductor film 108, oxygen in the insulating films 114 and 116 can be moved to the oxide semiconductor film 108 to fill oxygen vacancy in the oxide semiconductor film 108. The oxygen vacancy in the oxide semiconductor film 108 is filled, so that a highly reliable semiconductor device can be provided. Furthermore, when the insulating films 113a and 113b are provided over the conductive films 112a and 112b, oxidation of the conductive films 112a and 112b can be prevented.

Other constituent elements of the semiconductor device of this embodiment are described below in detail.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<Conductive Film>

The conductive film 104 functioning as a gate electrode and the conductive films 112a and 112b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of an Cu—X alloy film enables the manufacturing cost to be reduced because wet etching process can be used in the processing.

<Gate Insulating Film>

As each of the insulating films 106 and 107 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked structure of the insulating films 106 and 107, an insulating film of a single layer formed using a material selected from the above or an insulating film of three or more layers may be used.

The insulating film 106 functions as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film which is capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<Oxide Semiconductor Film>

The oxide semiconductor film 108 contains O, In, Zn, and M (M is Ti, Ga, Y, Zr, La, Ce, Nd, or Hf). Typically, In—Ga oxide, In—Zn oxide, or In-M-Zn oxide can be used for the oxide semiconductor film 108. It is particularly preferable to use In-M-Zn oxide for the semiconductor film 108.

In the case where the oxide semiconductor film 108 is formed of In-M-Zn oxide, it is preferable that the atomic ratio of metal elements of a sputtering target used for forming the In-M-Zn oxide satisfy In≥M and Zn≥M As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 108 vary from the above atomic ratio of metal elements of the sputtering target within a range of ±40% as an error.

Note that in the case where the oxide semiconductor film 108 is an In-M-Zn oxide, the proportion of In and the proportion of M, not taking Zn and O into consideration, are preferably greater than or equal to 25 atomic % and less than 75 atomic %, respectively, further preferably greater than or equal to 34 atomic % and less than 66 atomic %, respectively.

The energy gap of the oxide semiconductor film 108 is 2 eV or more, preferably 2.5 eV or more, further preferably 3 eV or more. With the use of an oxide semiconductor having such a wide energy gap, the off-state current of the transistor 150 can be reduced.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with low carrier density is used as the oxide semiconductor film 108. For example, an oxide semiconductor film whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$ is used as the oxide semiconductor film 108.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1 \times 10^6$ μm and a channel length L of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability.

Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by secondary mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, further preferably lower than or equal to $1 \times 10^{16}$ atoms/cm$^3$.

When silicon or carbon that is one of elements belonging to Group 14 is included in the oxide semiconductor film 108, oxygen vacancy is increased in the oxide semiconductor film 108, and the oxide semiconductor film 108 becomes an n-type film. Thus, the concentration of silicon or carbon (the concentration is measured by SIMS) in the oxide semiconductor film 108 or the concentration of silicon or carbon (the concentration is measured by SIMS) in the vicinity of an interface with the oxide semiconductor film 108 is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the oxide semiconductor film 108, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

Furthermore, when including nitrogen, the oxide semiconductor film 108 easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set, for example, lower than or equal to $5 \times 10^{18}$ atoms/cm$^3$.

The oxide semiconductor film 108 may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

The oxide semiconductor film 108 may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

<Protective Insulating Films>

The insulating films 113a, 113b, 114, 116, and 118 each function as a protective insulating film.

The insulating films 113a and 113b contain nitrogen. Alternatively, the insulating films 113a and 113b contain nitrogen and silicon. The insulating films 113a and 113b each have a function of blocking oxygen, hydrogen, water, an alkali metal, an alkaline earth metal, or the like. As the insulating films 113a and 113b, nitride insulating films can be used, for example. The nitride insulating film is formed using silicon nitride, silicon nitride oxide, aluminum nitride, aluminum nitride oxide, or the like. Other than the insulating film containing nitrogen, for example, aluminum oxide may be used for the insulating films 113a and 113b.

As each of the insulating films 113a and 113b, a silicon nitride film, a silicon nitride oxide film, or the like with a thickness greater than or equal to 5 nm and less than or equal to 500 nm, preferably greater than or equal to 5 nm and less than or equal to 200 nm can be used.

The insulating films 114 and 116 contain oxygen. Furthermore, the insulating film 114 is an insulating film which is permeable to oxygen. Note that the insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that penetrates the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which is permeable to oxygen is formed as the insulating film 114, oxygen released from the insulating film 116 provided over the insulating film 114 can be moved to the oxide semiconductor film 108 through the insulating film 114.

The insulating films 114 and 116 are each formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen molecules is greater than or equal to $1.0 \times 10^{19}$/cm$^3$, preferably greater than or equal to $3.0 \times 10^{20}$/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases a small amount of nitrogen oxide, an aluminum oxynitride film that releases a small amount of nitrogen oxide, or the like can be used as the oxide insulating film in which the density of states due to nitrogen oxide is low between $E_{v\_os}$ and $E_{c\_os}$.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment in which the surface temperature of a film becomes higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using, for the insulating film 114, the oxide insulating film having a low density of states due to nitrogen oxide between $E_{v\_os}$ and $E_{c\_os}$, the shift in the threshold voltage of the transistor can be reduced, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and smaller than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The nitrogen concentration of the oxide insulating film having a low density of states due to nitrogen oxide between $E_{v\_os}$ and $E_{c\_os}$ measured by SIMS is lower than or equal to $6 \times 10^{20}$ atoms/cm$^3$.

The oxide insulating film in which the density of states due to nitrogen oxide is low between $E_{v\_os}$ and $E_{c\_os}$ is formed by a PECVD method at a substrate temperature of higher than or equal to 220° C., higher than or equal to 280° C., or higher than or equal to 350° C. using silane and nitrogen oxide, whereby a dense and hard film can be formed.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be used.

The insulating film 118 contains nitrogen. Alternatively, the insulating film 118 contains nitrogen and silicon. The insulating film 118 has a function of blocking oxygen, hydrogen, water, an alkali metal, an alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Alternatively, the insulating film 118 is preferably a blocking film which releases a small amount of oxygen and/or can inhibit permeation of oxygen. When the insulating film 118 is provided over the insulating films 114 and 116, outward diffusion of excess oxygen contained in the insulating film 114 and/or the insulating film 116 can be inhibited.

Although the variety of films such as the conductive films, the insulating films, and the oxide semiconductor films which are described above can be formed by a sputtering method or a PECVD method, such films may be formed by another method, e.g., an atomic layer deposition (ALD) method or a thermal CVD method. As an example of a thermal CVD method, a metal organic chemical vapor deposition (MOCVD) method can be given.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Structure examples different from that of the transistor 100 in FIGS. 1A to 1C are described with reference to FIGS. 3A to 3D. Note that in the case where a portion has a function similar to that described above, the same hatch pattern is applied to the portion, and the portion is not especially denoted by a reference numeral in some cases.

<Structure Example 2 of Semiconductor Device>

Figure 3A:
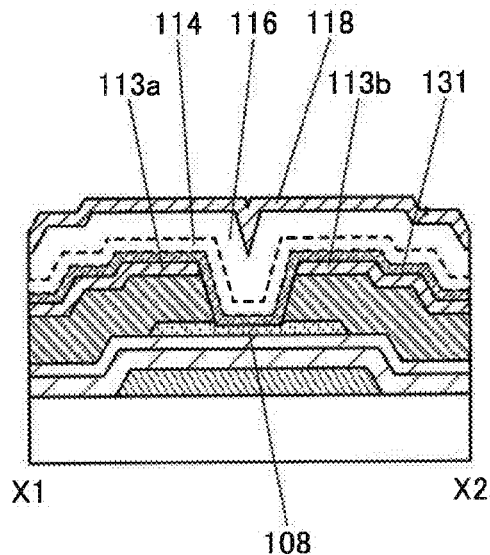
FIGS. 3A to 3D are cross-sectional views each illustrating one embodiment of a semiconductor device.
Figure 3B:
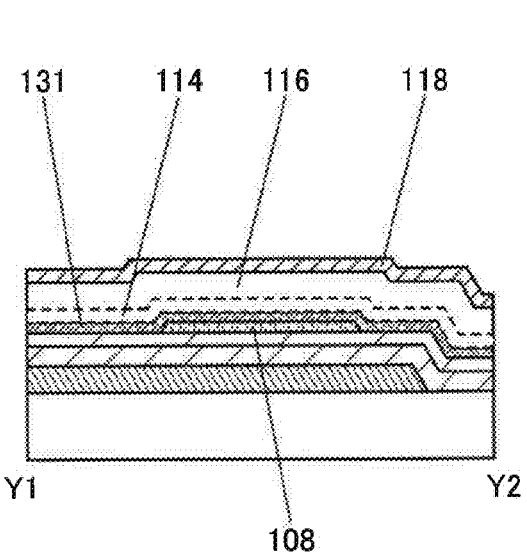
Figure 3C:
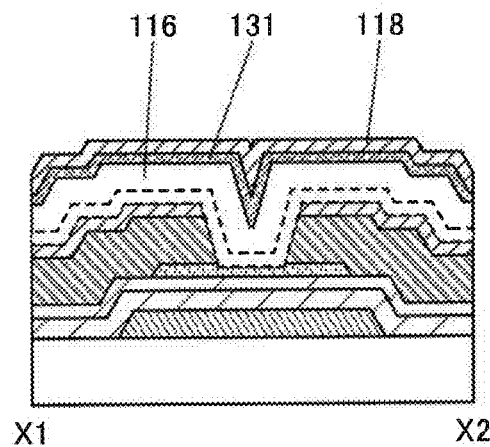
Figure 3D:
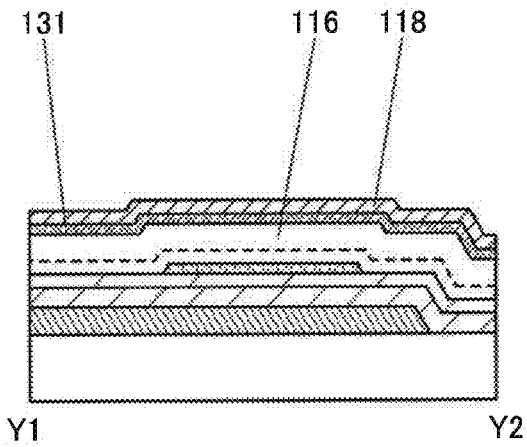

FIG. 3A is a cross-sectional view in the channel length direction of a transistor 100A and FIG. 3B is a cross-sectional view in the channel width direction of the transistor 100A. FIG. 3C is a cross-sectional view in the channel length direction of a transistor 100B and FIG. 3D is a cross-sectional view in the channel width direction of the transistor 100B. Note that top views of the transistor 100A and the transistor 100B are omitted here because they are similar to the top view of FIG. 1A.

The transistor 100A in FIGS. 3A and 3B includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the conductive films 112a and 112b functioning as a source electrode and a drain electrode which are electrically connected to the oxide semiconductor film 108, the insulating film 113a over the conductive film 112a, and the insulating film 113b over the conductive film 112b. In addition, over the transistor 100A, specifically, over the insulating films 113a and 113b and the oxide semiconductor film 108, an insulating film 131 (also referred to as a sixth insulating film) and the insulating films 114, 116, and 118 are provided. The insulating films 114, 116, 118, and 131 function as protective insulating films for the transistor 100A.

The transistor 100A is different from the transistor 100 in FIGS. 1B and 1C in that the insulating film 131 is provided. Specifically, the insulating film 131 is provided over the oxide semiconductor film 108, the insulating film 113a, and the insulating film 113b.

The transistor 100B in FIGS. 3C and 3D includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the conductive films 112a and 112b functioning as a source electrode and a drain electrode which are electrically connected to the oxide semiconductor film 108, the insulating film 113a over the conductive film 112a, and the insulating film 113b over the conductive film 112b. In addition, over the transistor 100B, specifically, over the insulating films 113a and 113b and the oxide semiconductor film 108, the insulating films 114, 116, 118, and 131 are provided. The insulating films 114, 116, 118, and 131 function as protective insulating films for the transistor 100B.

The transistor 100B is different from the transistor 100 in FIGS. 1B and 1C in that the insulating film 131 is provided. Specifically, the insulating film 131 is provided between the insulating film 116 and the insulating film 118.

The insulating film 131 is permeable to oxygen and/or capable of inhibiting release of oxygen. The insulating film 131 is formed of oxide of metal, nitride of metal, nitride oxide of metal, or oxynitride of metal, and the metal includes at least one selected from indium, zinc, titanium, aluminum, tungsten, tantalum, and molybdenum.

The insulating film 131 is provided, whereby oxygen included in the insulating film 114 and/or the insulating film 116 can be favorably moved to the oxide semiconductor film 108. Thus, oxygen vacancy in the oxide semiconductor film 108 is filled, whereby a highly reliable semiconductor device can be provided.

A structure example different from that of the transistor 100 in FIGS. 1A to 1C is described with reference to FIGS. 4A to 4C. Note that in the case where a portion has a function similar to that described above, the same hatch pattern is applied to the portion, and the portion is not especially denoted by a reference numeral in some cases.

<Structure Example 3 of Semiconductor Device>

Figure 4A:
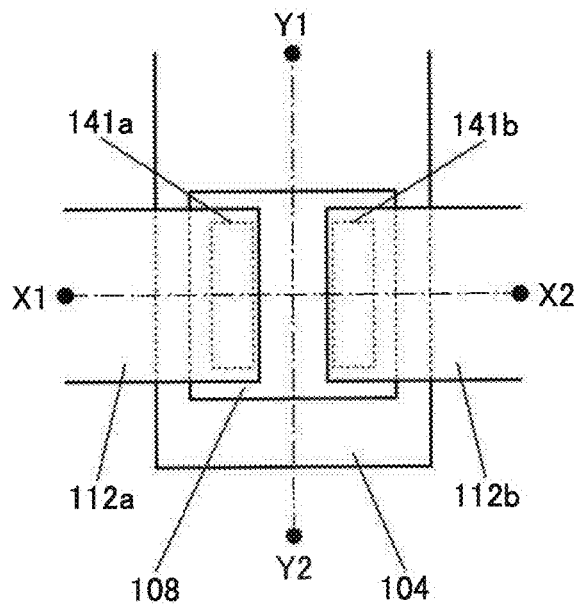
FIGS. 4A to 4C are a top view and cross-sectional views illustrating one embodiment of a semiconductor device.

FIG. 4A is a top view of a transistor 150 that is a semiconductor device of one embodiment of the present invention. FIG. 4B is a cross-sectional view taken along dashed-dotted line X1-X2 illustrated in FIG. 4A, and FIG. 4C is a cross-sectional view taken along dashed-dotted line Y1-Y2 illustrated in FIG. 4A.

The transistor 150 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive films 112a and 112b functioning as source and drain electrodes electrically connected to the oxide semiconductor film 108 though openings 141a and 141b provided in the insulating film 114 and the insulating film 116, the insulating film 113a over the conductive film 112a, and the insulating film 113b over the conductive film 112b. Over the transistor 150, specifically, over the insulating films 113a and 113b and the insulating film 116, the insulating film 118 is provided. The insulating films 113a and 113b function as protective insulating films for the conductive films 112a and 112b. The insulating film 114 and the insulating film 116 function as protective insulating films for the oxide semiconductor film 108. The insulating film 118 functions as a protective insulating film for the transistor 150.

Figure 4B:
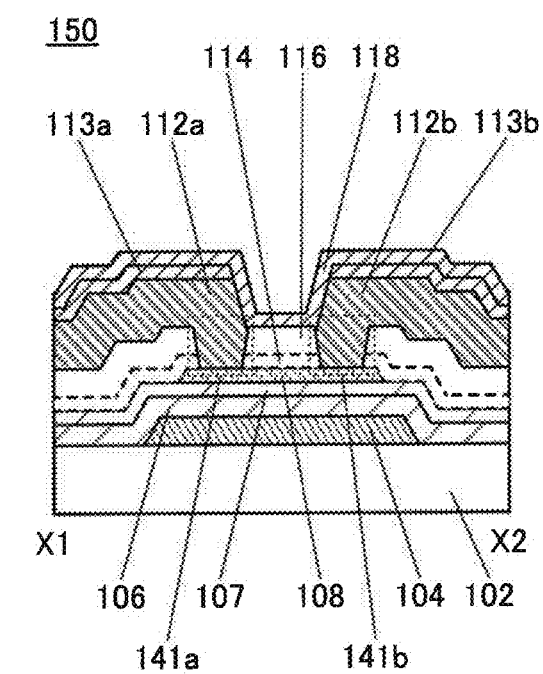
Figure 4C:
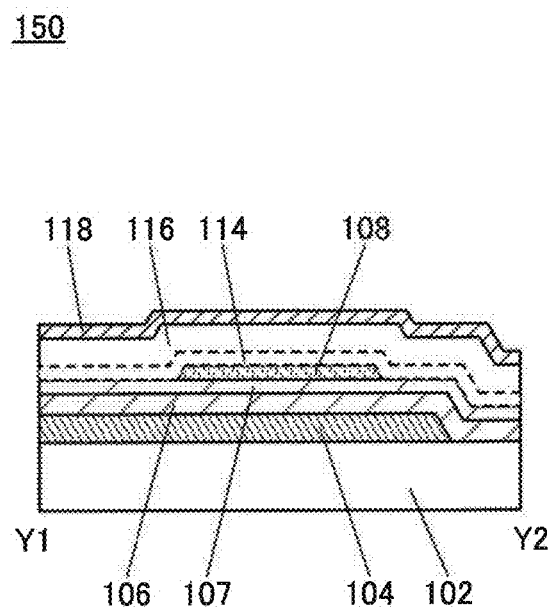

Although the transistors 100, 100A, and 100B each have a channel-etched structure, the transistor 150 in FIGS. 4A to 4C has a channel-protective structure. Thus, either the channel-etched structure or the channel-protective structure can be applied to the semiconductor device of one embodiment of the present invention.

Like the transistor 100, the transistor 150 is provided with the insulating films 114 and 116 that are formed over the oxide semiconductor film 108; therefore, oxygen included in the insulating films 114 and 116 can fill oxygen vacancy in the oxide semiconductor film 108. Furthermore, since the insulating films 113a and 113b are provided over the conductive films 112a and 112b, when the oxygen excess region is formed in the insulating films 114 and 116, oxidation of the conductive films 112a and 112b can be prevented.

A structure example different from that of the transistor 150 in FIGS. 4A to 4C is described with reference to FIGS. 5A and 5B. Note that in the case where a portion has a function similar to that described above, the same hatch pattern is applied to the portion, and the portion is not especially denoted by a reference numeral in some cases.

<Structure Example 4 of Semiconductor Device>

Figure 5A:
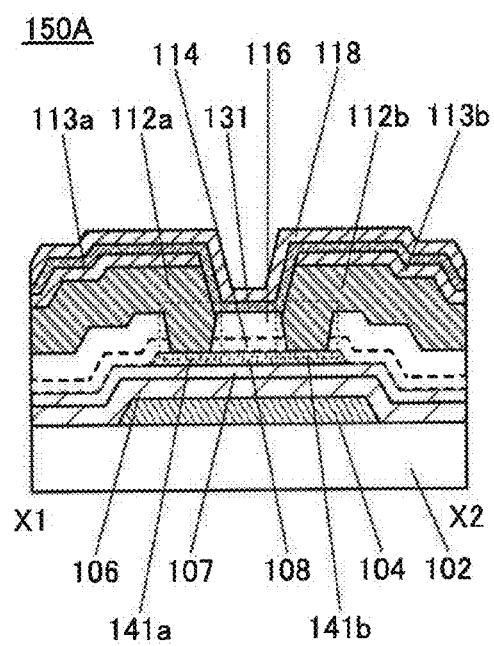
FIGS. 5A and 5B are cross-sectional views illustrating one embodiment of a semiconductor device.
Figure 5B:
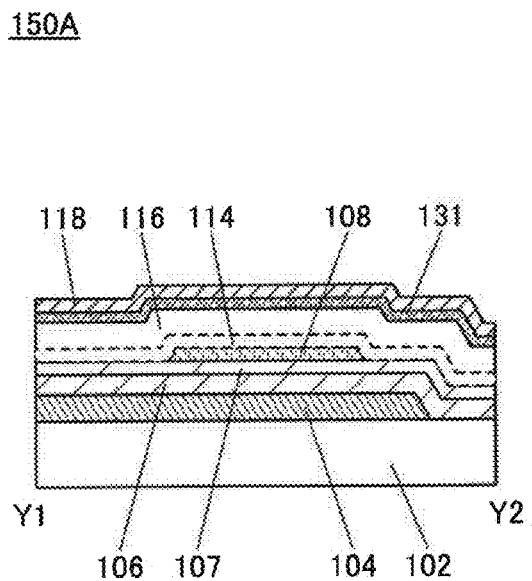

FIG. 5A is a cross-sectional view in the channel length direction of a transistor 150A and FIG. 5B is a cross-sectional view in the channel width direction of the transistor 150A. Note that a top view of the transistor 150A is omitted here because it is similar to the top view of FIG. 4A.

The transistor 150A in FIGS. 5A and 5B includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive films 112a and 112b functioning as source and drain electrodes which are electrically connected to the oxide semiconductor film 108 through the openings 141a and 141b provided in the insulating films 114 and 116, the insulating film 113a over the conductive film 112a, and the insulating film 113b over the conductive film 112b. Over the transistor 150A, specifically, over the insulating films 113a and 113b and the insulating film 116, the insulating film 131 and the insulating film 118 over the insulating film 131 are provided. The insulating film 113a and 113b function as protective insulating films for the conductive films 112a and 112b. The insulating films 114 and 116 function as protective insulating films for the oxide semiconductor film 108. The insulating films 118 and 131 function as protective insulating films for the transistor 150A.

The transistor 150A is different from the transistor 150 in FIGS. 4B and 4C in that the insulating film 131 is provided. Specifically, the insulating film 131 is provided between the insulating film 116 and the insulating film 118. The other components are the same as those of the transistor 150, and the effect similar to that in the case of the transistor 150 is obtained.

A structure example different from that of the transistor 150 in FIGS. 4A to 4C is described with reference to FIGS. 6A to 6C. Note that in the case where a portion has a function similar to that described above, the same hatch pattern is applied to the portion, and the portion is not especially denoted by a reference numeral in some cases.

<Structural Example 5 of Semiconductor Device>

Figure 6A:
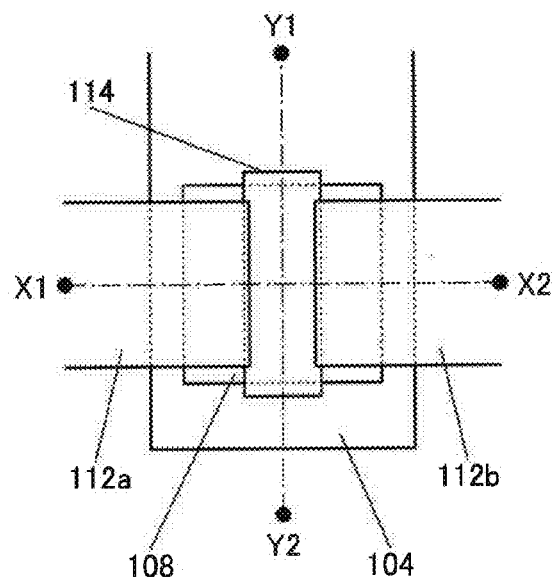
FIGS. 6A to 6C are a top view and cross-sectional views illustrating one embodiment of a semiconductor device.

FIG. 6A is a top view of a transistor 160 that is a semiconductor device of one embodiment of the present invention. FIG. 6B is a cross-sectional view taken along a dashed dotted line X1-X2 in FIG. 6A, and FIG. 6C is a cross-sectional view taken along a dashed dotted line Y1-Y2 in FIG. 6A.

The transistor 160 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive films 112a and 112b functioning as source and drain electrodes electrically connected to the oxide semiconductor film 108, the insulating film 113a over the conductive film 112a, and the insulating film 113b over the conductive film 112b. Over the transistor 160, specifically, over the insulating films 113a and 113b and the insulating film 116, the insulating film 118 is provided. The insulating films 113a and 113b function as protective insulating films for the conductive films 112a and 112b. The insulating films 114 and 116 function as protective insulating films for the oxide semiconductor film 108. The insulating film 118 functions as a protective insulating film for the transistor 160.

The transistor 160 is different from the transistor 150 in FIGS. 4A to 4C in the shapes of the insulating films 114 and 116. Specifically, the insulating films 114 and 116 of the transistor 160 have island shapes and are provided over a channel region of the oxide semiconductor film 108. The other components are the same as those of the transistor 150, and the effect similar to that in the case of the transistor 150 is obtained.

Figure 6B:
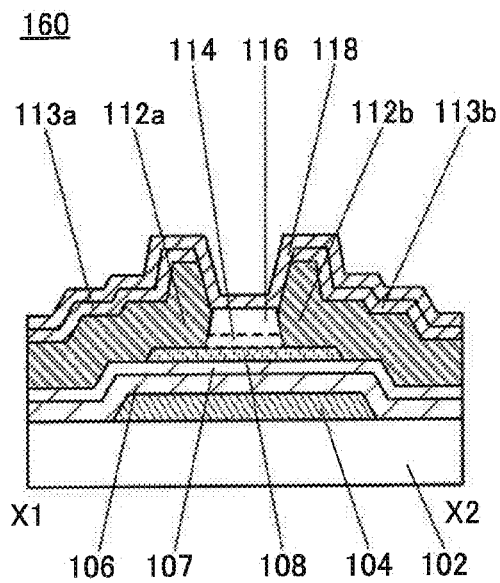
Figure 6C:
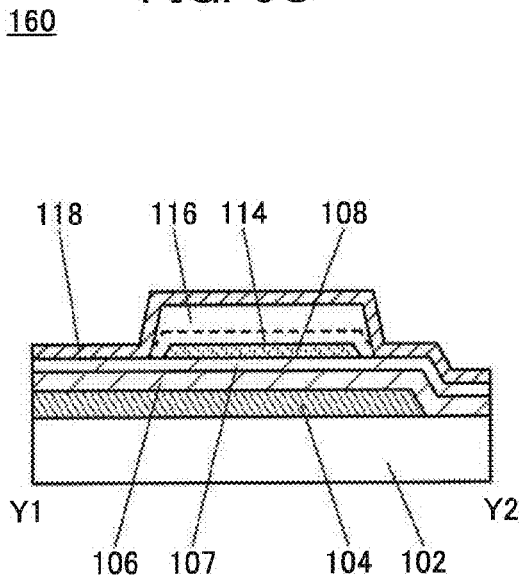

A structure example different from that of the transistor 160 in FIGS. 6A to 6C is described with reference to FIGS. 7A and 7B. Note that in the case where a portion has a function similar to that described above, the same hatch pattern is applied to the portion, and the portion is not especially denoted by a reference numeral in some cases.

<Structure Example 6 of Semiconductor Device>

FIG. 7A is a cross-sectional view in the channel length direction of a transistor 160A and FIG. 7B is a cross-sectional view in the channel width direction of the transistor 160A. Note that a top view of the transistor 160A is omitted here because it is similar to the top view of FIG. 6A.

The transistor 160A includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the insulating film 131 over the insulating film 116, the conductive films 112a and 112b functioning as source and drain electrodes electrically connected to the oxide semiconductor film 108, the insulating film 113a over the conductive film 112a, and the insulating film 113b over the conductive film 112b. Over the transistor 160A, specifically, over the insulating films 113a and 113b and the insulating film 116, the insulating film 131 is provided. Furthermore, the insulating film 118 is provided over the insulating film 131. The insulating films 113a and 113b function as protective insulating films for the conductive films 112a and 112b. The insulating films 114 and 116 function as protective insulating films for the oxide semiconductor film 108. The insulating films 118 and 131 function as protective insulating films for the transistor 160A.

The transistor 160A is different from the transistor 160 in FIGS. 6B and 6C in that the insulating film 131 is provided. Specifically, the insulating film 131 of the transistor 160A is provided between the insulating film 116 and the insulating film 118. The other components are the same as those of the transistor 160, and the effect similar to that in the case of the transistor 160 is obtained.

A structure example different from that of the transistor 100 in FIGS. 1A to 1C is described with reference to FIGS. 8A to 8C. Note that in the case where a portion has a function similar to that described above, the same hatch pattern is applied to the portion, and the portion is not especially denoted by a reference numeral in some cases.

<Structural Example 7 of Semiconductor Device>

Figure 8A:
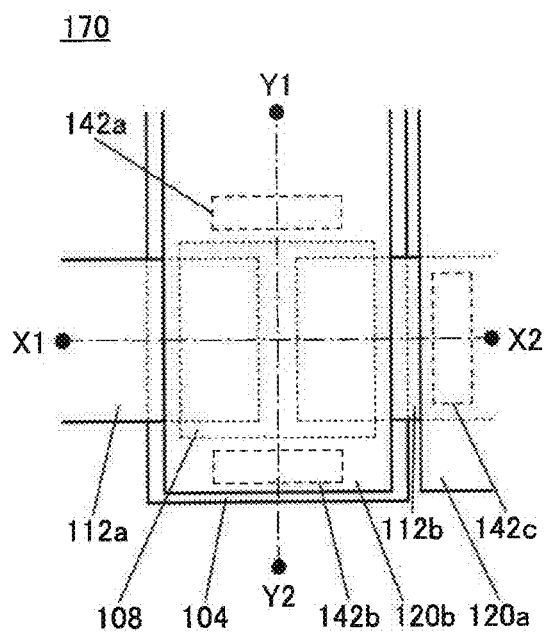
FIGS. 8A to 8C are a top view and cross-sectional views illustrating one embodiment of a semiconductor device.

FIG. 8A is a top view of a transistor 170 that is a semiconductor device of one embodiment of the present invention. FIG. 8B is a cross-sectional view taken along a dashed dotted line X1-X2 in FIG. 8A, and FIG. 8C is a cross-sectional view taken along a dashed dotted line Y1-Y2 in FIG. 8A.

The transistor 170 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive films 112a and 112b functioning as source and drain electrodes electrically connected to the oxide semiconductor film 108, the insulating film 113a over the conductive film 112a, and the insulating film 113b over the conductive film 112b. Over the transistor 170, specifically, over the insulating films 113a and 113b and the oxide semiconductor film 108, the insulating film 114, the insulating film 116 over the insulating film 114, the insulating film 118 over the insulating film 116, and conductive films 120a and 120b over the insulating film 118 are provided. The insulating films 113a and 113b function as protective insulating films for the conductive films 112a and 112b. The insulating films 114, 116, and 118 function as protective insulating films for the oxide semiconductor film 108. The conductive film 120a is electrically connected to the conductive film 112b through an opening 142c provided in the insulating films 113b, 114, 116, and 118. The conductive film 120b is formed to overlap the oxide semiconductor film 108.

The insulating films 114, 116, and 118 in the transistor 170 function as second gate insulating films of the transistor 170. The conductive film 120a in the transistor 170 functions as, for example, a pixel electrode used for a display device. The conductive film 120b in the transistor 170 functions as a second gate electrode (also referred to as a back gate electrode).

Figure 8B:
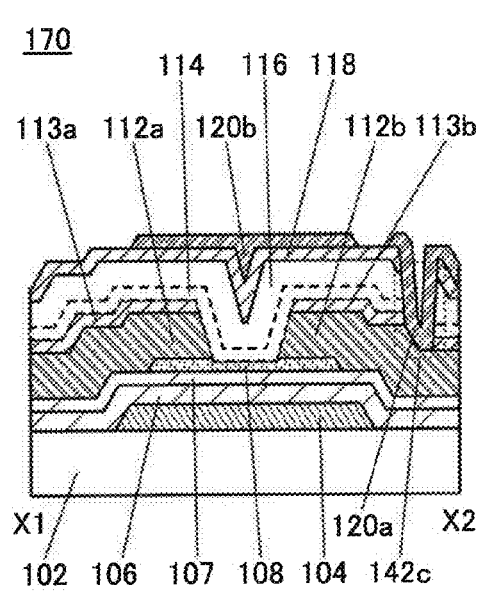
Figure 8C:
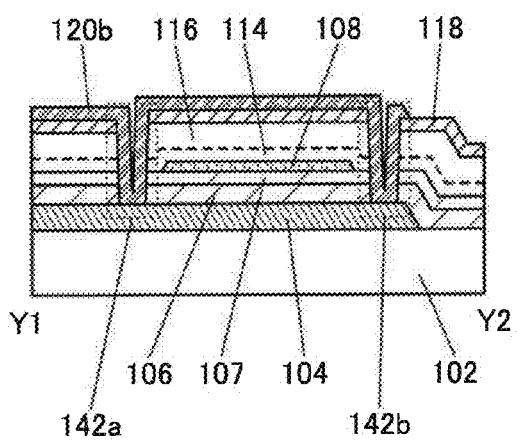

As illustrated in FIG. 8C, the conductive film 120b is connected to the conductive film 104 functioning as a gate electrode through openings 142a and 142b provided in the insulating films 106, 107, 114, 116, and 118. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

As illustrated in FIG. 8B, the oxide semiconductor film 108 is positioned to face each of the conductive film 104 functioning as a gate electrode and the conductive film 120b functioning as a second gate electrode, and is sandwiched between the two conductive films functioning as gate electrodes. The lengths in the channel length direction and the channel width direction of the conductive film 120b functioning as a second gate electrode are longer than those in the channel length direction and the channel width direction of the oxide semiconductor film 108. The whole oxide semiconductor film 108 is covered with the conductive film 120b with the insulating films 114, 116, and 118 positioned therebetween. Since the conductive film 120b functioning as a second gate electrode is connected to the conductive film 104 functioning as a gate electrode through the opening 142a and 142b provided in the insulating films 106, 107, 114, 116, and 118, a side surface of the oxide semiconductor film 108 in the channel width direction faces the conductive film 120b functioning as a second gate electrode with the insulating films 114, 116, and 118 positioned therebetween.

In other words, in the channel width direction of the transistor 170, the conductive film 104 functioning as a gate electrode and the conductive film 120b functioning as a second gate electrode are connected to each other through the openings provided in the insulating films 106 and 107 functioning as gate insulating films, and the insulating films 114, 116, and 118 functioning as second gate insulating films; and the conductive film 104 and the conductive film 120b surround the oxide semiconductor film 108 with the insulating films 106 and 107 functioning as gate insulating films, and the insulating films 114, 116, and 118 functioning as second gate insulating films positioned therebetween.

Such a structure makes it possible that the oxide semiconductor film 108 included in the transistor 170 is electrically surrounded by electric fields of the conductive film 104 functioning as a gate electrode and the conductive film 120b functioning as a second gate electrode. A device structure of a transistor, like that of the transistor 170, in which electric fields of a gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as a gate electrode; therefore, the current drive capability of the transistor 170 can be improved and high on-state current characteristics can be obtained. Since the on-state current can be increased, it is possible to reduce the size of the transistor 170. In addition, since the transistor 170 is surrounded by the conductive film 104 functioning as a gate electrode and the conductive film 120b functioning as a second gate electrode, the mechanical strength of the transistor 170 can be increased.

Structure examples different from that of the transistor 170 in FIGS. 8A to 8C are described with reference to FIGS. 9A to 9D. Note that in the case where a portion has a function similar to that described above, the same hatch pattern is applied to the portion, and the portion is not especially denoted by a reference numeral in some cases.
<Structure Example 8 of Semiconductor Device>

Figure 9A:
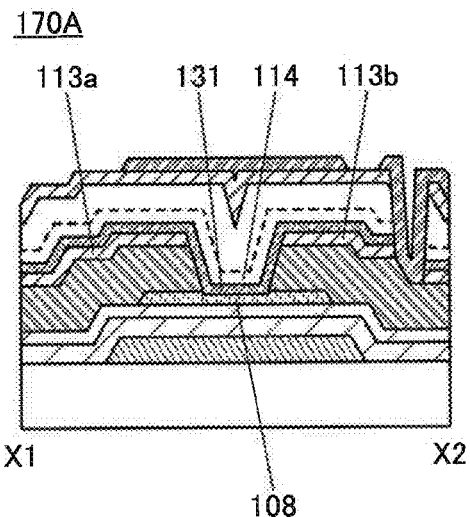
FIGS. 9A to 9D are cross-sectional views each illustrating one embodiment of a semiconductor device.
Figure 9B:
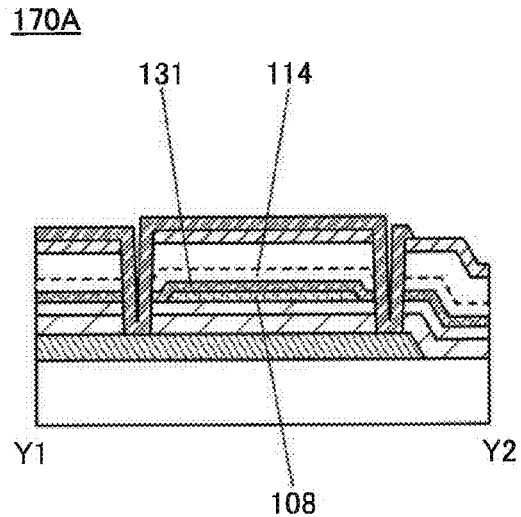
Figure 9C:
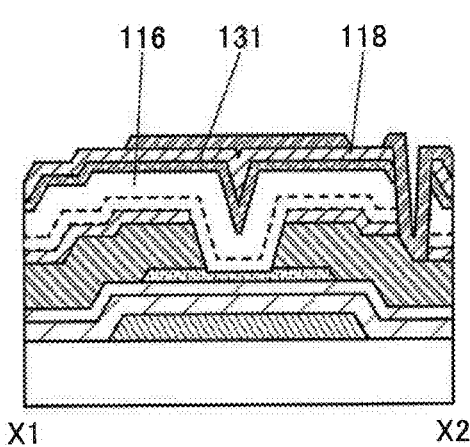
Figure 9D:
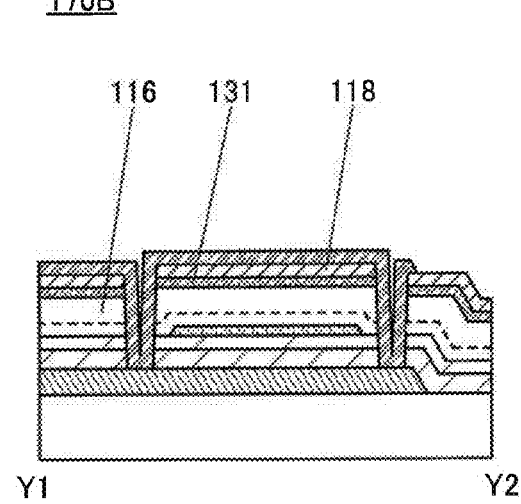

FIG. 9A is a cross-sectional view in the channel length direction of a transistor 170A and FIG. 9B is a cross-sectional view in the channel width direction of the transistor 170A. FIG. 9C is a cross-sectional view in the channel length direction of a transistor 170B and FIG. 9D is a cross-sectional view in the channel width direction of the transistor 170B. Note that top views of the transistor 170A and the transistor 170B are omitted here because they are similar to the top view of FIG. 8A.

The transistor 170A is different from the transistor 170 in FIGS. 8B and 8C in that the insulating film 131 is provided. Specifically, the insulating film 131 of the transistor 170A is provided between the insulating film 114 and each of the insulating films 113a and 113b and the oxide semiconductor film 108. The other structures are the same as those of the transistor 170 and the effect similar to that in the case of the transistor 170 can be obtained.

The transistor 170B is different from the transistor 170 in FIGS. 8B and 8C in that the insulating film 131 is provided. Specifically, the insulating film 131 of the transistor 170B is provided between the insulating film 116 and the insulating film 118. The other structures are the same as those of the transistor 170 and the effect similar to that in the case of the transistor 170 can be obtained.

Structure examples different from that of the transistor 100 in FIGS. 1A to 1C are described with reference to FIGS. 10A to 10D. Note that in the case where a portion has a function similar to that described above, the same hatch pattern is applied to the portion, and the portion is not especially denoted by a reference numeral in some cases.
<Structure Example 9 of Semiconductor Device>

Figure 10A:
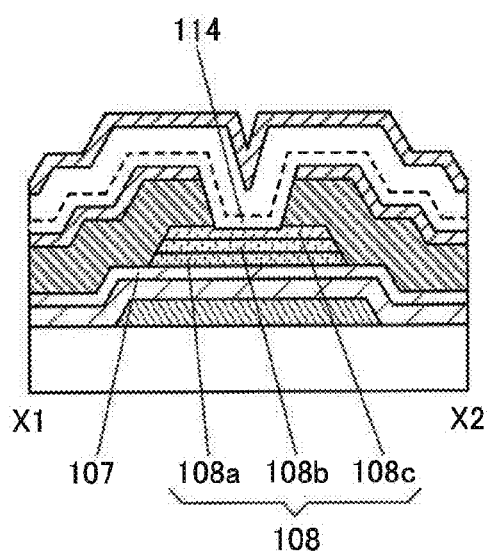
FIGS. 10A to 10D are cross-sectional views each illustrating one embodiment of a semiconductor device.
Figure 10B:
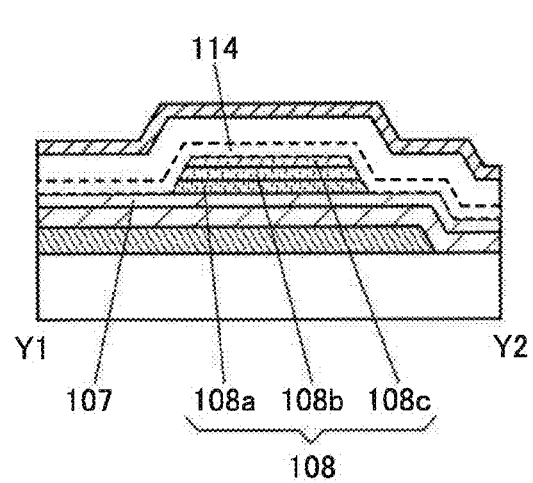
Figure 10C:
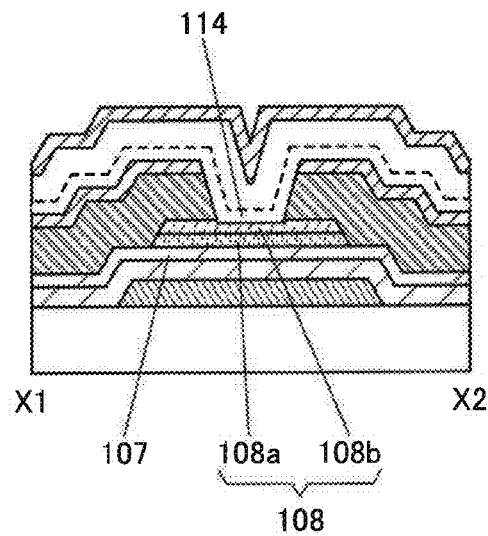
Figure 10D:
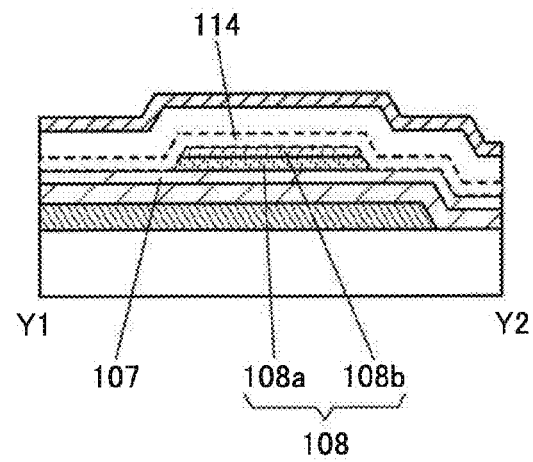

FIGS. 10A and 10B each illustrate a cross-sectional view of a modification example of the transistor 100 in FIGS. 1B and 1C. FIGS. 10C and 10D each illustrate a cross-sectional view of another modification example of the transistor 100 in FIGS. 1B and 1C.

A transistor 100C in FIGS. 10A and 10B has the same structure as the transistor 100 in FIGS. 1B and 1C except that the oxide semiconductor film 108 has a three-layer structure. Specifically, the oxide semiconductor film 108 of the transistor 100C includes an oxide semiconductor film 108a, an oxide semiconductor film 108b, and an oxide semiconductor film 108c.

A transistor 100D in FIGS. 10C and 10D has the same structure as the transistor 100 in FIGS. 1B and 1C except that the oxide semiconductor film 108 has a two-layer structure. Specifically, the oxide semiconductor film 108 of the transistor 100D includes the oxide semiconductor film 108a and the oxide semiconductor film 108b.

Here, a band diagram including the oxide semiconductor film 108 and insulating films in contact with the oxide semiconductor film 108 is described with reference to FIGS. 11A and 11B.

Figure 11A:
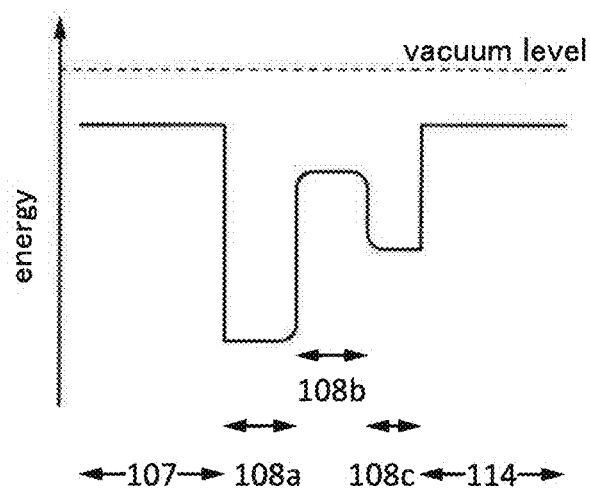
FIGS. 11A and 11B are band diagrams.

FIG. 11A shows an example of a band diagram in the thickness direction of a stack including the insulating film 107, the oxide semiconductor films 108a, 108b, and 108c, and the insulating film 114. FIG. 11B shows an example of a band diagram in the thickness direction of a stack including the insulating film 107, the oxide semiconductor films 108a and 108b, and the insulating film 114. For easy understanding, the conduction band minimum (Ec) of each of the insulating film 107, the oxide semiconductor films 108a, 108b, and 108c, and the insulating film 114 is shown in the band diagrams.

In FIG. 11A, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108a, an oxide semiconductor film formed using a metal oxide target having an atomic ratio of metal elements of In:Ga:Zn=1:4:5 is used as the oxide semiconductor film 108b, and an oxide semiconductor film formed using a metal oxide target having an atomic ratio of metal elements of In:Ga:Zn=1:3:6 is used as the oxide semiconductor film 108c.

Figure 11B:
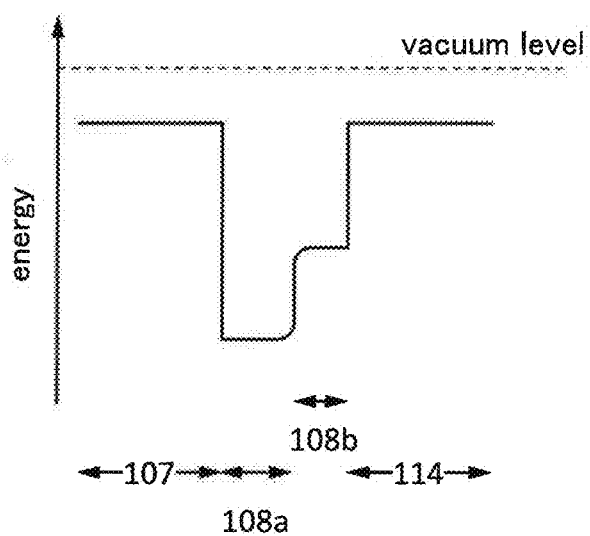

In the band diagram of FIG. 11B, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108a, and a metal oxide film formed using a metal oxide target having an atomic ratio of metal elements of In:Ga:Zn=1:3:6 is used as the oxide semiconductor film 108b.

As illustrated in FIGS. 11A and 11B, the conduction band minimum smoothly varies between the oxide semiconductor film 108a and the oxide semiconductor film 108b. In other words, the conduction band minimum is continuously varied or continuously connected. To obtain such a band diagram, it is preferable that there exist no impurity, which forms a defect state such as a trap center or a recombination center for the oxide semiconductor film, at the interface between the oxide semiconductor film 108a and the oxide semiconductor film 108b.

To form a continuous junction between the oxide semiconductor film 108a and the oxide semiconductor film 108b, it is necessary to form the films successively without exposure to the air by using a multi-chamber deposition apparatus (sputtering apparatus) provided with a load lock chamber.

With the band diagram of FIG. 11A or FIG. 11B, the oxide semiconductor film 108a serves as a well, and a channel region is formed in the oxide semiconductor film 108a in the transistor with the stacked-layer structure.

By providing the oxide semiconductor film 108b and/or the oxide semiconductor film 108c, the oxide semiconductor film 108a can be distanced away from trap states.

In addition, the trap states might be more distant from the vacuum level than the conduction band minimum (Ec) of the oxide semiconductor film 108a functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the conduction band minimum (Ec) of the oxide semiconductor film 108a. Such a structure inhibits accumulation of electrons in the trap states. As a result, the on-state current and the field-effect mobility of the transistor can be increased.

In FIGS. 11A and 11B, the conduction band minimum of each of the oxide semiconductor films 108b and 108c is closer to the vacuum level than that of the oxide semiconductor film 108a. Typically, an energy difference between the conduction band minimum of the oxide semiconductor film 108a and the conduction band minimum of each of the oxide semiconductor films 108b and 108c is greater than or equal to 0.15 eV or greater than or equal to 0.5 eV, and less than or equal to 2 eV or less than or equal to 1 eV. That is, the difference between the electron affinity of each of the oxide semiconductor films 108b and 108c and the electron affinity of the oxide semiconductor film 108a is greater than or equal to 0.15 eV or greater than or equal to 0.5 eV, and less than or equal to 2 eV or less than or equal to 1 eV.

In such a structure, the oxide semiconductor film 108a serves as a main path of current and functions as a channel region. In addition, since the oxide semiconductor films 108b and 108c each include one or more metal elements included in the oxide semiconductor film 108a in which a channel region is formed, interface scattering is less likely to occur at the interface between the oxide semiconductor film 108a and the oxide semiconductor film 108b. Thus, the transistor can have high field-effect mobility because the movement of carriers is not hindered at the interface.

To prevent each of the oxide semiconductor films 108b and 108c from functioning as part of a channel region, a material having sufficiently low conductivity is used for the oxide semiconductor films 108b and 108c. Alternatively, a material which has a smaller electron affinity (a difference in energy level between the vacuum level and the conduction band minimum) than the oxide semiconductor film 108a and has a difference in the conduction band minimum from the oxide semiconductor film 108a (band offset) is used for the oxide semiconductor films 108b and 108c. Furthermore, to inhibit generation of a difference between threshold voltages due to the value of the drain voltage, it is preferable to form the oxide semiconductor films 108b and 108c using a material whose conduction band minimum is closer to the vacuum level than that of the oxide semiconductor film 108a is by more than 0.2 eV, preferably 0.5 eV or more.

It is preferable that the oxide semiconductor films 108b and 108c not have a spinel crystal structure. This is because if the oxide semiconductor films 108b and 108c have a spinel crystal structure, a constituent element of the conductive films 112a and 112b might be diffused into the oxide semiconductor film 108a at the interface between the spinel crystal structure and another region. Note that each of the oxide semiconductor film 108b and 108c is preferably a CAAC-OS, which is described later, in which case a higher blocking property against constituent elements of the conductive films 112a and 112b, e.g., copper elements, is obtained.

The thickness of each of the oxide semiconductor films 108b and 108c is greater than or equal to a thickness that is capable of inhibiting diffusion of the constituent element of the conductive films 112a and 112b into the oxide semiconductor film 108a, and less than a thickness that inhibits supply of oxygen from the insulating film 114 to the oxide semiconductor film 108a. For example, when the thickness of each of the oxide semiconductor films 108b and 108c is greater than or equal to 10 nm, the constituent elements of the conductive films 112a and 112b can be prevented from diffusing into the oxide semiconductor film 108a. When the thickness of each of the oxide semiconductor films 108b and 108c is less than or equal to 100 nm, oxygen can be effectively supplied from the insulating films 114 and 116 to the oxide semiconductor film 108a.

When the oxide semiconductor films 108b and 108c are each an In-M-Zn oxide in which the atomic ratio of the element M (M is Ti, Ga, Y, Zr, La, Ce, Nd, Sn, or Hf) is higher than that of In, the energy gap of each of the oxide semiconductor films 108b and 108c can be large and the electron affinity thereof can be small. Therefore, a difference in electron affinity between the oxide semiconductor film 108a and each of the oxide semiconductor films 108b and 108c may be controlled by the proportion of the element M. Furthermore, oxygen vacancy is less likely to be generated in the oxide semiconductor film in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

When an In-M-Zn oxide is used for the oxide semiconductor films 108b and 108c, the proportions of In and M, not taking Zn and O into consideration, is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. Alternatively, a gallium oxide film may be used as each of the oxide semiconductor films 108b and 108c.

Furthermore, in the case where each of the oxide semiconductor films 108a, 108b, and 108c is an In-M-Zn oxide, the proportion of M atoms in each of the oxide semiconductor films 108b and 108c is higher than that in the oxide semiconductor film 108a. Typically, the proportion of M in each of the oxide semiconductor films 108b and 108c is 1.5 or more times, preferably twice or more, more preferably three or more times that in the oxide semiconductor film 108a.

Furthermore, in the case where the oxide semiconductor films 108a, 108b, and 108c are each an In-M-Zn oxide, when the oxide semiconductor film 108a has an atomic ratio of In:M:Zn=$x_1$:$y_1$:$z_1$ and the oxide semiconductor films 108b and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, still further preferably $y_2/x_2$ is three or more times or four or more times as large as $y_1/x_1$. At this time, $y_1$ is preferably greater than or equal to $x_1$ in the oxide semiconductor film 108a, because stable electrical characteristics of a transistor can be achieved. However, when $y_1$ is three or more times as large as $x_1$, the field-effect mobility of the transistor including the oxide semiconductor film 108a is reduced. Accordingly, $y_1$ is preferably smaller than three times $x_1$.

In the case where the oxide semiconductor film 108a is an In-M-Zn oxide and a target having the atomic ratio of metal elements of In:M:Zn=$x_1$:$y_1$:$z_1$ is used for depositing the oxide semiconductor film 108a, $x_1/y_1$ is preferably greater than or equal to 1/3 and less than or equal to 6, further preferably greater than or equal to 1 and less than or equal to 6, and $z_1/y_1$ is preferably greater than or equal to 1/3 and less than or equal to 6, further preferably greater than or equal to 1 and less than or equal to 6. Note that when $z_1/y_1$ is greater than or equal to 1 and less than or equal to 6, a CAAC-OS to be described later is easily formed as the oxide semiconductor film 108a. Typical examples of the atomic ratio of the metal elements of the target are In:M:Zn=1:1:1 and In:M:Zn=3:1:2.

In the case where the oxide semiconductor films 108b and 108c are each an In-M-Zn oxide and a target having an atomic ratio of metal elements of In:M:Zn=$x_2$:$y_2$:$z_2$ is used for depositing the oxide semiconductor films 108b and 108c, $x_2/y_2$ is preferably less than $x_1/y_1$, and $z_2/y_2$ is preferably greater than or equal to 1/3 and less than or equal to 6, further preferably greater than or equal to 1 and less than or equal to 6. When the atomic ratio of M with respect to indium is high, the energy gap of the oxide semiconductor films 108b and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108b and 108c are each an In-M oxide, when a divalent metal element (e.g., zinc) is not included as M, the oxide semiconductor films 108b and 108c which do not include a spinel crystal structure can be formed. As the oxide semiconductor films 108b and 108c, for example, an In—Ga oxide film can be used. The In—Ga oxide film can be formed by a sputtering method using an In—Ga metal oxide target (In:Ga=7:93), for example. To deposit the oxide semiconductor films 108b and 108c by a sputtering method using DC discharge, on the assumption that an atomic ratio of In:M is x:y, it is preferable that y/(x+y) be less than or equal to 0.96, further preferably less than or equal to 0.95, for example, 0.93.

In each of the oxide semiconductor films 108a, 108b, and 108c, the proportions of the atoms in the above atomic ratio vary within a range of ±40% as an error.

A structure example different from that of the transistor 100 in FIGS. 1A to 1C is described with reference to FIG. 37. Note that in the case where a portion has a function similar to that described above, the same hatch pattern is applied to the portion, and the portion is not especially denoted by a reference numeral in some cases.

<Structure Example 10 of Semiconductor Device>

Figure 37:
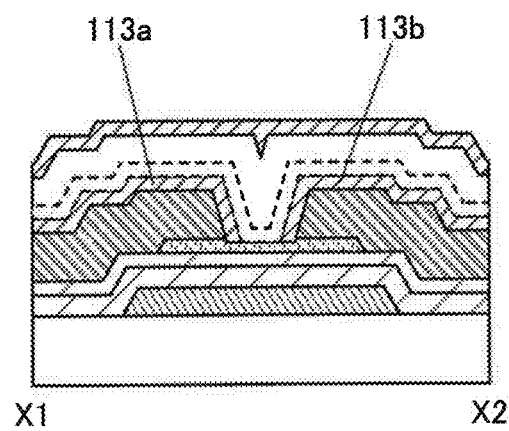
FIG. 37 is a cross-sectional views illustrating one embodiment of a semiconductor device.

FIG. 37 is a cross-sectional view of a modification example of the transistor 100 in FIG. 1B.

A transistor 100E in FIG. 37 is different from the transistor 100 in the shape of the insulating films 113a and 113b in FIG. 1B. Specifically, the insulating films 113a and 113b of the transistor 100E cover the top and side surfaces of the conductive films 112a and 112b.

Since the insulating films 113a and 113b in the transistor 100 are formed by the same process as the conductive films 112a and 112b, they are formed without an increase in the number of masks. The insulating films 113a and 113b in the transistor 100E are formed by a process different from that of the conductive films 112a and 112b; therefore, the number of masks is increased. However, the top and side surfaces of the conductive films 112a and 112b can be covered with the insulating films 113a and 113b, and thus, oxygen adsorbed to the conductive films 112a and 112b can be further reduced.

The structures of the transistors of this embodiment can be freely combined with each other.

<Method 1 for Manufacturing Semiconductor Device>

Next, a method for manufacturing the transistor 100 that is a semiconductor device of one embodiment of the present invention is described below in detail with reference to FIGS. 12A to 12D, FIGS. 13A to 13D, and FIGS. 14A to 14C.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a PECVD method are typical examples of the film formation method, a thermal CVD method may be used. As the thermal CVD method, an MOCVD method or an ALD method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching valves (also referred to as high-speed valves). In such a case, a first source gas is introduced, an inert gas (e.g., argon or nitrogen) or the like is introduced at the same time as or after introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

First, a conductive film is formed over the substrate 102 and processed through a lithography process and an etching process, whereby the conductive film 104 functioning as a gate electrode is formed. Then, the insulating films 106 and 107 functioning as gate insulating films are formed over the conductive film 104 (see FIG. 12A).

The conductive film 104 functioning as a gate electrode can be formed by a sputtering method, a CVD method, a vacuum evaporation method, or a PLD method. Alternatively, a coating method or a printing method can be used. Although typical deposition methods are a sputtering method and PECVD method, a thermal CVD method, such as an MOCVD method, or an ALD method described above may be used.

In this embodiment, a glass substrate is used as the substrate 102, and as the conductive film 104 functioning as a gate electrode, a 100-nm-thick tungsten film is formed by a sputtering method.

The insulating films 106 and 107 functioning as gate insulating films can be formed by a sputtering method, a PECVD method, a thermal CVD method, a vacuum evaporation method, a PLD method, or the like. In this embodiment, a 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer stacked-layer structure of a first silicon nitride film, a second silicon nitride film, and a third silicon nitride film. An example of the three-layer stacked-layer structure is as follows.

For example, the first silicon nitride film can be formed to have a thickness of 50 nm under the condition where silane at a flow rate of 200 sccm, nitrogen at a flow rate of 2000 sccm, and an ammonia gas at a flow rate of 100 sccm are supplied as a source gas to a reaction chamber of a PECVD apparatus; the pressure in the reaction chamber is controlled to 100 Pa, and a power of 2000 W is supplied using a 27.12 MHz high-frequency power source.

The second silicon nitride film can be formed to have a thickness of 300 nm under the condition where silane at a flow rate of 200 sccm, nitrogen at a flow rate of 2000 sccm, and an ammonia gas at a flow rate of 2000 sccm are supplied as a source gas to the reaction chamber of the PECVD apparatus; the pressure in the reaction chamber is controlled to 100 Pa, and a power of 2000 W is supplied using a 27.12 MHz high-frequency power source.

The third silicon nitride film can be formed to have a thickness of 50 nm under the condition where silane at a flow rate of 200 sccm and nitrogen at a flow rate of 5000 sccm are supplied as a source gas to the reaction chamber of the PECVD apparatus; the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C.

When the insulating film 106 has the three-layer stacked-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 formed later.

Figure 12A:
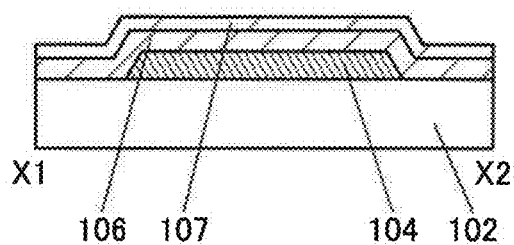
FIGS. 12A to 12D are cross-sectional views illustrating an example of a manufacturing process of a semiconductor device.
Figure 12B:
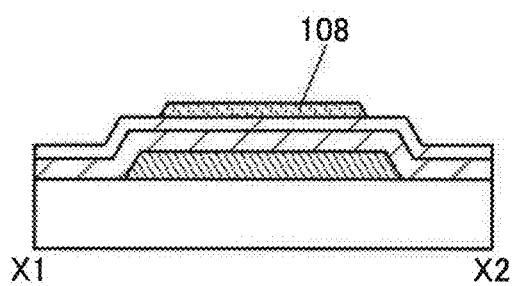
Figure 12C:
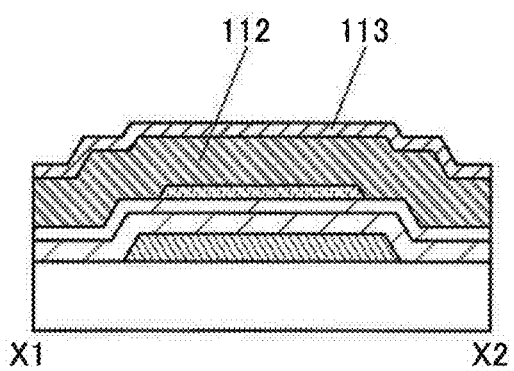

Next, the oxide semiconductor film 108 is formed over the insulating film 107 (see FIG. 12B).

In this embodiment, an oxide semiconductor film is formed by a sputtering method using an In—Ga—Zn metal oxide target (having an atomic ratio of In:Ga:Zn=1:1:1.2), a mask is formed over the oxide semiconductor film through a lithography process, and the oxide semiconductor film is processed into a desired region, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor film and can reduce hydrogen, water, and the like included in the oxide semiconductor film 108. Note that the heat treatment for the purpose of reducing hydrogen, water, and the like may be performed before the oxide semiconductor film 108 is processed into an island shape.

An electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

In the case where the oxide semiconductor film 108 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas including carbon or hydrogen from an exhaust system to the inside of the chamber.

Next, a conductive film 112 is formed over the insulating film 107 and the oxide semiconductor film 108. Then, an insulating film 113 is formed over the conductive film 112 (see FIG. 12C).

The conductive film 112 can be formed using any of the materials that can be used for the conductive films 112a and 112b described above. Furthermore, the insulating film 113 can be formed using any of the materials that can be used for the insulating films 113a and 113b described above. In this embodiment, as the conductive film 112, a three-layer stacked structure of a 50-nm-thick tungsten film, a 400-nm-thick aluminum film, and a 100-nm-thick titanium film is formed with a sputtering apparatus. Furthermore, as the insulating film 113, a 100-nm-thick silicon nitride film is formed with a PECVD apparatus.

Figure 12D:
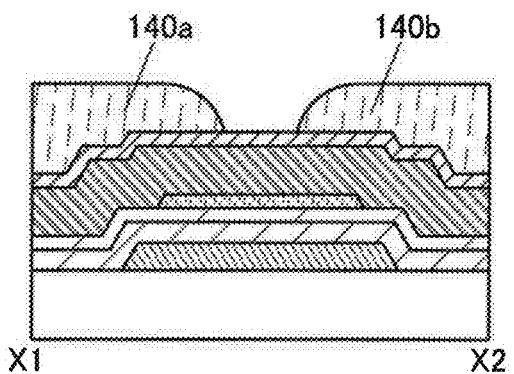

Next, masks 140a and 140b are formed over the insulating film 113 (see FIG. 12D).

The masks 140a and 140b are formed in such a manner that a photosensitive resin is applied with a spin coater apparatus and light exposure and development are performed on desired regions through a lithography process. Note that the photosensitive resin may be a negative-type or positive-type photosensitive resin. Alternatively, the masks 140a and 140b may be formed by an inkjet method. When the masks 140a and 140b are formed by an inkjet method, manufacturing cost can be reduced because a photomask is not used.

Figure 13A:
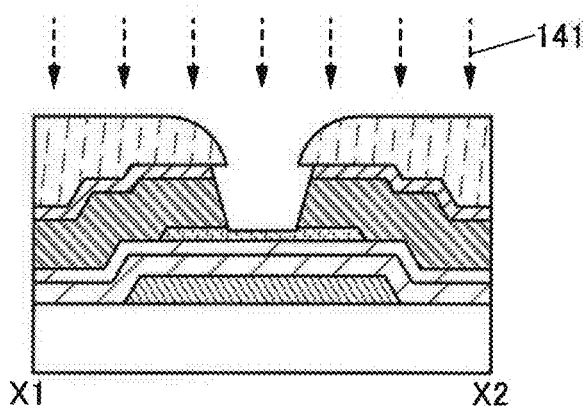
FIGS. 13A to 13D are cross-sectional views illustrating an example of a manufacturing process of a semiconductor device.

Next, the conductive film 112 and the insulating film 113 are etched from above the masks 140a and 140b, using an etching gas 141 (see FIG. 13A).

Note that in this embodiment, the etching gas 141 is generated and the conductive film 112 and the insulating film 113 are etched by dry etching. Note that the method for etching the conductive film 112 and the insulating film 113 is not limited thereto. For example, the conductive film 112 and the insulating film 113 may be etched by wet etching using a chemical solution instead of the etching gas 141. Alternatively, the conductive film 112 and the insulating film 113 may be etched by a combination of dry etching and wet etching.

Figure 13B:
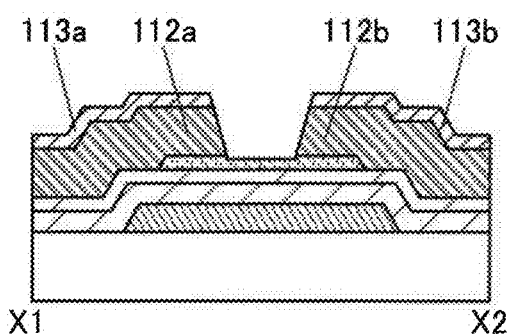

Next, the masks 140a and 140b are removed, whereby the conductive films 112a and 112b functioning as a source electrode and a drain electrode, the insulating film 113a over the conductive film 112a, and the insulating film 113b over the conductive film 112b are formed (see FIG. 13B).

After the conductive films 112a and 112b and the insulating films 113a and 113b are formed, a surface of the oxide semiconductor film 108 (on a back channel side) may be cleaned. The cleaning may be performed, for example, using a chemical solution such as phosphoric acid. The cleaning using a chemical solution such as a phosphoric acid can remove impurities (e.g., an element included in the conductive films 112a and 112b and the like) attached to the surface of the oxide semiconductor film 108.

Note that a recessed portion might be formed in part of the oxide semiconductor film 108 at the step of forming the conductive films 112a and 112b and the insulating films 113a and 113b and/or the cleaning step.

Through the above steps, the transistor 100 is formed.

Figure 13C:
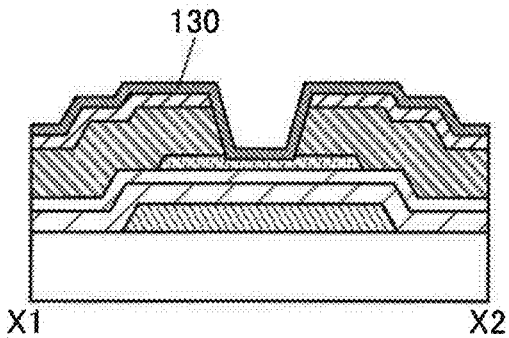

Next, over the transistor 100, specifically, over the oxide semiconductor film 108 and the insulating films 113a and 113b of the transistor 100, a film 130 that inhibits release of oxygen is formed (see FIG. 13C).

The film 130 that inhibits release of oxygen includes at least one of indium, zinc, titanium, aluminum, tungsten, tantalum, and molybdenum. For example, a conductive material such as an alloy including any of the metal elements, an alloy including any of the metal elements in combination, a metal oxide including any of the metal elements, a metal nitride including any of the metal elements, or a metal nitride oxide including any of the metal elements is used.

The film 130 that inhibits release of oxygen can be formed using, for example, a tantalum nitride film, a titanium film, an indium tin oxide (ITO) film, an aluminum film, or an oxide semiconductor film (e.g., an IGZO film having an atomic ratio of In:Ga:Zn=1:4:5).

The thickness of the film 130 that inhibits release of oxygen can be greater than or equal to 1 nm and less than or equal to 20 nm, or greater than or equal to 2 nm and less than or equal to 10 nm. In this embodiment, a 5-nm-thick tantalum nitride film is used as the film 130.

Figure 13D:
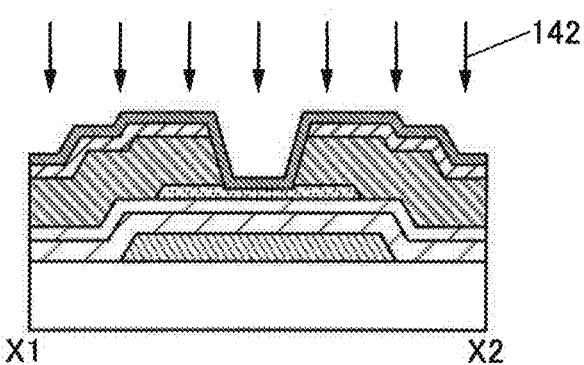

Next, oxygen 142 is added to the oxide semiconductor film 108 through the film 130 (see FIG. 13D).

As a method for adding the oxygen 142 to the oxide semiconductor film 108 through the film 130, an ion doping method, an ion implantation method, plasma treatment, or the like is given. The plasma treatment may be performed, for example, in such a manner that the substrate is set on the parallel-plate cathode side in a dry etching apparatus or an ashing apparatus, and an RF power is supplied so that a bias is applied to the substrate side. The bias application to the substrate side is preferable because the oxygen 142 can be efficiently introduced into the oxide semiconductor film 108. Since the film 130 is provided over the oxide semiconductor film 108, damage to the oxide semiconductor film 108 can be relieved when the oxygen 142 is added. Furthermore, the film 130 functions as a protective film for preventing oxygen from being released from the oxide semiconductor film 108. Thus, a larger amount of oxygen can be added to the oxide semiconductor film 108. In addition, oxygen can be added to the vicinity of the interface between the oxide semiconductor film 108 and the film 130.

In the case where oxygen is introduced by plasma treatment, by making oxygen excited by a microwave to generate high density oxygen plasma, the amount of oxygen introduced into the oxide semiconductor film 108 can be increased.

Figure 14A:
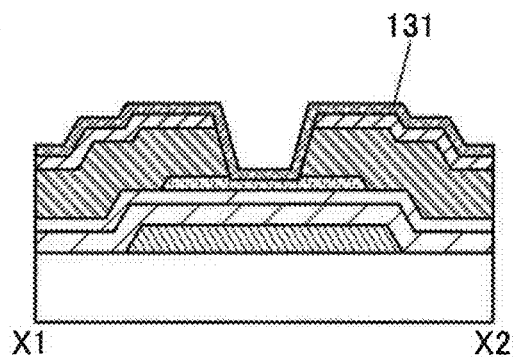
FIGS. 14A to 14C are cross-sectional views illustrating an example of a manufacturing process of a semiconductor device.

Note that by the addition of the oxygen 142, the film 130 becomes the insulating film 131 formed of oxide or nitride of metal (indium, zinc, titanium, aluminum, tungsten, tantalum, or molybdenum) (see FIG. 14A).

Note that, in some cases, the insulating film 131 is not an insulator but a conductor or a semiconductor in the case where treatment for adding the oxygen 142 is insufficiently performed or depending on a metal material used for the film 130. Note that since the insulating film 131 is positioned on the back channel side of the transistor 100, the insulating film 131 is preferably an insulator rather than a conductor or a semiconductor in order that an electron serving as a carrier is not trapped in the insulating film 131.

Figure 14B:
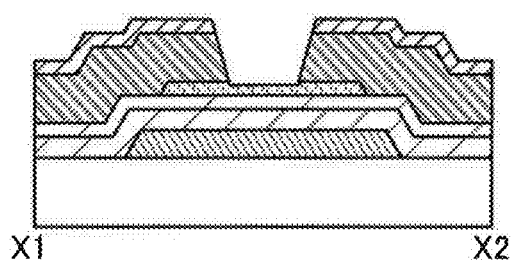

After that, the insulating film 131 is removed (see FIG. 14B).

Figure 14C:
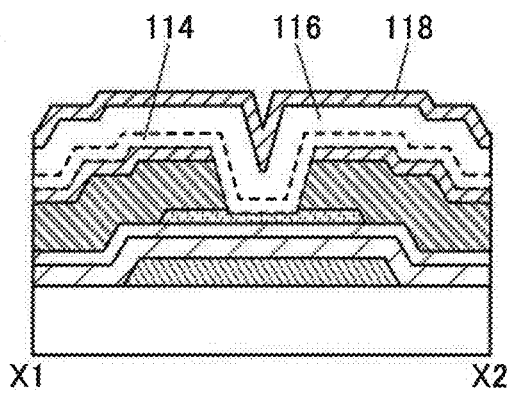

Next, over the oxide semiconductor film 108 and the insulating films 113a and 113b, the insulating films 114, 116, and 118 functioning as protective insulating films of the transistor 100 are formed (see FIG. 14C).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancy in the oxide semiconductor film 108 can be reduced.

For example, as the insulating film 114, a silicon oxynitride film can be formed by a PECVD method. In this case, a deposition gas including silicon and an oxidizing gas are preferably used as a source gas. Typical examples of the deposition gas including silicon include silane, disilane, trisilane, and silane fluoride. Examples of the oxidizing gas include dinitrogen monoxide and nitrogen dioxide. An insulating film including nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to parallel-plate electrodes.

As the insulating film 116, a silicon oxide film or a silicon oxynitride film is formed under the conditions where the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which includes oxygen in excess of that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas including silicon with respect to the oxidizing gas is increased, the number of defects in the insulating film 116 can be reduced. Typically, it is possible to form an oxide insulating layer in which the number of defects is small, i.e., the spin density of a signal which appears at g=2.001 originating from a dangling bond of silicon is lower than $6\times10^{17}$ spins/cm$^3$, preferably lower than or equal to $3\times10^{17}$ spins/cm$^3$, further preferably lower than or equal to $1.5\times10^{17}$ spins/cm$^3$ by ESR measurement. As a result, the reliability of the transistor can be improved.

Heat treatment may be performed after the insulating films 114 and 116 are formed. The heat treatment can reduce nitrogen oxide included in the insulating films 114 and 116. Alternatively, part of oxygen included in the insulating films 114 and 116 can be moved to the oxide semiconductor film 108, so that the amount of oxygen vacancy included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). Note that an electric furnace, an RTA apparatus, or the like can be used for the heat treatment, in which it is preferable that hydrogen, water, and the like not be included in the nitrogen, oxygen, ultra-dry air, or rare gas.

In this embodiment, the heat treatment is performed at 350° C. for 1 hour in an atmosphere of nitrogen and oxygen.

In the case where the insulating film 118 is formed by a PECVD method, the substrate temperature is preferably set to higher than or equal to 300° C. and lower than or equal to 400° C., more preferably higher than or equal to 320° C. and lower than or equal to 370° C., so that a dense film can be formed.

For example, in the case where a silicon nitride film is formed by a PECVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species cleave a bond between silicon and hydrogen which are included in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Heat treatment may be performed after the formation of the insulating film 118. The heat treatment is performed typically at a temperature of higher than or equal to 150° C. and lower than or equal to 400° C., preferably higher than or equal to 300° C. and lower than or equal to 400° C., further preferably higher than or equal to 320° C. and lower than or equal to 370° C. When the heat treatment is performed, the amount of hydrogen and water in the insulating films 114 and 116 is reduced and accordingly the generation of defects in the oxide semiconductor film 108 described above is inhibited.

Through the above process, the semiconductor device illustrated in FIGS. 1A to 1C can be manufactured.

Note that in the process for manufacturing the transistor 100A in FIGS. 3A and 3B, the insulating film 114 can be formed without removal of the insulating film 131.

<Method 2 for Manufacturing Semiconductor Device>

Next, a method for manufacturing the transistor 100 which is different from that described in <Method 1 for manufacturing semiconductor device> is described below in detail with reference to FIGS. 15A to 15D.

First, the steps up to the step in FIG. 13B are performed, and then the insulating films 114 and 116 are formed over the oxide semiconductor film 108 and the insulating films 113a and 113b. After that, the film 130 that inhibits permeation of oxygen is formed over the insulating film 116 (see FIG. 15A).

Figure 15A:
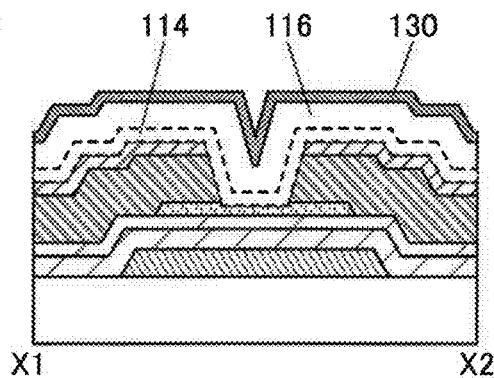
FIGS. 15A to 15D are cross-sectional views illustrating an example of a manufacturing process of a semiconductor device.
Figure 15B:
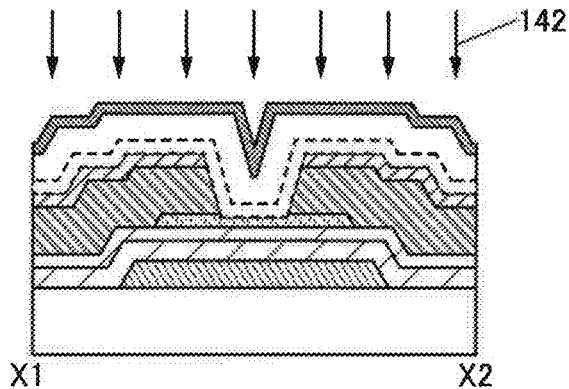

Next, the oxygen 142 is added to the insulating films 114 and 116 and the oxide semiconductor film 108 through the film 130 (see FIG. 15B).

Figure 15C:
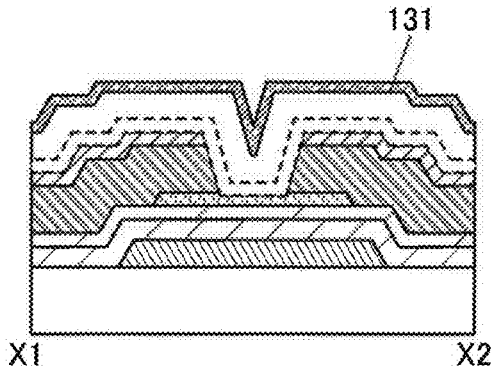

Note that by the addition of the oxygen 142, the film 130 becomes the insulating film 131 formed of oxide or nitride of metal (indium, zinc, titanium, aluminum, tungsten, tantalum, or molybdenum) (see FIG. 15C).

Figure 15D:
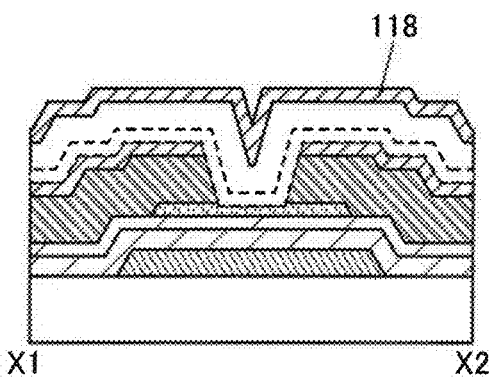

After that, the insulating film 131 is removed, and the insulating film 118 is formed over the insulating film 116 (see FIG. 15D).

Through the above process, the semiconductor device illustrated in FIGS. 1A to 1C can be manufactured.

Note that in a process for manufacturing the transistor 100B in FIGS. 3C and 3D, the insulating film 118 can be formed without removal of the insulating film 131.

<Method 3 for Manufacturing Semiconductor Device>

Next, a method for manufacturing the transistor 150 in FIGS. 4A to 4C that is a semiconductor device of one embodiment of the present invention is described below in detail with reference to FIGS. 16A to 16D, FIGS. 17A to 17C, and FIGS. 18A to 18C.

Figure 16A:
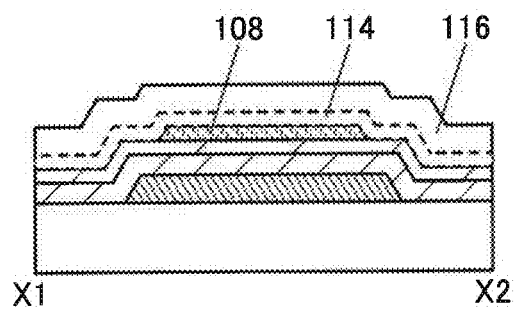
FIGS. 16A to 16D are cross-sectional views illustrating an example of a manufacturing process of a semiconductor device.
Figure 16B:
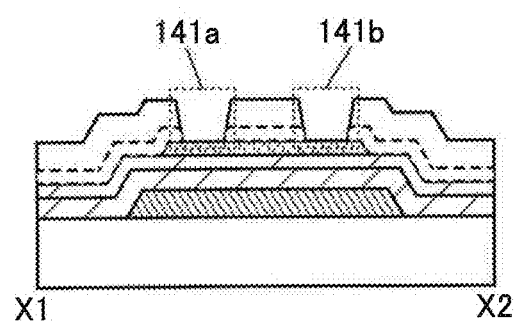
Figure 16C:
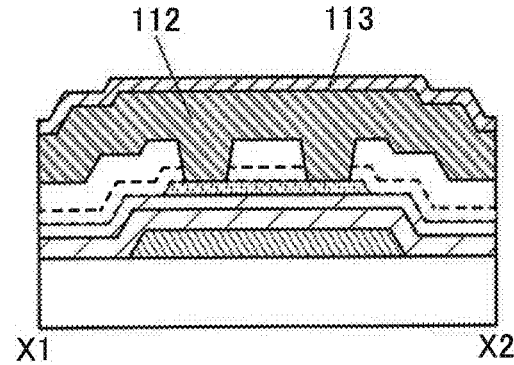

First, the steps up to the step in FIG. 12B are performed, and then the insulating films 114 and 116 are formed over the oxide semiconductor film 108 (see FIG. 16A).

Next, a mask is formed over the insulating film 116 through a lithography process, and the openings 141a and 141b are formed in desired regions of the insulating films 114 and 116. The openings 141a and 141b reach the oxide semiconductor film 108 (see FIG. 16B).

Then, the conductive film 112 is formed over the oxide semiconductor film 108 and the insulating film 116 to cover the openings 141a and 141b. After that, the insulating film 113 is formed over the conductive film 112 (see FIG. 16C).

Figure 16D:
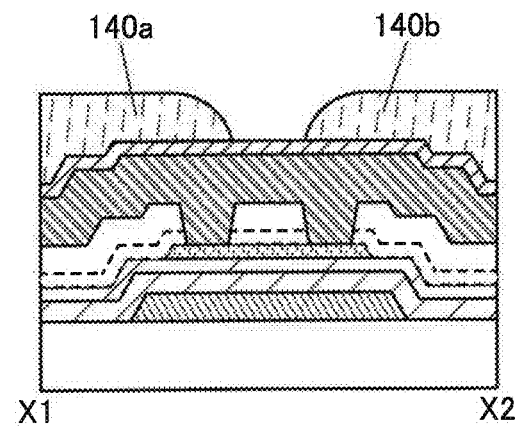

Then, the masks 140a and 140b are formed over the insulating film 113 (see FIG. 16D).

Figure 17A:
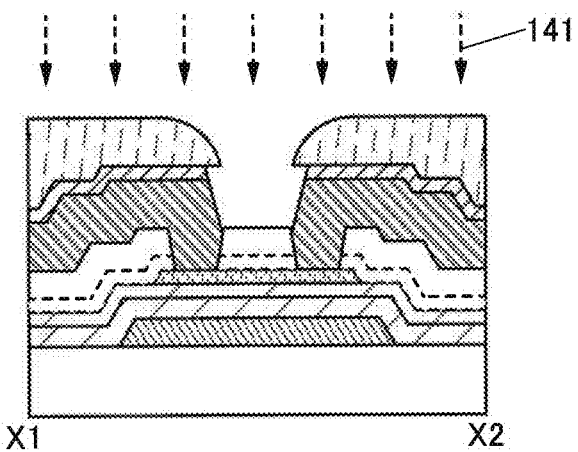
FIGS. 17A to 17C are cross-sectional views illustrating an example of a manufacturing process of a semiconductor device.

Next, the conductive film 112 and the insulating film 113 are etched from above the masks 140a and 140b, using the etching gas 141 (see FIG. 17A).

Figure 17B:
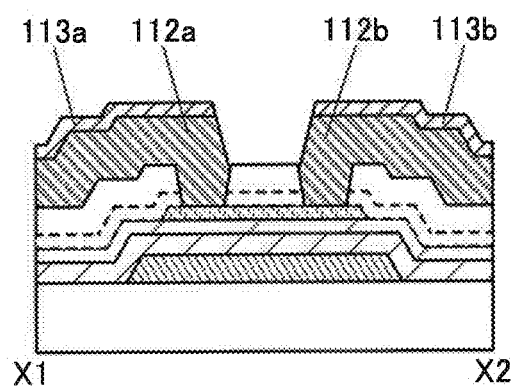

Next, the masks 140a and 140b are removed, whereby the conductive films 112a and 112b functioning as a source electrode and a drain electrode, the insulating film 113a over the conductive film 112a, and the insulating film 113b over the conductive film 112b are formed (see FIG. 17B).

Figure 17C:
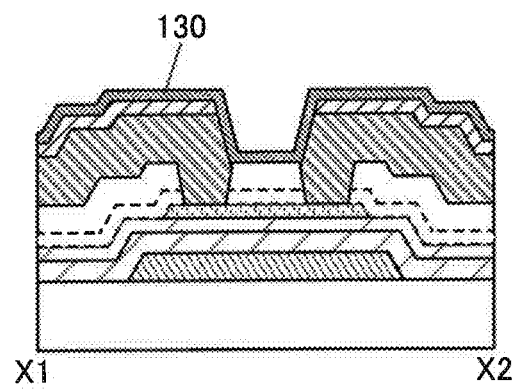

Next, over the insulating films 113a, 113b, and 116, the film 130 that inhibits release of oxygen is formed (see FIG. 17C).

Figure 18A:
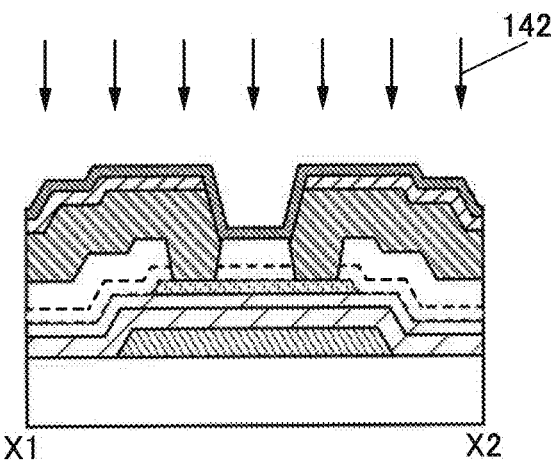
FIGS. 18A to 18C are cross-sectional views illustrating an example of a manufacturing process of a semiconductor device.

Next, the oxygen 142 is added to the insulating films 114 and 116 and the oxide semiconductor film 108 through the film 130 (see FIG. 18A).

Figure 18B:
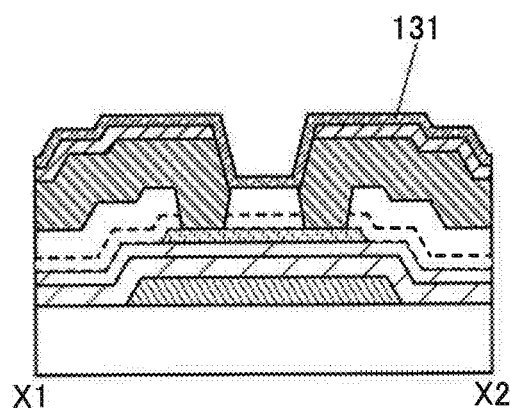

Note that by the addition of the oxygen 142, the film 130 becomes the insulating film 131 formed of oxide or nitride of metal (indium, zinc, titanium, aluminum, tungsten, tantalum, or molybdenum) (see FIG. 18B).

Figure 18C:
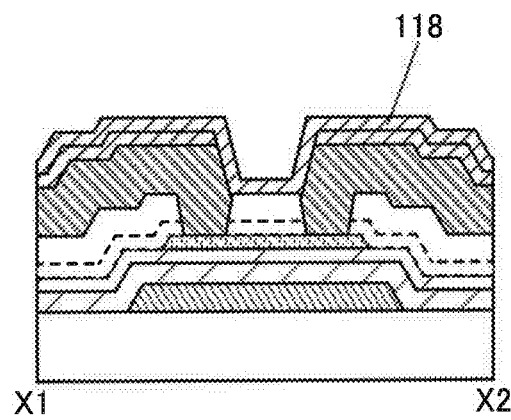

Next, after the insulating film 131 is removed, the insulating film 118 is formed over the insulating films 113a, 113b, and 116 (see FIG. 18C).

Through the above process, the semiconductor device illustrated in FIGS. 4A to 4C can be manufactured.

Note that in the process for manufacturing the transistor 150A in FIGS. 5A and 5B, the insulating film 118 can be formed without removal of the insulating film 131.

<Method 4 for Manufacturing Semiconductor Device>

Next, a method for manufacturing the transistor 170 that is a semiconductor device of one embodiment of the present invention is described below in detail with reference to FIGS. 19A to 19D and FIGS. 20A to 20D.

FIGS. 19A and 19C and FIGS. 20A and 20C are each a cross-sectional view in the channel length direction of the transistor 170 and FIGS. 19B and 19D and FIGS. 20B and 20D are each a cross-sectional view in the channel width direction of the transistor 170.

Figure 19A:
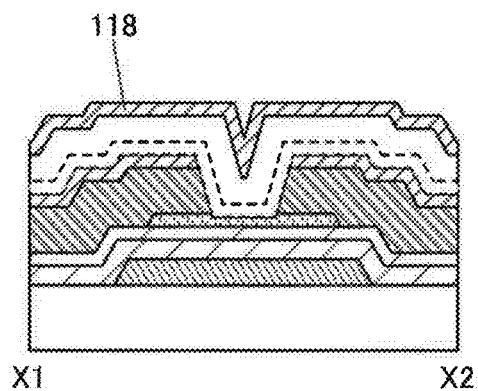
FIGS. 19A to 19D are cross-sectional views illustrating an example of a manufacturing process of a semiconductor device.
Figure 19B:
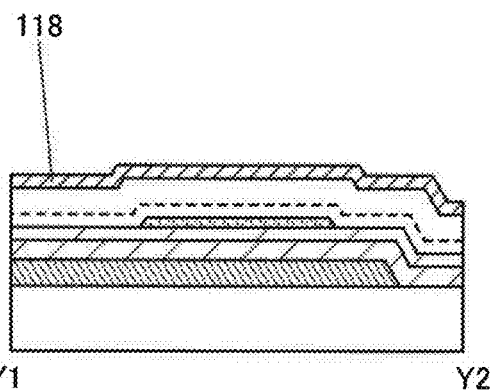
Figure 19C:
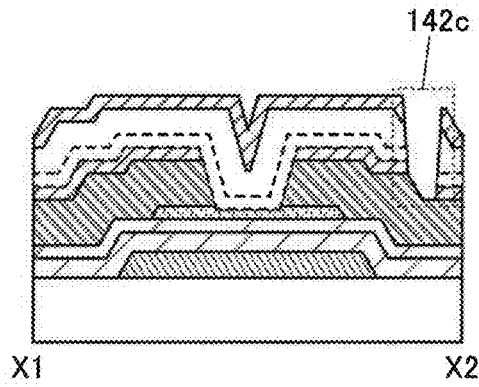
Figure 19D:
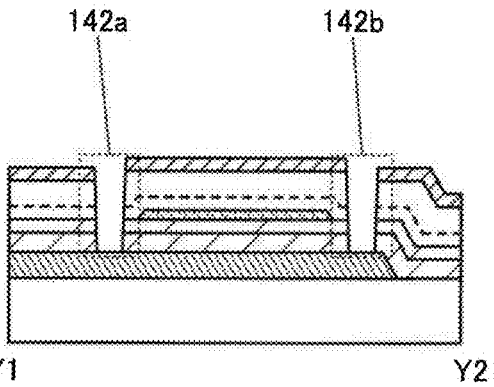

First, the steps up to the step in FIG. 14C are performed (see FIGS. 19A and 19B).

Next, a mask is formed over the insulating film 118 through a lithography process, and the opening 142c is formed in a desired region in the insulating films 114, 116, and 118. In addition, a mask is formed over the insulating film 118 through a lithography process, and the openings 142a and 142b are formed in desired regions in the insulating films 106, 107, 114, 116, and 118. Note that the opening 142c reaches the conductive film 112b. The openings 142a and 142b reach the conductive film 104 (see FIGS. 19C and 19D).

Note that the openings 142a and 142b and the opening 142c may be formed at a time or may be formed by different steps. In the case where the openings 142a and 142b and the opening 142c are formed at a time, for example, a gray-tone mask or a half-tone mask may be used.

Figure 20A:
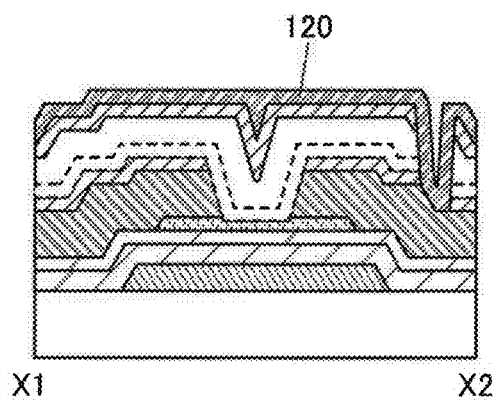
FIGS. 20A to 20D are cross-sectional views illustrating an example of a manufacturing process of a semiconductor device.
Figure 20B:
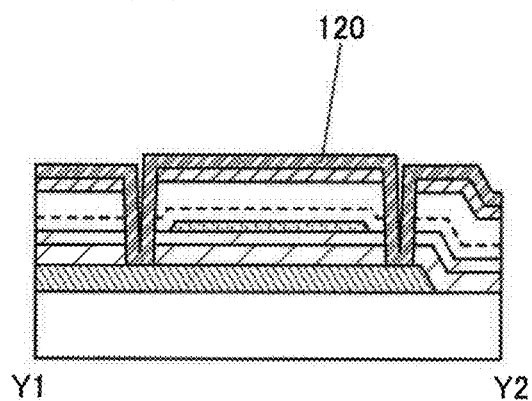

Next, a conductive film 120 is formed over the insulating film 118 to cover the openings 142a, 142b, and 142c (see FIGS. 20A and 20B).

For the conductive film 120, for example, a material including one of indium (In), zinc (Zn), and tin (Sn) can be used. In particular, for the conductive film 120, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added (ITSO) can be used. The conductive film 120 can be formed by a sputtering method, for example. In this embodiment, a 110-nm-thick ITSO film is formed by a sputtering method.

Figure 20C:
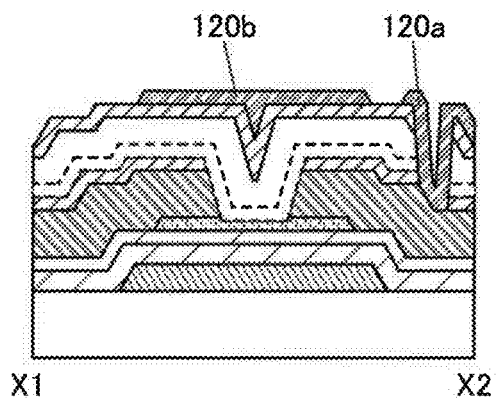
Figure 20D:
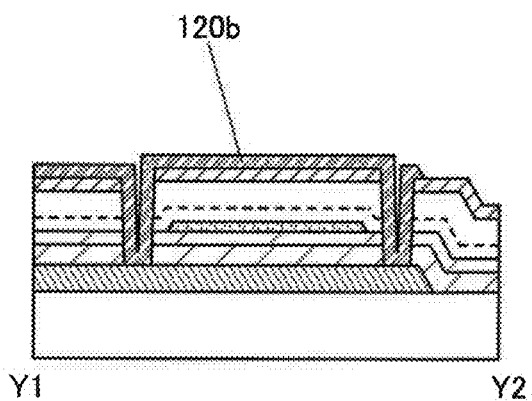

Next, a mask is formed over the conductive film 120 through a lithography process, and the conductive film 120 is processed into desired regions to form the conductive films 120a and 120b (see FIGS. 20C and 20D).

Through the above process, the transistor 170 illustrated in FIGS. 8A to 8C can be manufactured.

<Method 5 for Manufacturing Semiconductor Device>

Next, a method for manufacturing the transistor 100D in FIGS. 10C and 10D that is a semiconductor device of one embodiment of the present invention is described below with reference to FIGS. 38A to 38D and FIGS. 39A to 39D.

First, the steps up to the step in FIG. 12A are performed.

Figure 38A:
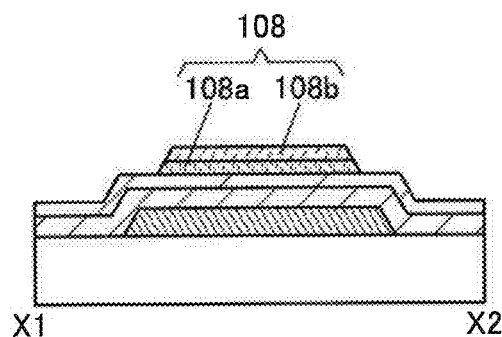
FIGS. 38A to 38D are cross-sectional views illustrating an example of a manufacturing process of a semiconductor device.
Figure 38B:
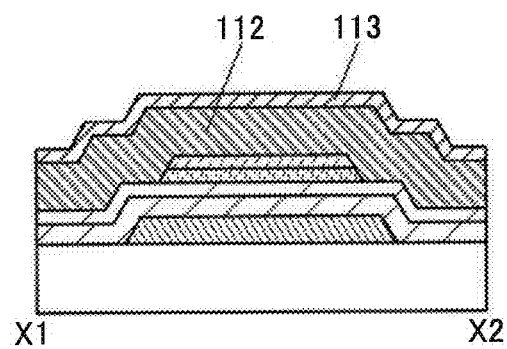

Next, the oxide semiconductor films 108a and 108b are formed over the insulating film 107 (see FIG. 38A).

In this embodiment, an oxide semiconductor film is deposited by a sputtering method using an In—Ga—Zn metal oxide target (with an atomic ratio of In:Ga:Zn=1:1:1.2). After that, another oxide semiconductor film is deposited successively in vacuum using an In—Ga—Zn metal oxide target (with an atomic ratio of In:Ga:Zn=1:4:5), whereby a stacked-layer oxide film is formed. Next, a mask is formed over the stacked-layer oxide film through a lithography process, and the stacked-layer oxide film is processed into desired regions to form the islan-shaped oxide semiconductor films 108a and 108b.

After the oxide semiconductor films 108a and 108b are formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor films 108a and 108b and can reduce hydrogen, water, and the like contained in the oxide semiconductor films 108a and 108b. Note that the heat treatment for the purpose of reducing hydrogen, water, and the like may be performed before the oxide semiconductor films 108a and 108b are processed into island shapes.

Next, the conductive film 112 is formed over the insulating film 107 and the oxide semiconductor film 108b. Then, the insulating film 113 is formed over the conductive film 112 (see FIG. 38B).

Figure 38C:
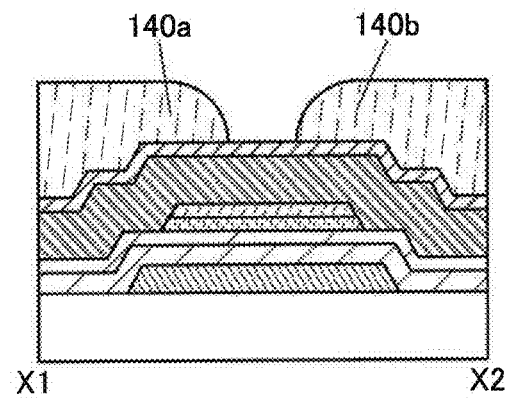

Subsequently, the masks 140a and 140b are formed over the insulating film 113 (see FIG. 38C).

Figure 38D:
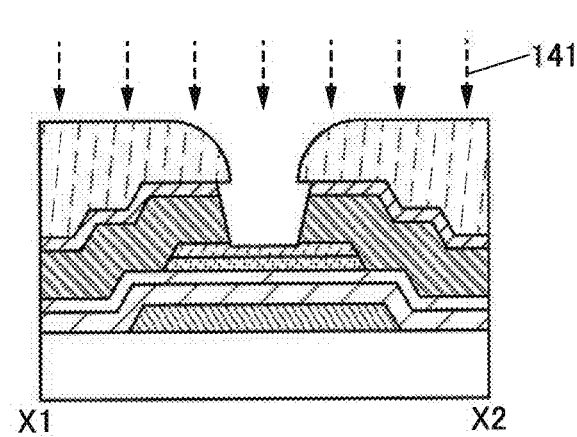

After that, the conductive film 112 and the insulating film 113 are etched from above the masks 140a and 140b using the etching gas 141 (see FIG. 38D).

Note that the oxide semiconductor film 108b also functions as a protective insulating film for the oxide semiconductor film 108a when the conductive film 112 and the insulating film 113 are etched.

Figure 39A:
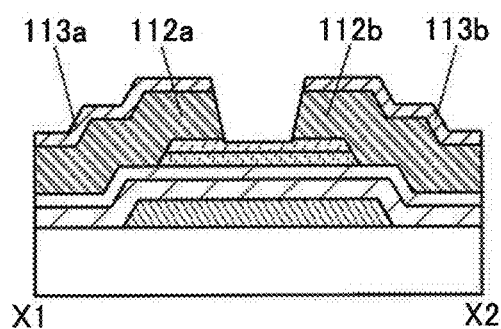
FIGS. 39A to 39D are cross-sectional views illustrating an example of a manufacturing process of a semiconductor device.

Next, the masks 140a and 140b are removed, whereby the conductive films 112a and 112b functioning as a source electrode and a drain electrode, the insulating film 113a over the conductive film 112a, and the insulating film 113b over the conductive film 112b are formed (see FIG. 39A).

After the conductive films 112a and 112b and the insulating films 113a and 113b are formed, a surface of the oxide semiconductor film 108b may be cleaned. The cleaning may be performed, for example, using a chemical solution such as phosphoric acid. The cleaning using a chemical solution such as a phosphoric acid can remove impurities (e.g., an element included in the conductive films 112a and 112b and the like) attached to the surface of the oxide semiconductor film 108b.

Note that a recessed portion might be formed in part of the oxide semiconductor film 108b at the step of forming the conductive films 112a and 112b and the insulating films 113a and 113b and/or the cleaning step.

Through the above process, the transistor 100D is formed.

Figure 39B:
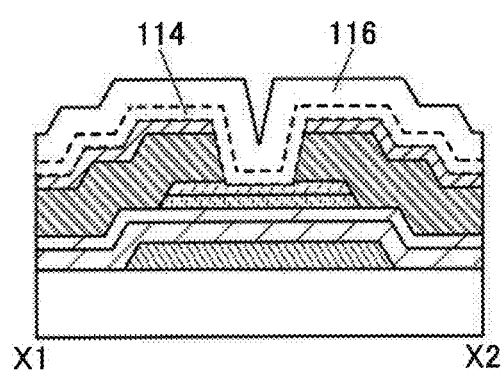

Then, over the transistor 100D, specifically, over the oxide semiconductor film 108b and the insulating films 113a and 113b of the transistor 100D, the insulating films 114 and 116 functioning as protective insulating films for the transistor 100D are formed (see FIG. 39B).

Note that after the insulating films 114 and 116 are formed, heat treatment may be performed. The heat treatment can reduce nitrogen oxide contained in the insulating films 114 and 116. Alternatively, part of oxygen contained in the insulating films 114 and 116 can be moved to the oxide semiconductor film 108, so that the amount of oxygen vacancy in the oxide semiconductor film 108 can be reduced. In this embodiment, the heat treatment is performed at 350° C. for 1 hour in an atmosphere of nitrogen and oxygen.

Figure 39C:
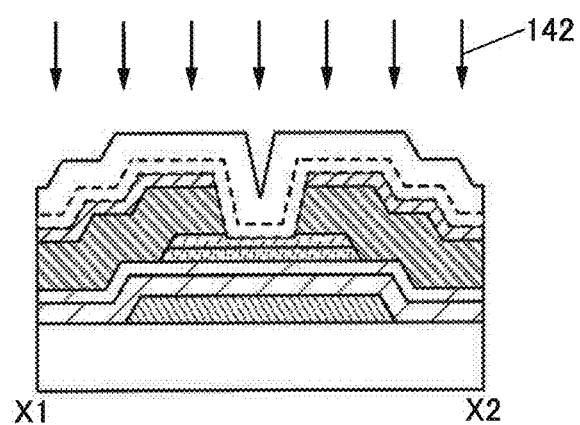

Then, the oxygen 142 is added to the oxide semiconductor film 108a through the insulating films 114 and 116 and the oxide semiconductor film 108b (see FIG. 39C).

The oxide semiconductor film 108b has the same function as the film 130 that inhibits release of oxygen, which is described above. Furthermore, when the oxide semiconductor film 108b is formed, oxygen may be introduced to the vicinity of the interface between the oxide semiconductor film 108a and the oxide semiconductor film 108b.

Figure 39D:
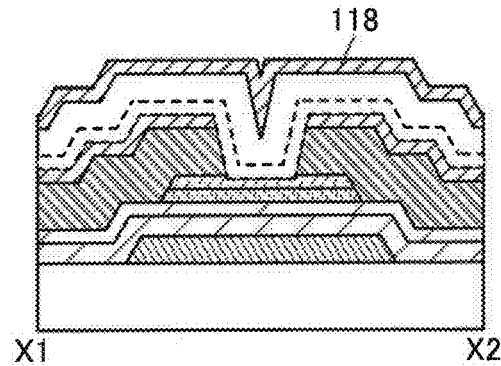

Next, the insulating film 118 functioning as a protective insulating film for the transistor 100D is formed over the insulating film 116 (see FIG. 39D).

Through the above process, the semiconductor device illustrated in FIGS. 10C and 10D can be manufactured.

The structure and method described in this embodiment can be implemented by being combined as appropriate with any of the other structures and methods described in the other embodiments.

Embodiment 2

In this embodiment, the structure of an oxide semiconductor included in a semiconductor device of one embodiment of the present invention is described below in detail.

First a structure which can be included in an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. In addition, examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor film that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 21A:
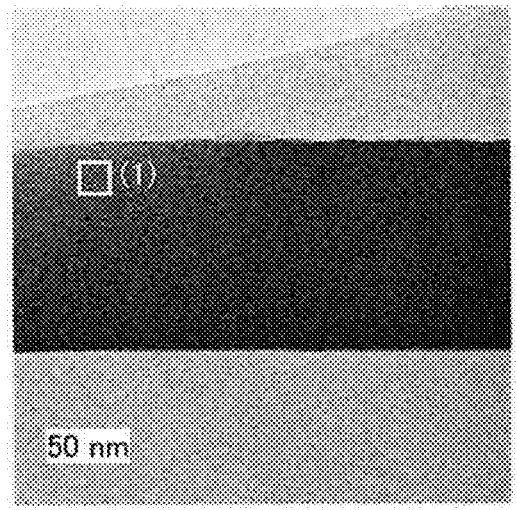
FIGS. 21A to 21D are Cs-corrected high-resolution TEM images of a cross section of a CAAC-OS and a cross-sectional schematic view of the CAAC-OS.

The CAAC-OS observed with a TEM is described below. FIG. 21A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 21B:
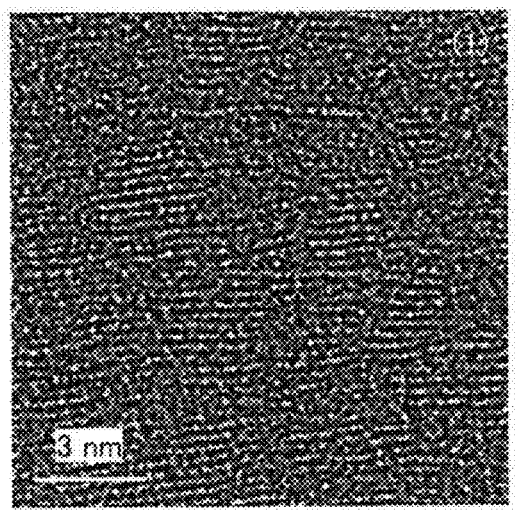

FIG. 21B is an enlarged Cs-corrected high-resolution TEM image of a region (1) in FIG. 21A. FIG. 21B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 21C:
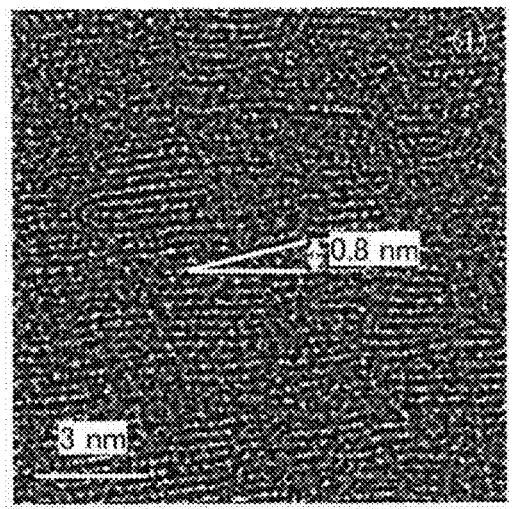

As shown in FIG. 21B, the CAAC-OS has a characteristic atomic arrangement. The characteristic atomic arrangement is denoted by an auxiliary line in FIG. 21C. FIGS. 21B and 21C prove that the size of a pellet is approximately 1 nm to 3 nm, and the size of a space caused by tilt of the pellets is approximately 0.8 nm. Therefore, the pellet can also be referred to as a nanocrystal (nc). Furthermore, a CAAC-OS can be referred to as an oxide semiconductor including c-axis aligned nanocrystals (CANC).

Figure 21D:
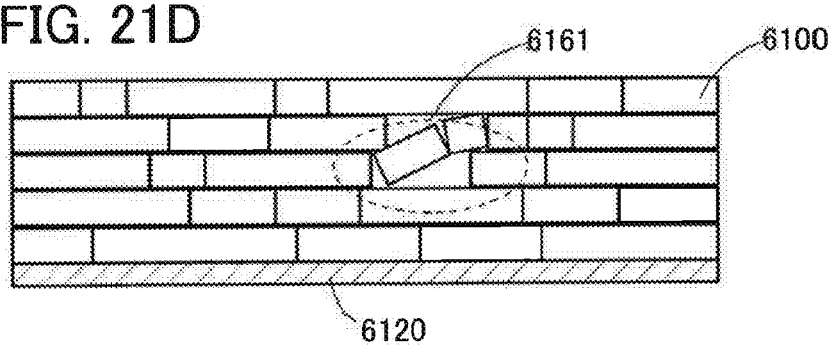

Here, according to the Cs-corrected high-resolution TEM images, the schematic arrangement of pellets 5100 of a CAAC-OS over a substrate 5120 is illustrated by such a structure in which bricks or blocks are stacked (see FIG. 21D). The part in which the pellets are tilted as observed in FIG. 21C corresponds to a region 5161 shown in FIG. 21D.

Figure 22A:
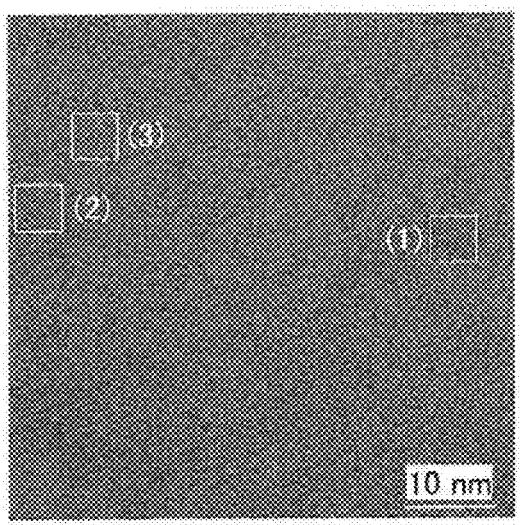
FIGS. 22A to 22D are Cs-corrected high-resolution TEM images of a plane of a CAAC-OS.
Figure 22B:
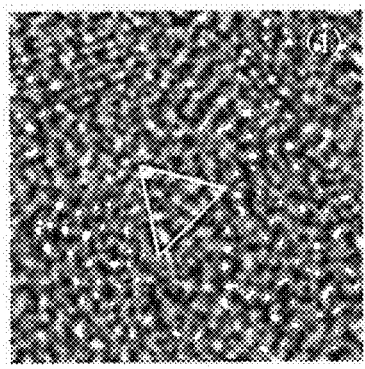
Figure 22C:
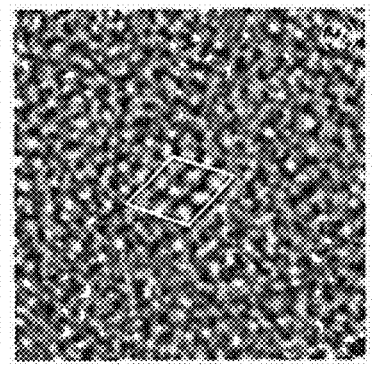
Figure 22D:
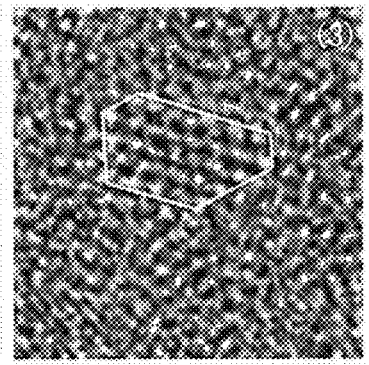

FIG. 22A shows a Cs-corrected high-resolution TEM image of a plane of the CAAC-OS observed from a direction substantially perpendicular to the sample surface. FIGS. 22B, 22C, and 22D are enlarged Cs-corrected high-resolution TEM images of regions (1), (2), and (3) in FIG. 22A, respectively. FIGS. 22B, 22C, and 22D indicate that metal atoms are arranged in a triangular, quadrangular, or hexagonal configuration in a pellet. However, there is no regularity of arrangement of metal atoms between different pellets.

Figure 23A:
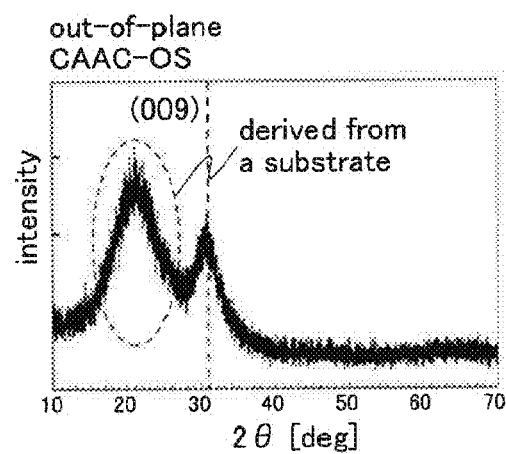
FIGS. 23A to 23C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 23A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 23B:
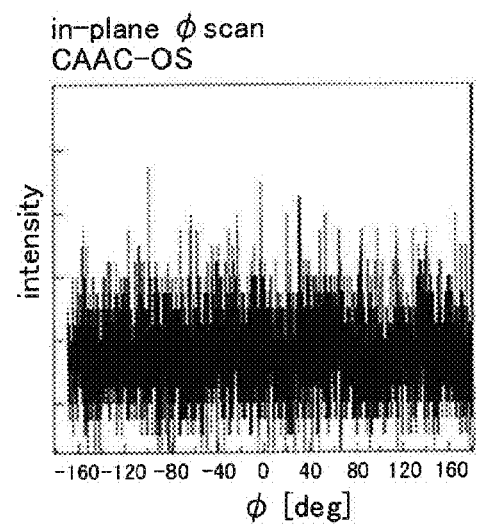
Figure 23C:
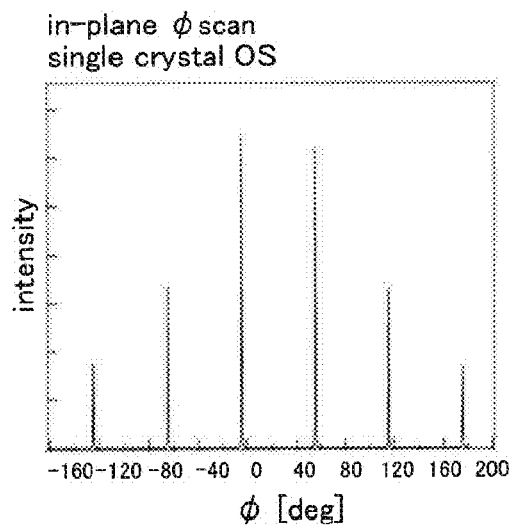

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($0$ axis), as shown in FIG. 23B, a peak is not clearly observed. In contrast, in the case of a single crystal oxide semiconductor of $InGaZnO_4$, when f scan is performed with $2\theta$ fixed at around 56°, as shown in FIG. 23C, six peaks which are derived from crystal planes equivalent to the (110) plane are observed. Accordingly, the structural analysis using XRD shows that the directions of a-axes and b-axes are irregularly oriented in the CAAC-OS.

Figure 51A:
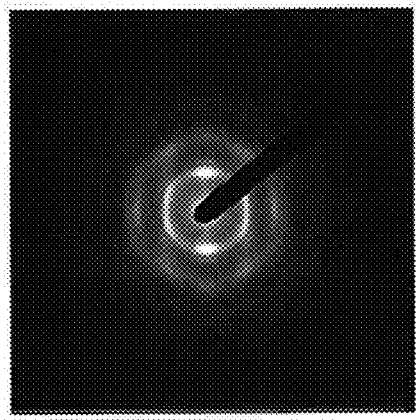
FIGS. 51A and 51B show electron diffraction patterns of a CAAC-OS.
Figure 51B:
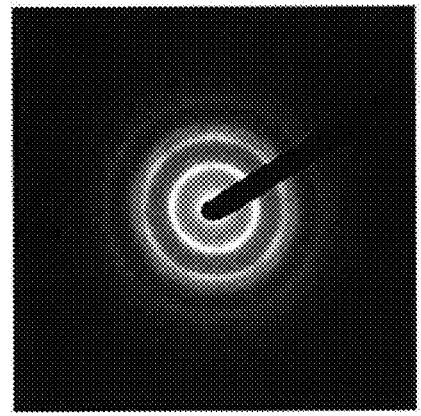

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 51A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 51B shows a diffraction pattern obtained in such a manner that an electron beam with a probe diameter of 300 nm is incident on the same sample in a direction perpendicular to the sample surface. As shown in FIG. 51B, a ring-like diffraction pattern is observed. Thus, the electron diffraction also indicates that the a-axes and b-axes of the pellets included in the CAAC-OS do not have regular alignment. The first ring in FIG. 51B is considered to be derived from the (010) plane, the (100) plane, and the like of the InGaZnO$_4$ crystal. Furthermore, it is supposed that the second ring in FIG. 51B is derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancy in the oxide semiconductor serves as a carrier trap or serves as a carrier generation source when hydrogen is captured therein.

The CAAC-OS having small amounts of impurities and oxygen vacancy is an oxide semiconductor film with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS and an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 52:
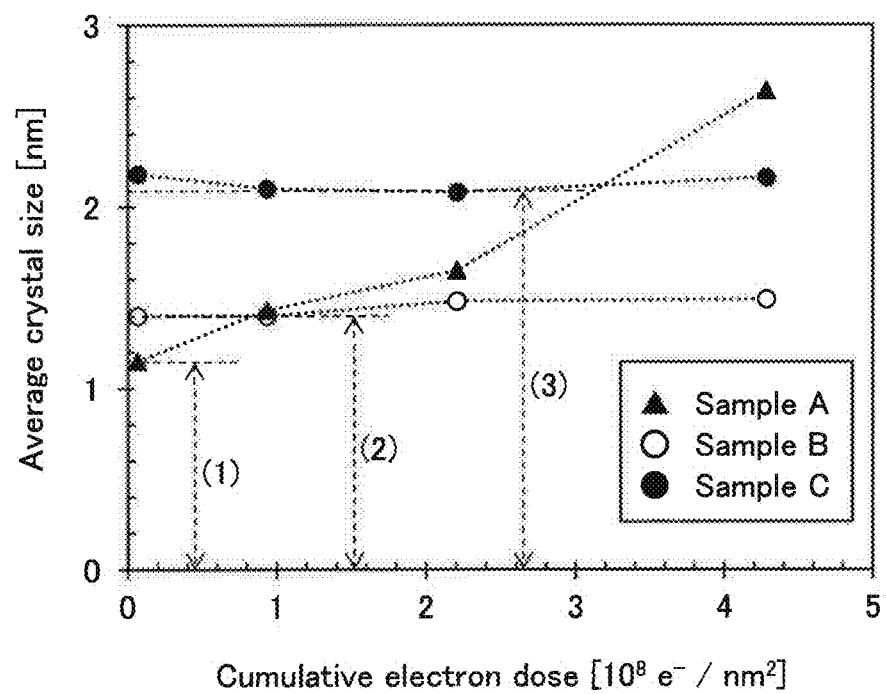
FIG. 52 shows a change of crystal parts of In—Ga—Zn oxides owing to electron irradiation.

FIG. 52 shows change in the average size of crystal parts (at 22 points to 45 points) in each sample. Note that the crystal part size corresponds to the length of a lattice fringe. FIG. 52 indicates that the crystal part size in the a-like OS increases with an increase in the cumulative electron dose. Specifically, as shown by (1) in FIG. 52, a crystal part of approximately 1.2 nm at the start of TEM observation (the crystal part is also referred to as an initial nucleus) grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 52, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Deposition Model>

Examples of deposition models of a CAAC-OS film and an nc-OS film are described below.

Figure 40A:
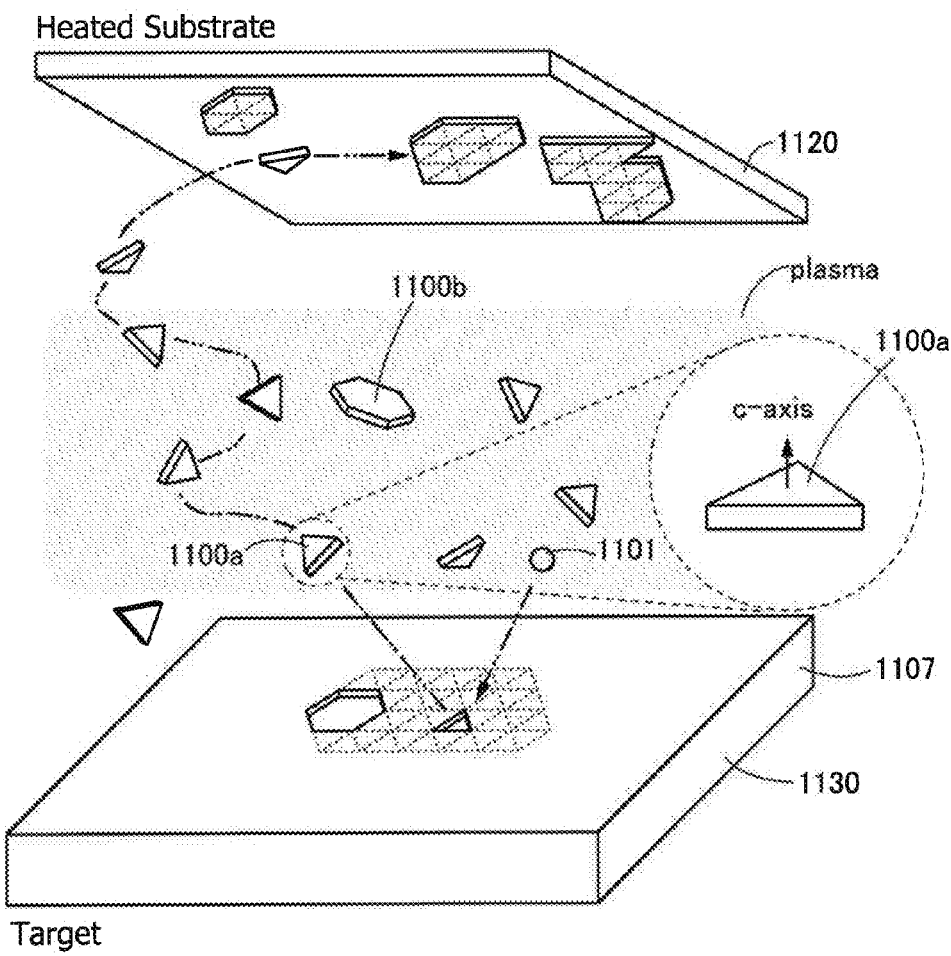
FIGS. 40A to 40C are a schematic diagram illustrating a deposition model of a CAAC-OS and a pellet, and cross-sectional views of a CAAC-OS.

FIG. 40A is a schematic diagram of a deposition chamber illustrating a state where the CAAC-OS film is formed by a sputtering method.

A target 1130 is attached to a backing plate. Under the target 1130 and the backing plate, a plurality of magnets are provided. The plurality of magnets cause a magnetic field over the target 1130. A sputtering method in which the disposition speed is increased by utilizing a magnetic field of magnets is referred to as a magnetron sputtering method.

The target 1130 has a polycrystalline structure in which a cleavage plane exists in at least one crystal grain. Note that the details of the cleavage plane are described later.

A substrate 1120 is placed to face the target 1130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 1130, and plasma is observed. Note that the magnetic field over the target 1130 forms a high-density plasma region. In the high-density plasma region, the deposition gas is ionized, so that an ion 1101 is generated. Examples of the ion 1101 include an oxygen cation (O$^+$) and an argon cation (Ar$^+$).

The ion 1101 is accelerated to the target 1130 side by an electric field, and collides with the target 1130 eventually. At this time, a pellet 1100a and a pellet 1100b which are flat-plate-like or pellet-like sputtered particles are separated and sputtered from the cleavage plane. Note that structures of the pellet 1100a and the pellet 1100b may be distorted by an impact of collision of the ion 1101.

The pellet 1100a is a flat-plate-like or pellet-like sputtered particle having a triangle plane, e.g., a regular triangle plane. The pellet 1100b is a flat-plate-like or pellet-like sputtered particle having a hexagon plane, e.g., regular hexagon plane. Note that flat-plate-like or pellet-like sputtered particles such as the pellet 1100a and the pellet 1100b are collectively called pellets 1100. The shape of a flat plane of the pellet 1100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 1100 is determined depending on the kind of the deposition gas and the like. The thicknesses of the pellets 1100 are preferably uniform; the reasons thereof are described later. In addition, the sputtered particle preferably has a pellet shape with a small thickness as compared to a dice shape with a large thickness.

Figure 42:
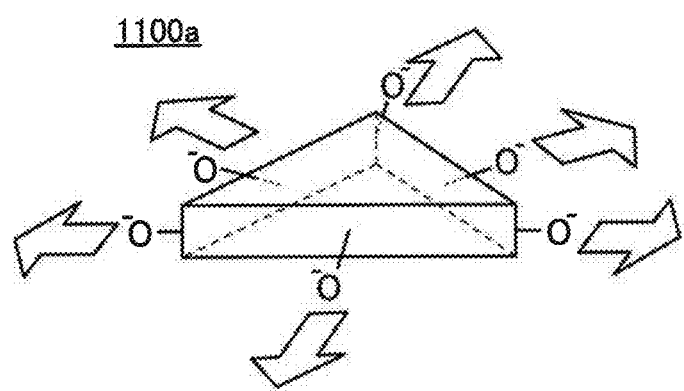
FIG. 42 illustrates a pellet.

The pellet 1100 receives charge when passing through the plasma, so that side surfaces of the pellet 1100 are negatively or positively charged in some cases. The pellet 1100 includes an oxygen atom on its side surface, and the oxygen atom may be negatively charged. For example, a case in which the pellet 1100a includes, on its side surfaces, oxygen atoms that are negatively charged is illustrated in FIG. 42. As in this view, when the side surfaces are charged in the same polarity, charges repel each other, and accordingly, the pellet can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, and zinc atom is negatively charged.

Figure 43:
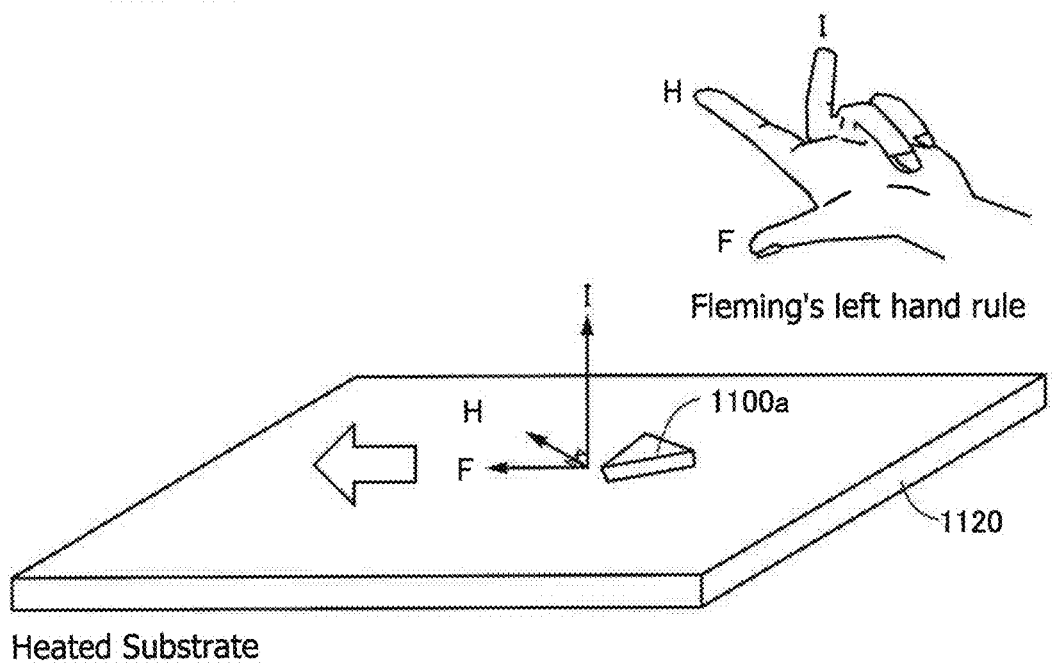
FIG. 43 illustrates force applied to a pellet on a formation surface.

As shown in FIG. 40A, the pellet 1100 flies like a kite in plasma and flutters up to the substrate 1120. Since the pellets 1100 are charged, when the pellet 1100 gets close to a region where another pellet 1100 has already been deposited, repulsion is generated. Here, above the substrate 1120, a magnetic field is generated in a direction parallel to a top surface of the substrate 1120. A potential difference is given between the substrate 1120 and the target 1130, and accordingly, current flows from the substrate 1120 toward the target 1130. Thus, the pellet 1100 is given a force (Lorentz force) on the top surface of the substrate 1120 by an effect of the magnetic field and the current (see FIG. 43). This is explainable with Fleming's left-hand rule. In order to increase a force applied to the pellet 1100, it is preferable to provide, on the top surface, a region where the magnetic field in a direction parallel to the top surface of the substrate 1120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate is 1.5 times or higher, preferably twice or higher, further preferably 3 times or higher, still further preferably 5 times or higher as high as the magnetic field in a direction perpendicular to the top surface of the substrate 1120.

Figure 44A:
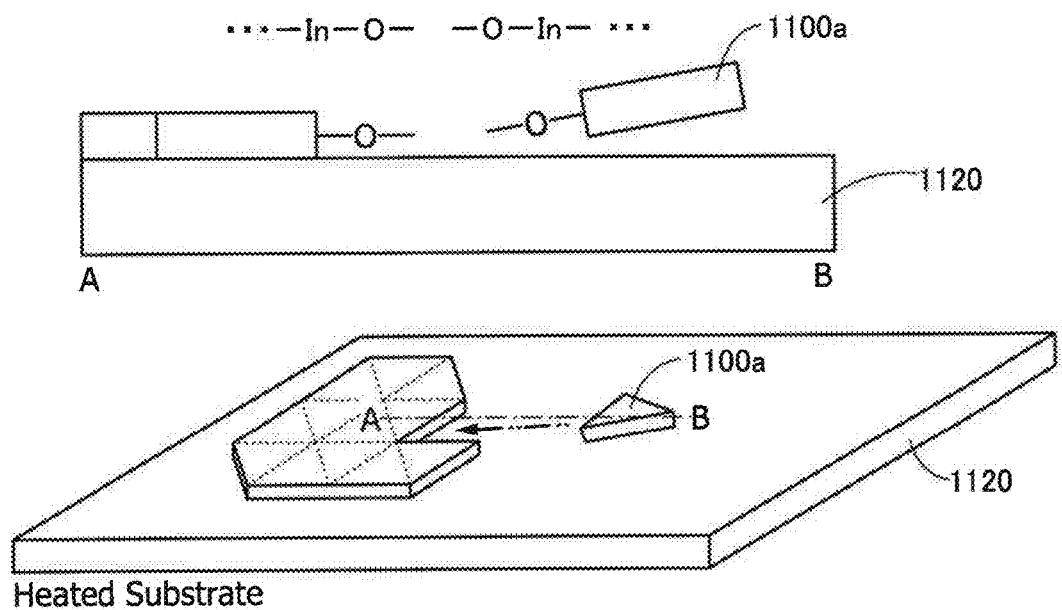
FIGS. 44A and 44B illustrate transfer of pellets on formation surfaces.
Figure 44B:
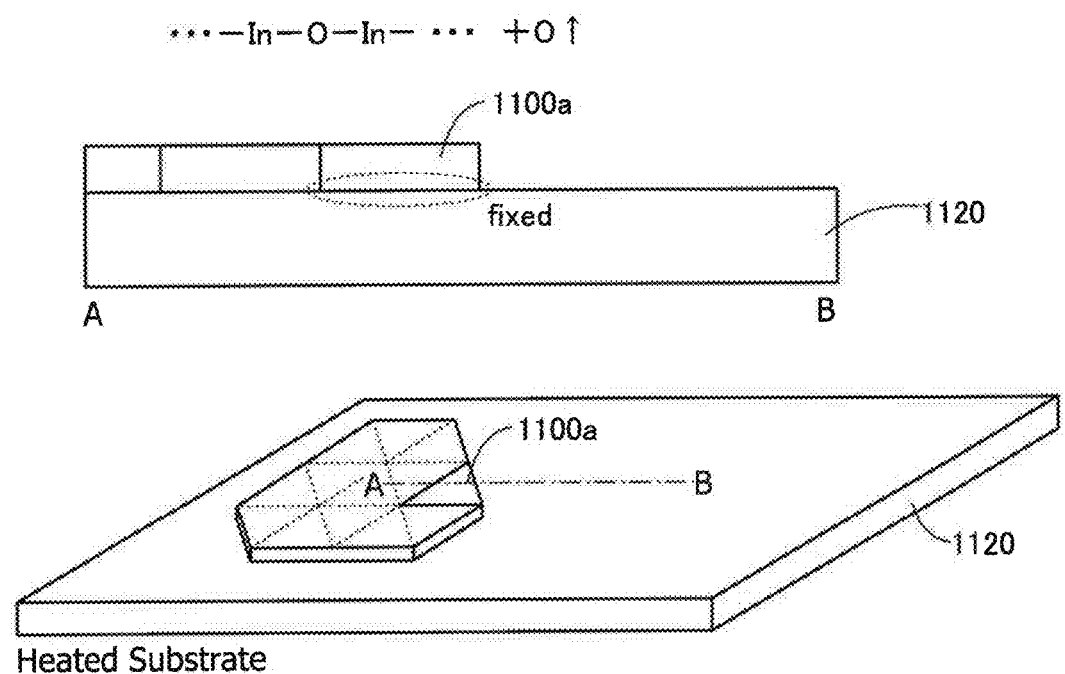

Furthermore, the substrate 1120 is heated, and resistance such as friction between the pellet 1100 and the substrate 1120 is low. As a result, as illustrated in FIG. 44A, the pellet 1100 glides above the surface of the substrate 1120. The glide of the pellet 1100 is caused in a state where the flat plane faces the substrate 1120. Then, as illustrated in FIG. 44B, when the pellet 1100 reaches the side surface of another pellet 1100 that has been already deposited, the side surfaces of the pellets 1100 are bonded. At this time, the oxygen atom on the side surface of the pellet 1100 is released. With the released oxygen atom, oxygen vacancy in a CAAC-OS is filled in some cases; thus, the CAAC-OS has a low density of defect states.

Further, the pellet 1100 is heated on the substrate 1120, whereby atoms are rearranged, and the structure distortion caused by the collision of the ion 1101 can be reduced. The pellet 1100 whose structure distortion is reduced is substantially single crystal. Even when the pellets 1100 are heated after being bonded, expansion and contraction of the pellet 1100 itself hardly occur, which is caused by turning the pellet 1100 into substantially single crystal. Thus, formation of defects such as a grain boundary due to expansion of a space between the pellets 1100 can be prevented, and accordingly, generation of crevasses can be prevented. Further, the space is filled with elastic metal atoms and the like, whereby the elastic metal atoms have a function, like a highway, of jointing side surfaces of the pellets 1100 which are not aligned with each other.

It is considered that as shown in such a model, the pellets 1100 are deposited over the substrate 1120. Thus, a CAAC-OS film can be deposited even when a surface over which a film is formed (film formation surface) does not have a crystal structure, which is different from film deposition by epitaxial growth. For example, even when a surface (film formation surface) of the substrate 1120 has an amorphous structure, a CAAC-OS film can be formed.

Figure 40B:
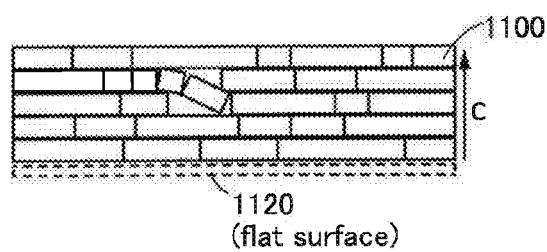

Further, it is found that in formation of the CAAC-OS, the pellets 1100 are arranged in accordance with a surface shape of the substrate 1120 that is the film formation surface even when the film formation surface has unevenness besides a flat surface. For example, in the case where the surface of the substrate 1120 is flat at the atomic level, the pellets 1100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 40B).

Figure 40C:
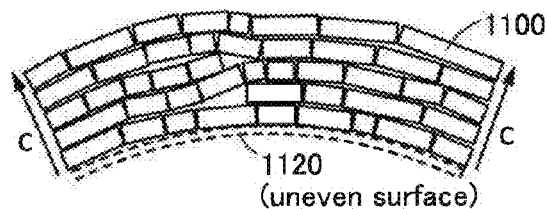

In the case where the top surface of the substrate 1120 has unevenness, a CAAC-OS where n layers (n is a natural number) in each of which the pellets 1100 are arranged along a convex surface are stacked is formed. Since the substrate 1120 has unevenness, a gap is easily generated between in the pellets 1100 in the CAAC-OS in some cases. Note that owing to intermolecular force, the pellets 1100 are arranged so that a gap between the pellets is as small as possible even on the unevenness surface. Therefore, even when the formation surface has unevenness, a CAAC-OS with high crystallinity can be formed (see FIG. 40C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 1120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 1100.

The zinc oxide particle reaches the substrate 1120 before the pellet 1100 does because the zinc oxide particle is smaller than the pellet 1100 in mass. On the surface of the substrate 1120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 1120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target including zinc at a proportion higher than that of the stoichiometric composition is preferably used.

Figure 41:
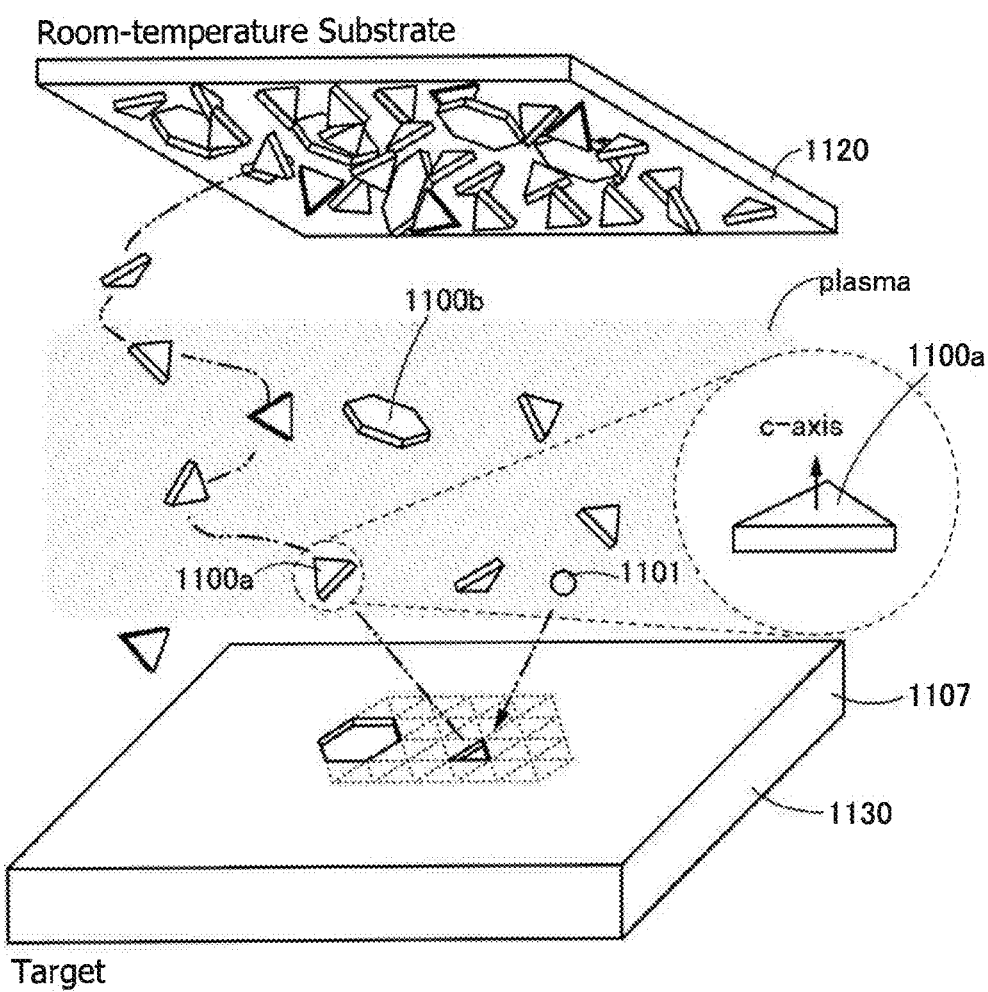
FIG. 41 is a schematic diagram illustrating a deposition model of an nc-OS and a pellet.

An nc-OS can be understood with a deposition model illustrated in FIG. 41. Note that a difference between FIG. 41 and FIG. 40A lies only in the fact that whether the substrate 1120 is heated or not.

Thus, the substrate 1120 is not heated, and a resistance such as friction between the pellet 1100 and the substrate 1120 is high. As a result, the pellets 1100 cannot glide on the surface of the substrate 1120 and are stacked randomly, thereby forming an nc-OS.

<Cleavage Plane>

A cleavage plane that has been mentioned in the deposition model of the CAAC-OS will be described below.

Figure 45A:
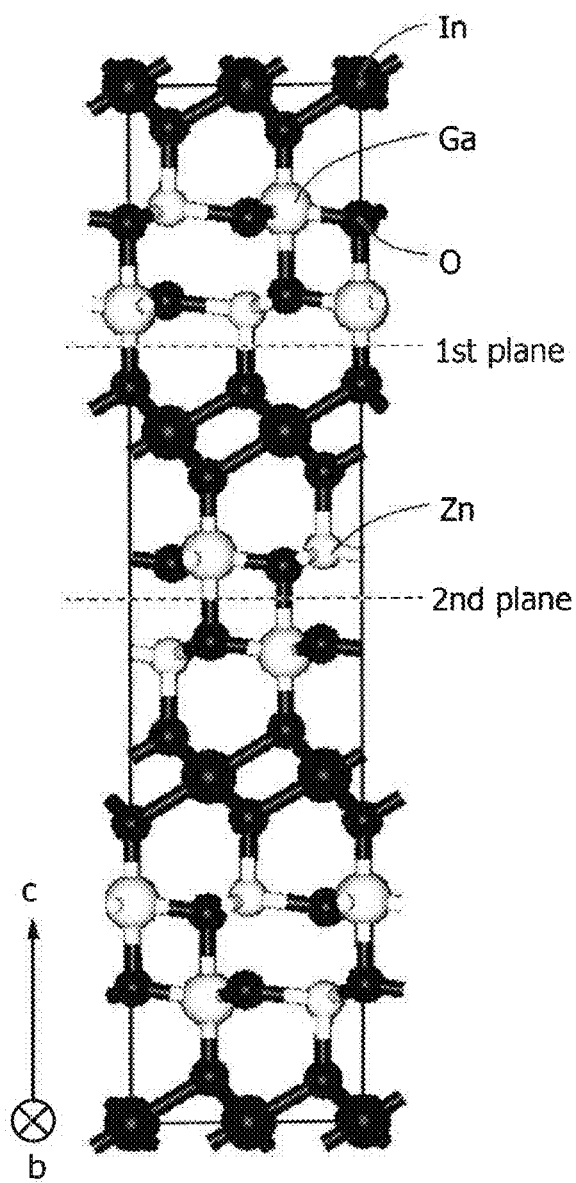
FIGS. 45A and 45B illustrate an $InGaZnO_4$ crystal.
Figure 45B:
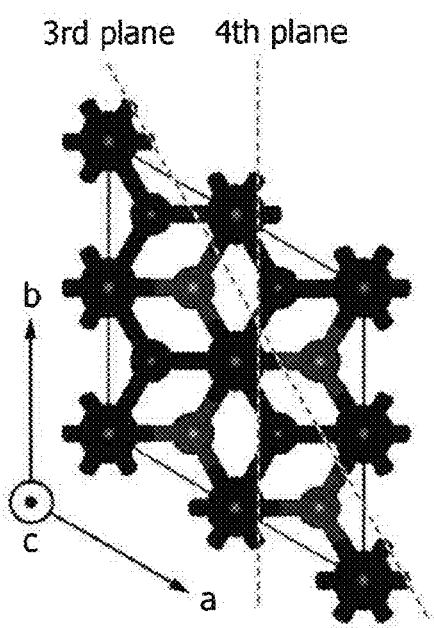

First, a cleavage plane of the target is described with reference to FIGS. 45A and 45B. FIGS. 45A and 45B show the crystal structure of $InGaZnO_4$. Note that FIG. 45A shows the structure of the case where an $InGaZnO_4$ crystal is observed from a direction parallel to the b-axis when the c-axis is in an upward direction. Furthermore, FIG. 45B shows the structure of the case where the $InGaZnO_4$ crystal is observed from a direction parallel to the c-axis.

Energy needed for cleavage at each of crystal planes of the $InGaZnO_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the $InGaZnO_4$ crystal in FIGS. 45A and 45B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 45A). The second plane is a crystal plane between a Ga—Zn—O layer and a Ga—Zn—O layer and is parallel to the (001) plane (or the a-b plane) (see FIG. 45A). The third plane is a crystal plane parallel to the (110) plane (see FIG. 45B). The fourth plane is a crystal plane parallel to the (100) plane (or the b-c plane) (see FIG. 45B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 $J/m^2$, that of the second plane was 0.68 $J/m^2$, that of the third plane was 2.18 $J/m^2$, and that of the fourth plane was 2.12 $J/m^2$ (see Table 1).

TABLE 1

|  | Cleavage energy [$J/m^2$] |
| --- | --- |
| First plane | 2.60 |
| Second plane | 0.68 |
| Third plane | 2.18 |
| Fourth plane | 2.12 |

From the calculations, in the structure of the $InGaZnO_4$ crystal in FIGS. 45A and 45B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the $InGaZnO_4$ crystals in FIG. 45A can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of $InGaZnO_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 46A:
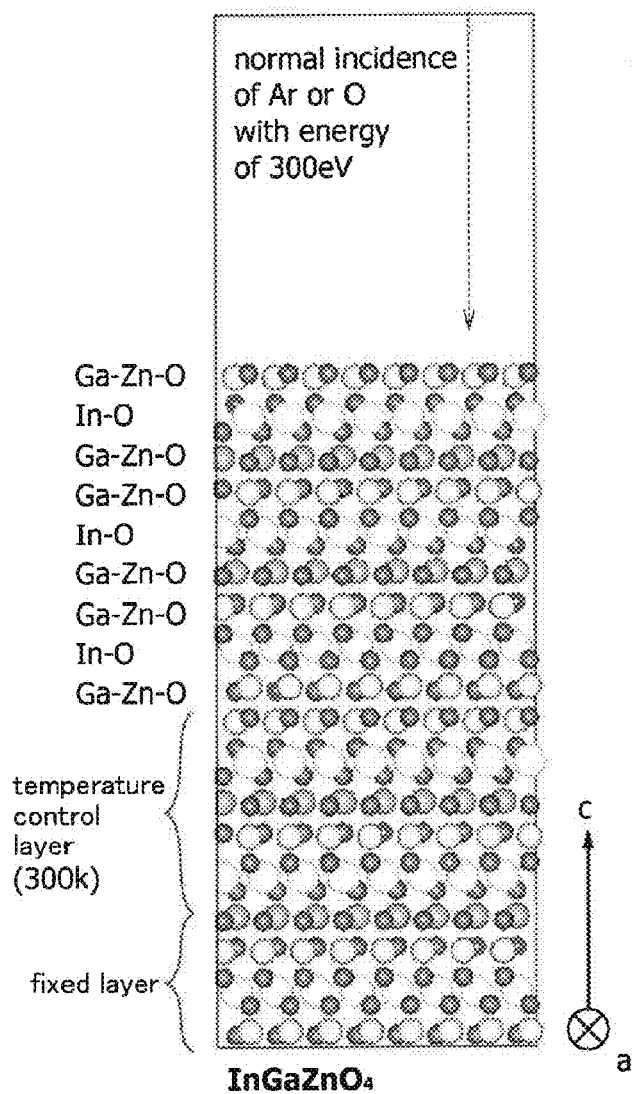
FIGS. 46A and 46B show a structure and the like of $InGaZnO_4$ before collision of an atom.
Figure 46B:
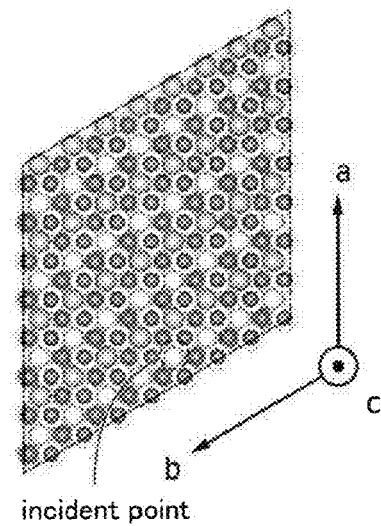

Next, through classical molecular dynamics calculation, on the assumption of an $InGaZnO_4$ crystal having a homologous structure as a target, a cleavage plane in the case where the target is sputtered using argon (Ar) or oxygen (O) is examined. FIG. 46A shows a cross-sectional structure of an $InGaZnO_4$ crystal (2688 atoms) used for the calculation, and FIG. 46B shows a top structure thereof. Note that a fixed layer in FIG. 46A prevents the positions of the atoms from moving. A temperature control layer in FIG. 46A is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the $InGaZnO_4$ crystal under the conditions.

FIG. 47A shows atomic order when 99.9 picoseconds have passed after argon enters the cell including the $InGaZnO_4$ crystal in FIGS. 46A and 46B. FIG. 47B shows atomic order when 99.9 picoseconds have passed after oxygen enters the cell. Note that in FIGS. 47A and 47B, part of the fixed layer in FIG. 46A is omitted.

According to FIG. 47A, in a period from entry of argon into the cell to when 99.9 picoseconds have passed, a crack is formed from the cleavage plane corresponding to the second plane in FIG. 45A. Thus, in the case where argon collides with the InGaZnO$_4$ crystal and the uppermost surface is the second plane (the zero-th), a large crack is found to be formed in the second plane (the second).

On the other hand, according to FIG. 47B, in a period from entry of oxygen into the cell to when 99.9 picoseconds have passed, a crack is found to be formed from the cleavage plane corresponding to the second plane in FIG. 45A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 48A:
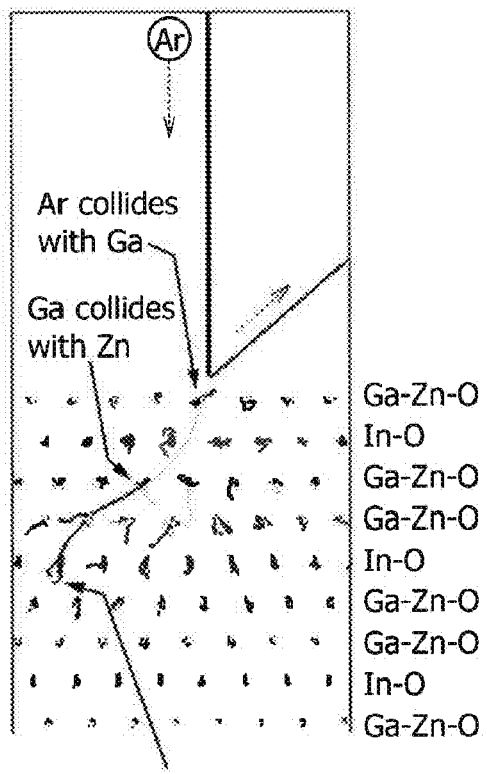
FIGS. 48A and 48B show trajectories of atoms after collision of atoms.

FIG. 48A shows trajectories of the atoms from 0 picosecond to 0.3 picoseconds after argon enters the cell including the InGaZnO$_4$ crystal in FIGS. 46A and 46B. Accordingly, FIG. 48A corresponds to a period from FIGS. 46A and 46B to FIG. 47A.

According to FIG. 48A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 46A.

Figure 48B:
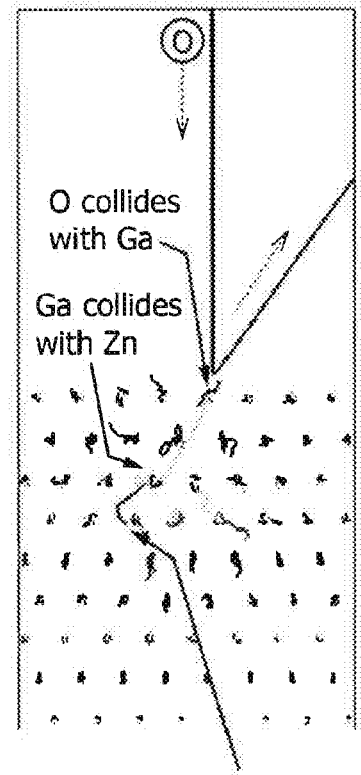

FIG. 48B shows trajectories of the atoms from 0 picosecond to 0.3 picoseconds after oxygen enters the cell including the InGaZnO$_4$ crystal in FIGS. 46A and 46B. Accordingly, FIG. 48B corresponds to a period from FIGS. 46A and 46B to FIG. 47A.

On the other hand, according to FIG. 48B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 46A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \tfrac{1}{2} m_A v_A^2 + \tfrac{1}{2} m_{Ga} v_{Ga}^2 \qquad \text{[Formula 1]}$$

$$m_A v_A + m_{Ga} v_{Ga} = m_A v'_A + m_{Ga} v'_{Ga} \qquad \text{[Formula 2]}$$

On the assumption that collision of argon or oxygen is elastic collision, the relationship among $v_A$, $v'_A$, $v_{Ga}$, and $v'_{Ga}$ can be represented by the following formula (3).

$$v'_A - v'_{Ga} = -(v_A - v_{Ga}) \qquad \text{[Formula 3]}$$

From the formulae (1), (2), and (3), on the assumption that $v_{Ga}$ is 0, the speed of gallium $v'_{Ga}$ after collision of argon or oxygen can be represented by the following formula (4).

$$v'_{Ga} = \frac{\sqrt{m_A}}{m_A + m_{Ga}} \cdot 2\sqrt{2E} \qquad \text{[Formula 4]}$$

In the formula (4), mass of argon or oxygen is substituted into $m_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 40A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 49A:
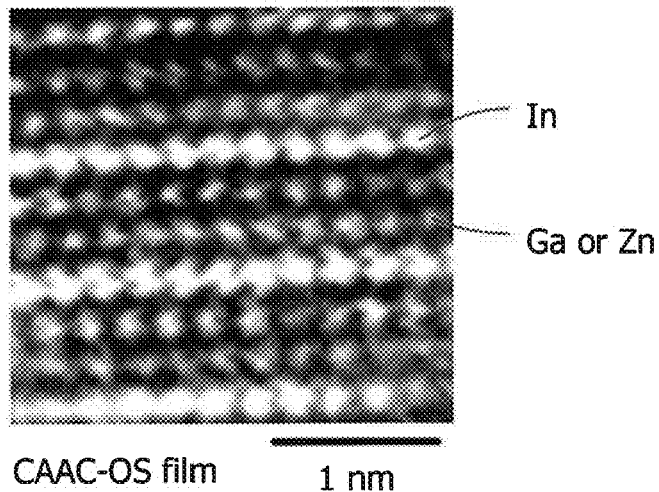
FIGS. 49A and 49B are cross-sectional HAADF-STEM images of a CAAC-OS and a target.
Figure 49B:
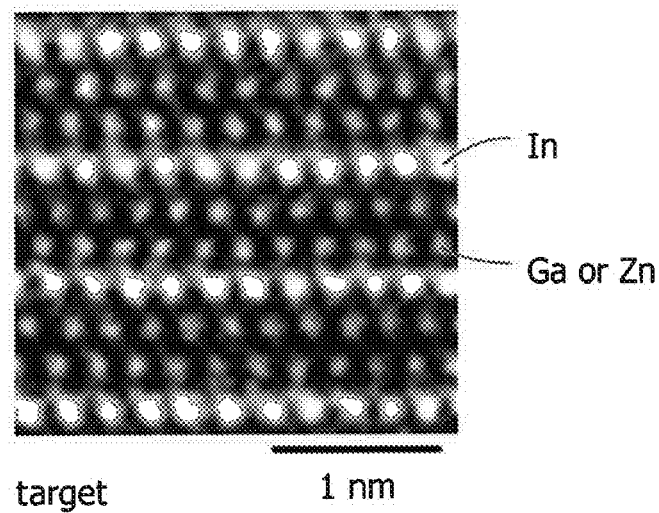

FIGS. 49A and 49B show atomic order of cross sections of an In—Ga—Zn oxide (see FIG. 49A) that is a CAAC-OS deposited by sputtering and a target thereof (see FIG. 49B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 49A and FIG. 49B are compared, it is found that the CAAC-OS and the target each have a homologous structure and atomic order in the CAAC-OS correspond to that in the target. Thus, as illustrated in the deposition model in FIG. 40A, the crystal structure of the target is transferred, whereby a CAAC-OS is formed.

Next, a relationship between crystallinity and an oxygen-transmitting property in the case where the oxide semiconductor film is an In—Ga—Zn oxide is described below.

An energy barrier due to movement of excess oxygen (oxygen) in a crystal of an In—Ga—Zn oxide is obtained by calculation. In the calculation, plane-wave basis first-principles calculation software Vienna ab-initio simulation package (VASP) based on density functional theory is used. GGA-PBE is used as a functional. Cut-off energy of a plane wave is 400 eV. The effect of an inner shell electron is included by a projector augmented wave (PAW) method.

Figure 24:
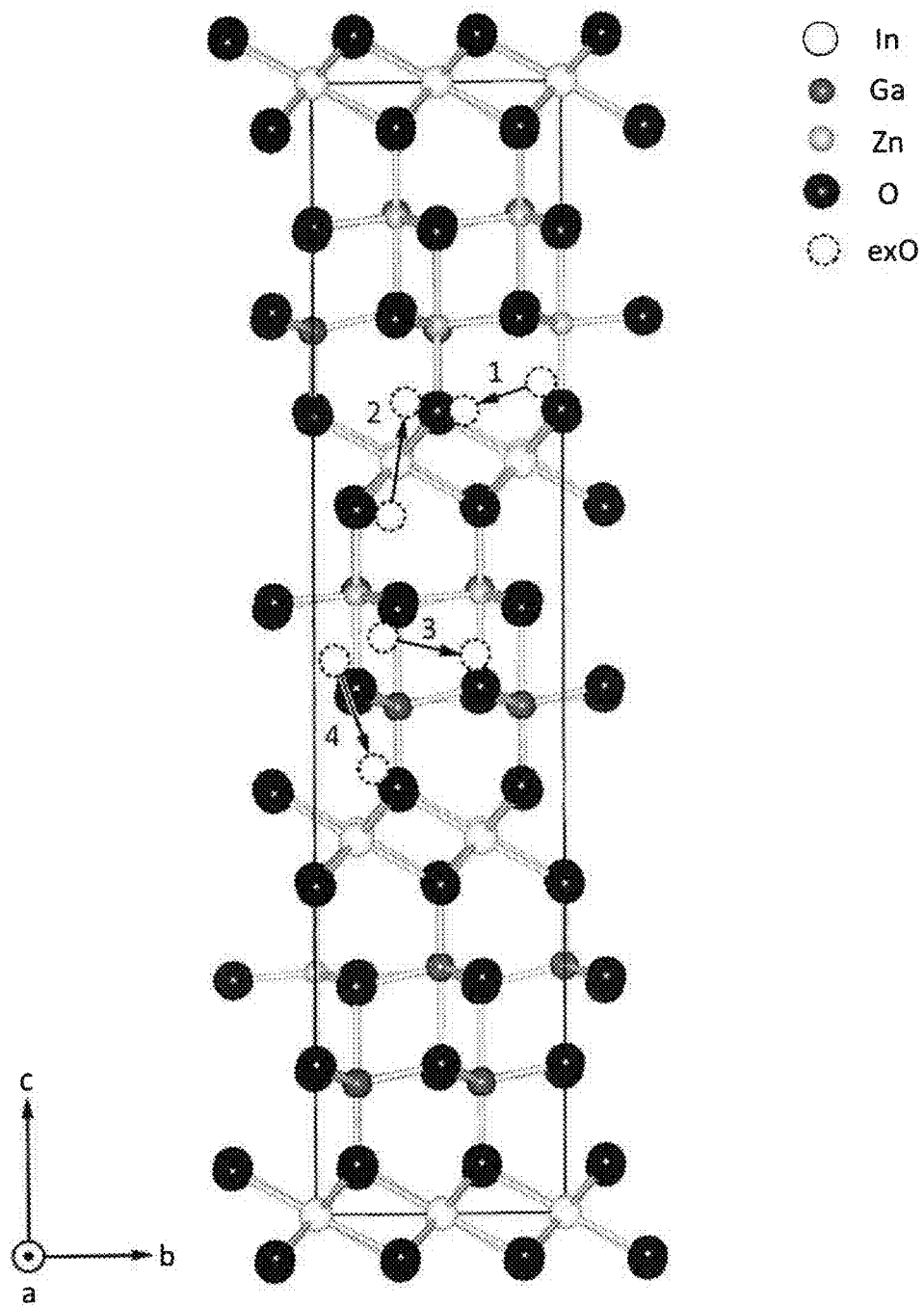
FIG. 24 is a view illustrating a movement path of oxygen in an In—Ga—Zn oxide.

Here, the ease of movement of excess oxygen (oxygen) through movement paths 1 to 4 in a crystal of an In—Ga—Zn oxide illustrated in FIG. 24 is calculated.

The movement path 1 is a path through which excess oxygen (oxygen) bonded to oxygen bonded to three indium atoms and one zinc atom is bonded to adjacent oxygen bonded to three indium atoms and one zinc atom. The movement path 2 is a path through which excess oxygen (oxygen) bonded to oxygen bonded to three indium atoms and one gallium atom crosses a layer containing indium and oxygen and is bonded to adjacent oxygen bonded to three indium atoms and one zinc atom. The movement path 3 is a path through which excess oxygen (oxygen) bonded to oxygen bonded to two gallium atoms and one zinc atom is bonded to adjacent oxygen bonded to two zinc atoms and one gallium atom. The movement path 4 is a path through which excess oxygen (oxygen) bonded to oxygen bonded to two gallium atoms and one zinc atom crosses a layer containing gallium, zinc, and oxygen and is bonded to adjacent oxygen bonded to three indium atoms and one gallium atom.

When the frequency of going over an energy barrier $E_a$ per unit time is referred to as a diffusion frequency R, R can be expressed as the following formula.

$$R = v \cdot \exp[-E_a/(k_B T)] \quad \text{[Formula 5]}$$

Note that v represents the number of heat vibrations of diffusion atoms, $k_B$ represents Boltzmann constant, and T represents the absolute temperature. The diffusion frequency R at 350° C. and 450° C. when $10^{13}$ [1/sec] is applied to v as Debye frequency is shown in Table 2.

TABLE 2

| | Energy barrier [eV] | Diffusion frequency R [1/sec] | |
|---|---|---|---|
| | | 350° C. | 450° C. |
| Movement path 1 | 0.50 | $9.0 \times 10^8$ | $3.3 \times 10^9$ |
| Movement path 2 | 1.97 | $1.2 \times 10^{-3}$ | $1.9 \times 10^{-1}$ |
| Movement path 3 | 0.53 | $5.2 \times 10^8$ | $2.0 \times 10^9$ |
| Movement path 4 | 0.56 | $3.0 \times 10^8$ | $1.3 \times 10^9$ |

As shown in Table 2, the movement path 2 across the layer containing indium and oxygen has a higher energy barrier than the other movement paths. This indicates that movement of excess oxygen (oxygen) in the c-axis direction is less likely to occur in a crystal of an In—Ga—Zn oxide. In other words, in the case where crystals have c-axis alignment and the c-axes are aligned in a direction substantially perpendicular to a formation surface or a top surface, like CAAC-OS, movement of excess oxygen (oxygen) is less likely to occur in the direction substantially perpendicular to the formation surface or the top surface.

The structure and method described in this embodiment can be implemented by being combined as appropriate with any of the other structures and methods described in the other embodiments.

Embodiment 3

In this embodiment, oxygen vacancy of an oxide semiconductor film is described in detail below.

<(1) Ease of Formation and Stability of $V_o H$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters oxygen vacancy $V_o$ if the oxygen vacancy $V_o$ exists in IGZO. A state in which H is in oxygen vacancy $V_o$ is referred to as $V_o H$.

Figure 25:
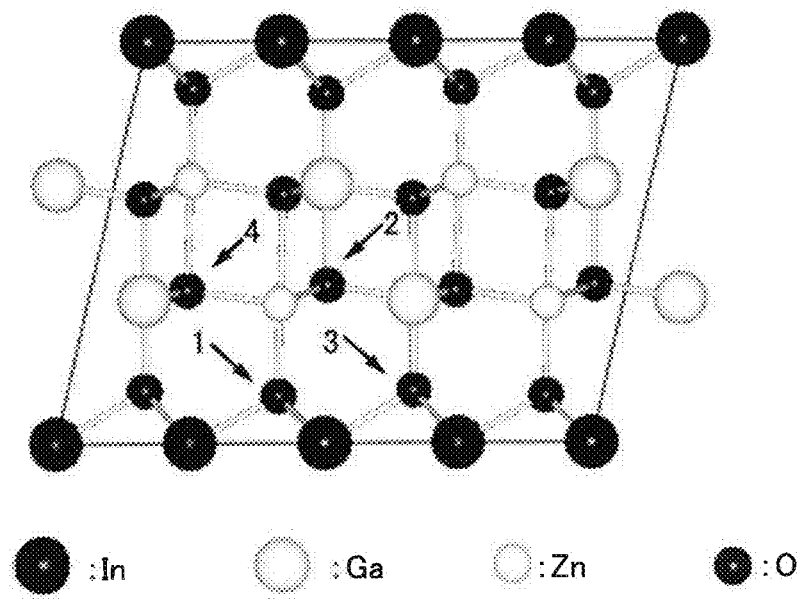
FIG. 25 illustrates a model of the computation.

An $InGaZnO_4$ crystal model shown in FIG. 25 was used for calculation. The activation barrier ($E_a$) along the reaction path where H in $V_o H$ is released from $V_o$ and bonded to oxygen was calculated by a nudged elastic band (NEB) method. The calculation conditions are shown in Table 3.

TABLE 3

| Software | VASP |
|---|---|
| Calculation method | NEB method |
| Functional | GGA-PBE |
| Pseudopotential | PAW |
| Cut-off energy | 500 eV |
| K points | 2 × 2 × 3 |

In the $InGaZnO_4$ crystal model, there are oxygen sites 1 to 4 as shown in FIG. 25 which differ from each other in metal elements bonded to oxygen and the number of bonded metal elements. Here, calculation was made on the oxygen sites 1 and 2 in which oxygen vacancy $V_o$ is easily formed.

First, calculation was made on the oxygen site in which oxygen vacancy $V_o$ is easily formed: an oxygen site 1 that was bonded to three In atoms and one Zn atom.

Figure 27:
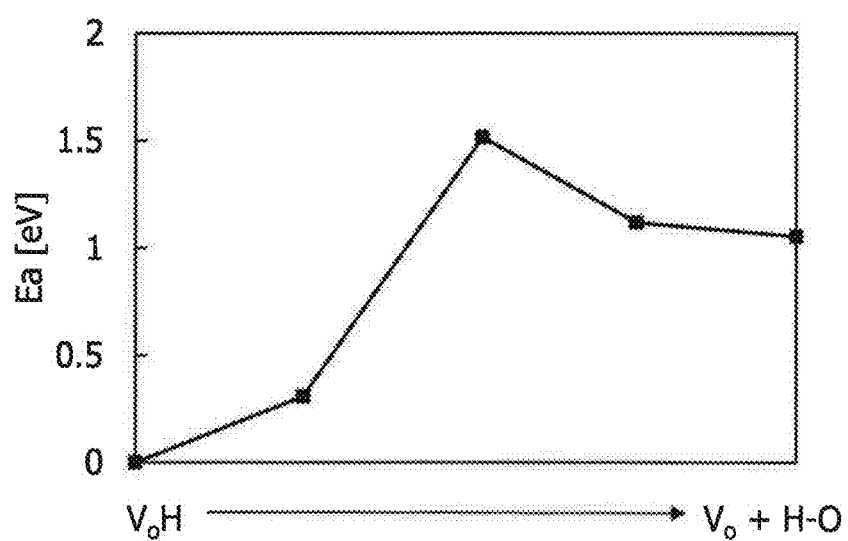
FIG. 27 shows an activation barrier.

FIG. 26A shows a model in the initial state and FIG. 26B shows a model in the final state. FIG. 27 shows the calculated activation barrier ($E_a$) in the initial state and the final state. Note that here, the initial state refers to a state in which H exists in oxygen vacancy $V_o$ ($V_o H$), and the final state refers to a structure including oxygen vacancy $V_o$ and a state in which H is bonded to oxygen bonded to one Ga atom and two Zn atoms (H—O).

From the calculation results, bonding of H in oxygen vacancy $V_o$ to another oxygen atom needs an energy of approximately 1.52 eV, while entry of H bonded to O into oxygen vacancy $V_o$ needs an energy of approximately 0.46 eV.

Reaction frequency (Γ) was calculated with use of the activation barriers ($E_a$) obtained by the calculation and Formula 6. In Formula 6, $k_B$ represents the Boltzmann constant and T represents the absolute temperature.

$$\Gamma = \nu \exp\left(-\frac{E_a}{k_B T}\right) \quad \text{[Formula 6]}$$

The reaction frequency at 350° C. was calculated on the assumption that the frequency factor $\nu=10^{13}$ [1/sec]. The frequency of H transfer from the model shown in FIG. 26A to the model shown in FIG. 26B was 5.52×10⁰ [1/sec], whereas the frequency of H transfer from the model shown in FIG. 26B to the model shown in FIG. 26A was 1.82×10⁹ [1/sec]. This suggests that H diffusing in IGZO is likely to form $V_oH$ if oxygen vacancy $V_o$ exists in the neighborhood, and H is unlikely to be released from the oxygen vacancy $V_o$ once $V_oH$ is formed.

Next, calculation was made on the oxygen site in which oxygen vacancy $V_o$ is easily formed: an oxygen site 2 that was bonded to one Ga atom and two Zn atoms.

Figure 29:
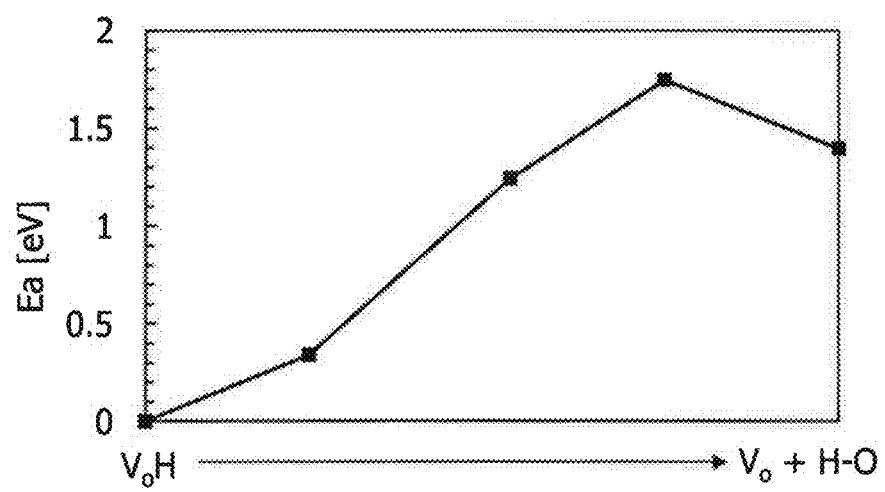
FIG. 29 shows an activation barrier.

FIG. 28A shows a model in the initial state and FIG. 28B shows a model in the final state. FIG. 29 shows the calculated activation barrier ($E_a$) in the initial state and the final state. Note that here, the initial state refers to a state in which H exists in oxygen vacancy $V_o$ ($V_oH$), and the final state refers to a structure including oxygen vacancy $V_o$ and a state in which H is bonded to oxygen bonded to one Ga atom and two Zn atoms (H—O).

From the calculation results, bonding of H in oxygen vacancy $V_o$ to another oxygen atom needs an energy of approximately 1.75 eV, while entry of H bonded to O in oxygen vacancy $V_o$ needs an energy of approximately 0.35 eV.

Reaction frequency (Γ) was calculated with use of the activation barriers ($E_a$) obtained by the calculation and Formula 6.

The reaction frequency at 350° C. was calculated on the assumption that the frequency factor $\nu=10^{13}$ [1/sec]. The frequency of H transfer from the model shown in FIG. 28A to the model shown in FIG. 28B was 7.53×10⁻² [1/sec], whereas the frequency of H transfer from the model shown in FIG. 28B to the model shown in FIG. 28A was 1.44×10¹⁰ [1/sec]. This suggests that H is unlikely to be released from the oxygen vacancy $V_o$ once $V_oH$ is formed.

From the above results, it was found that H in IGZO easily diffused in annealing and if oxygen vacancy $V_o$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where oxygen vacancy $V_o$ and H exist in IGZO, the oxygen vacancy $V_o$ and H easily form $V_oH$ and $V_oH$ is stable. To determine whether $V_oH$ is related to a carrier trap, the transition level of $V_oH$ was calculated.

The model used for calculation is an InGaZnO₄ crystal model (112 atoms). $V_oH$ models of the oxygen sites 1 and 2 shown in FIG. 25 were made to calculate the transition levels. The calculation conditions are shown in Table 4.

TABLE 4

| Software | VASP |
|---|---|
| Model | InGaZnO₄ crystal model (112 atoms) |
| Functional | HSE06 |
| Mixture ratio of exchange terms | 0.25 |
| Pseudopotential | GGA-PBE |
| Cut-off energy | 800 eV |
| K points | 1 × 1 × 1 |

The mixture ratio of exchange terms was adjusted to have a band gap close to the experimental value. As a result, the band gap of the InGaZnO₄ crystal model without defects was 3.08 eV that is close to the experimental value, 3.15 eV.

The transition level (ε(q/q')) of a model having defect D can be calculated by the following Formula 7. Note that $\Delta E(D^q)$ represents the formation energy of defect D at charge q, which is calculated by Formula 8.

$$\varepsilon(q/q') = \frac{\Delta E(D^q) - \Delta E(D^{q'})}{q' - q} \quad \text{[Formula 7]}$$

$$\Delta E(D^q) = \quad \text{[Formula 8]}$$
$$E_{tot}(D^q) - E_{tot}(\text{bulk}) + \sum_i \Delta n_i \mu_i + q(\varepsilon_{VBM} + \Delta V_q + E_F)$$

In Formulae 7 and 8, $E_{tot}(D^q)$ represents the total energy of the model having defect D at the charge q in, $E_{tot}(\text{bulk})$ represents the total energy in a model without defects (complete crystal), $\Delta n_i$ represents a change in the number of atoms i contributing to defects, represents the chemical potential of atom i, $\varepsilon_{VBM}$ represents the energy of the valence band maximum in the model without defects, $\Delta V_q$ represents the correction term relating to the electrostatic potential, and $E_F$ represents the Fermi energy.

Figure 30:
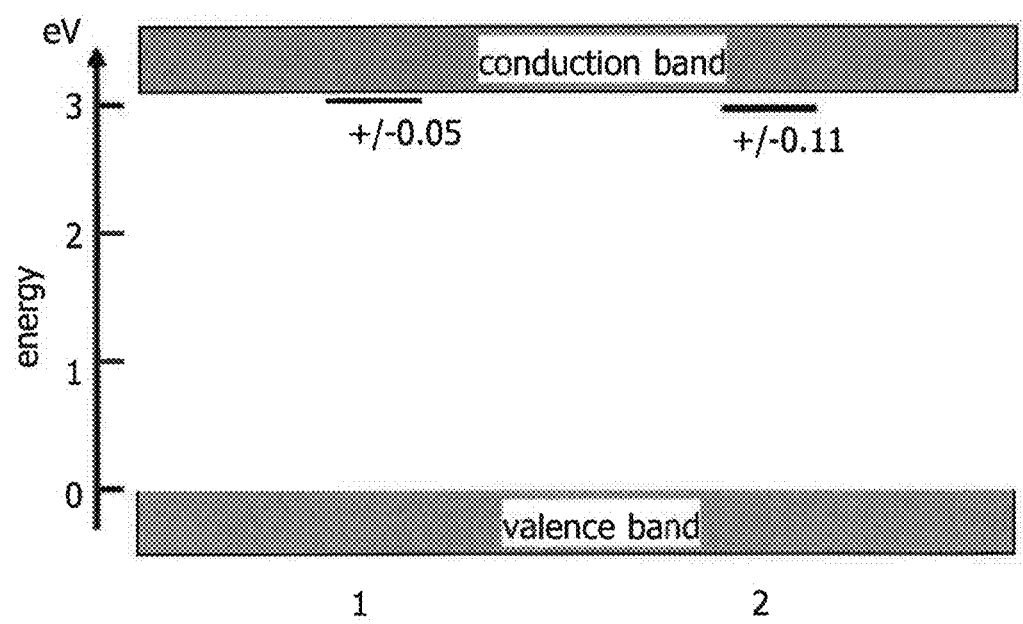
FIG. 30 shows the transition levels of VoH.

FIG. 30 shows the transition levels of $V_oH$ obtained from the above formulae. The numbers in FIG. 30 represent the depth from the conduction band minimum. In FIG. 30, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ would be related to electron traps, that is, $V_oH$ was found to behave as a donor. It was also found that IGZO including $V_oH$ had conductivity.

The structure described in this embodiment can be used in appropriate combination with any of the structures described in the other embodiments.

Embodiment 4

In this embodiment, an example of a display device that includes any of the transistors described in the embodiment above is described below with reference to FIG. 31, FIG. 32, and FIG. 33.

Figure 31:
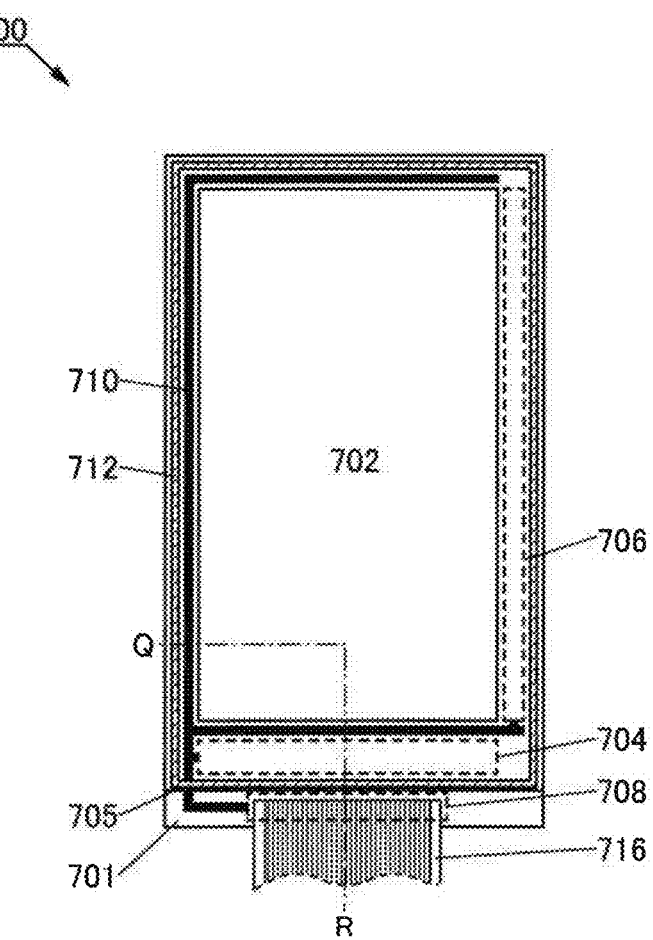
FIG. 31 is a top view illustrating one embodiment of a display device.

FIG. 31 is a top view of an example of a display device. A display device 700 illustrated in FIG. 31 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 31, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, a structure including a liquid crystal element and an EL element as display elements is described with reference to FIG. 32 and FIG. 33. Note that FIG. 32 is a cross-sectional view along the dashed-dotted line Q-R shown in FIG. 31 and shows a structure including a liquid crystal element as a display element, whereas FIG. 33 is a cross-sectional view along the dashed-dotted line Q-R shown in FIG. 31 and shows a structure including an EL element as a display element.

Figure 32:
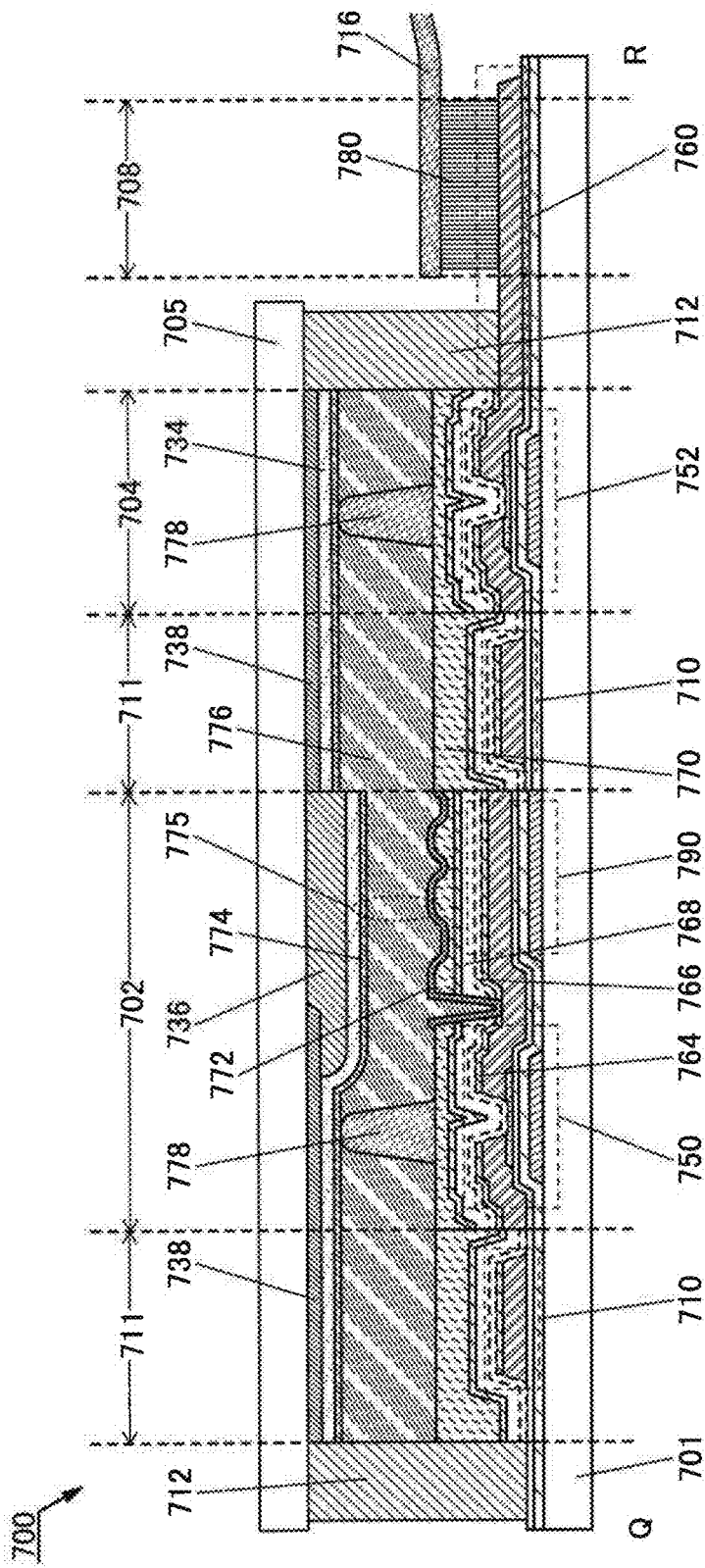
FIG. 32 is a cross-sectional view illustrating one embodiment of a display device.
Figure 33:
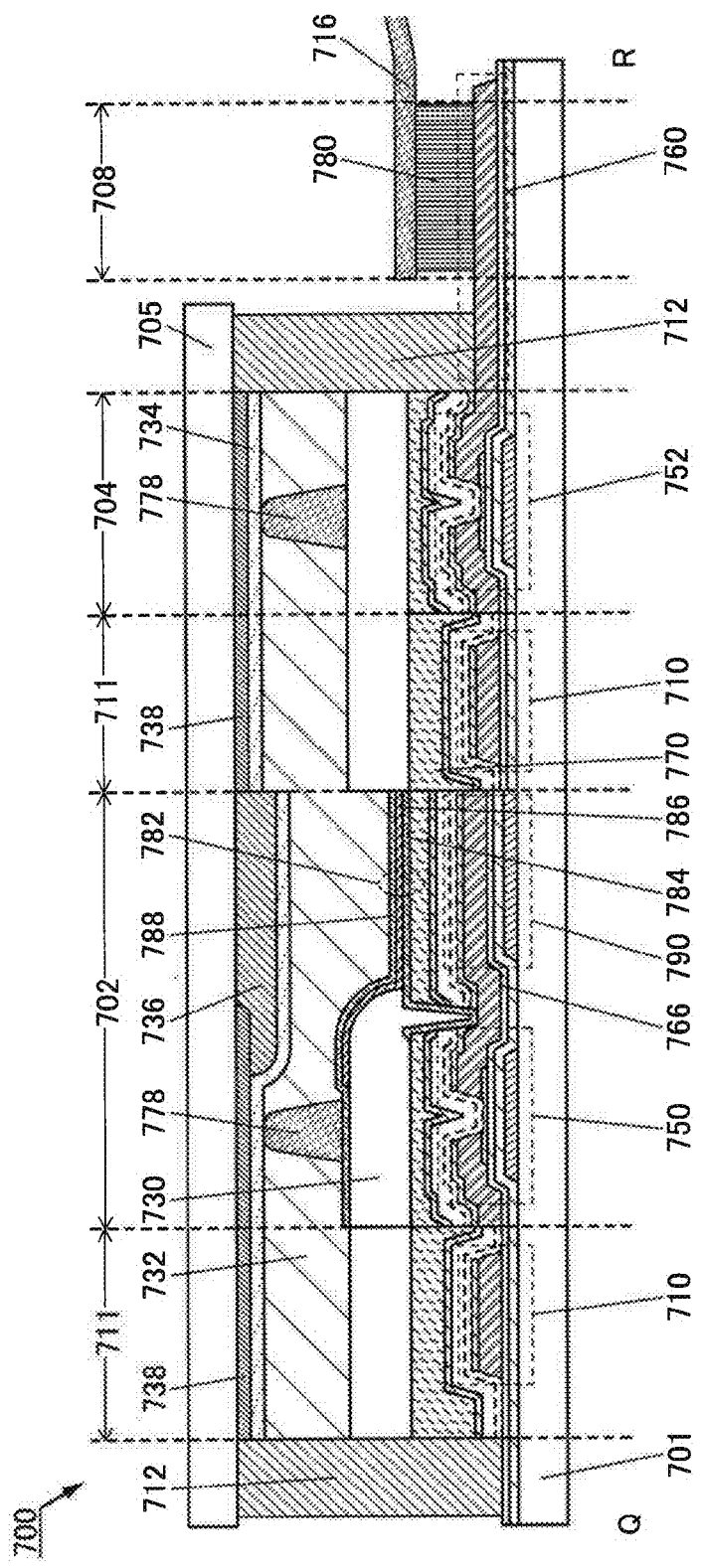
FIG. 33 is a cross-sectional view illustrating one embodiment of a display device.

Common portions between FIG. 32 and FIG. 33 are described first, and then different portions are described.

<Common Portions in Display Devices>

The display device 700 illustrated in FIG. 32 and FIG. 33 include a lead wiring portion 711, the pixel portion 702, the source driver circuit portion 704, and the FPC terminal portion 708. Note that the lead wiring portion 711 includes a signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 32 and FIG. 33, insulating films 764, 766, and 768 and a planarization insulating film 770 are formed over the transistor 750, the transistor 752, and the capacitor 790.

The insulating films 764, 766, and 768 can be formed using materials and methods similar to those of the insulating films 114, 116, and 118 described in the above embodiment, respectively. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 32 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 32 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display device 700 in FIG. 32 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display device 700 in FIG. 32. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 32 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 32, an alignment film may be provided on a side of the conductive film 772 in contact with the liquid crystal layer 776 and on a side of the conductive film 774 in contact with the liquid crystal layer 776. Although not illustrated in FIG. 32, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition which includes liquid crystal exhibiting a blue phase does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 33 includes a light-emitting element 782.

The light-emitting element 782 includes a conductive film 784, an EL layer 786, and a conductive film 788. The display device 700 shown in FIG. 33 is capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 shown in FIG. 33, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with the sealing film 732. Although a structure with the coloring film 736 is described as the display device 700 shown in FIG. 33, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

Embodiment 5

In this embodiment, a display device that includes a semiconductor device of one embodiment of the present invention is described with reference to FIGS. 34A to 34C.

The display device illustrated in FIG. 34A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Further, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 34A:
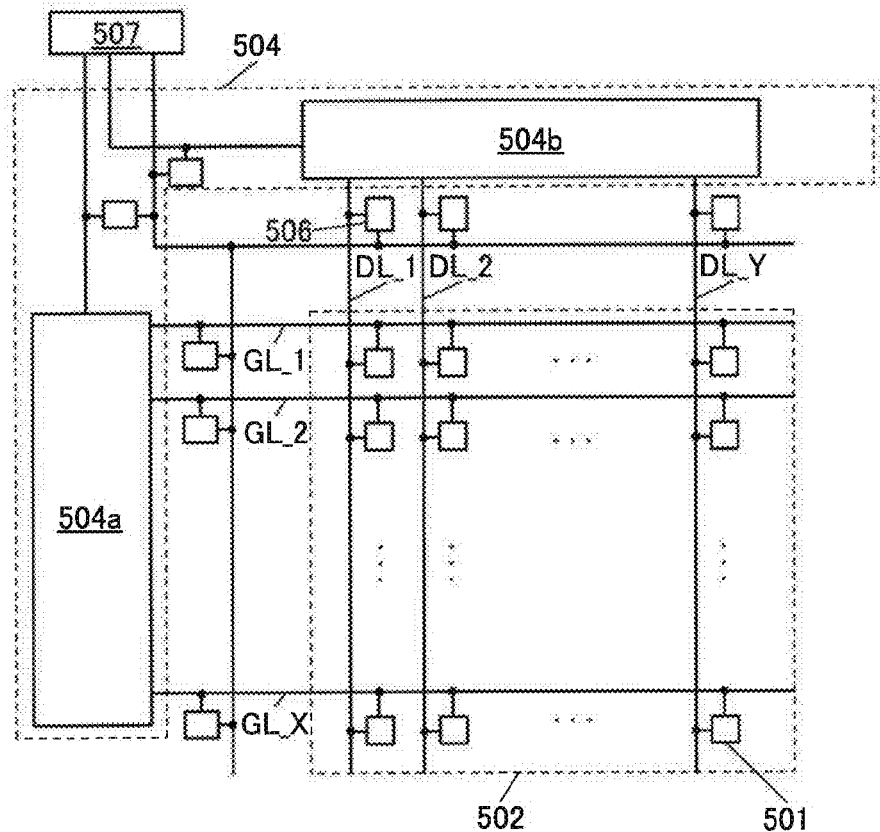
FIGS. 34A to 34C are a block diagram and circuit diagrams illustrating a display device.

The protection circuit 506 shown in FIG. 34A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 34A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 34A, an example in which the driver circuit portion 504 includes the gate driver 504a and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 34B:
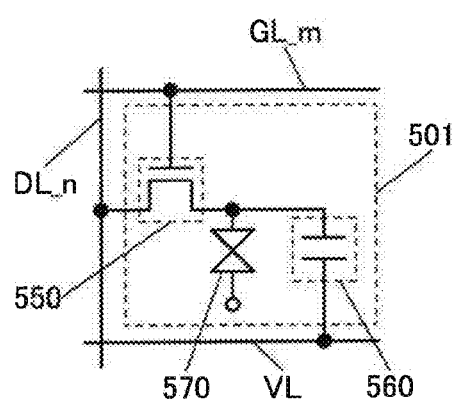

Each of the plurality of pixel circuits 501 in FIG. 34A can have the structure illustrated in FIG. 34B, for example.

The pixel circuit 501 illustrated in FIG. 34B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Further, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 34B, the pixel circuits 501 are sequentially selected row by row by the gate driver 504*a* illustrated in FIG. 34A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 34C:
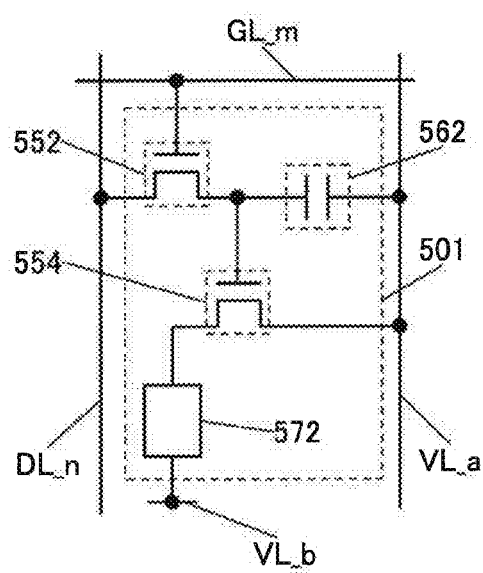

Alternatively, each of the plurality of pixel circuits 501 in FIG. 34A can have the structure illustrated in FIG. 34C, for example.

The pixel circuit 501 illustrated in FIG. 34C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Further, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 34C, the pixel circuits 501 are sequentially selected row by row by the gate driver 504*a* illustrated in FIG. 34A, whereby the transistors 552 are turned on and a data signal is written.

When the transistors 552 are turned off, the pixel circuits 501 in which the data has been written are brought into a holding state. Further, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with the structure described in any of the other embodiments.

Embodiment 6

In this embodiment, a display module and electronic appliances that include a semiconductor device of one embodiment of the present invention are described with reference to FIG. 35 and FIGS. 36A to 36H.

Figure 35:
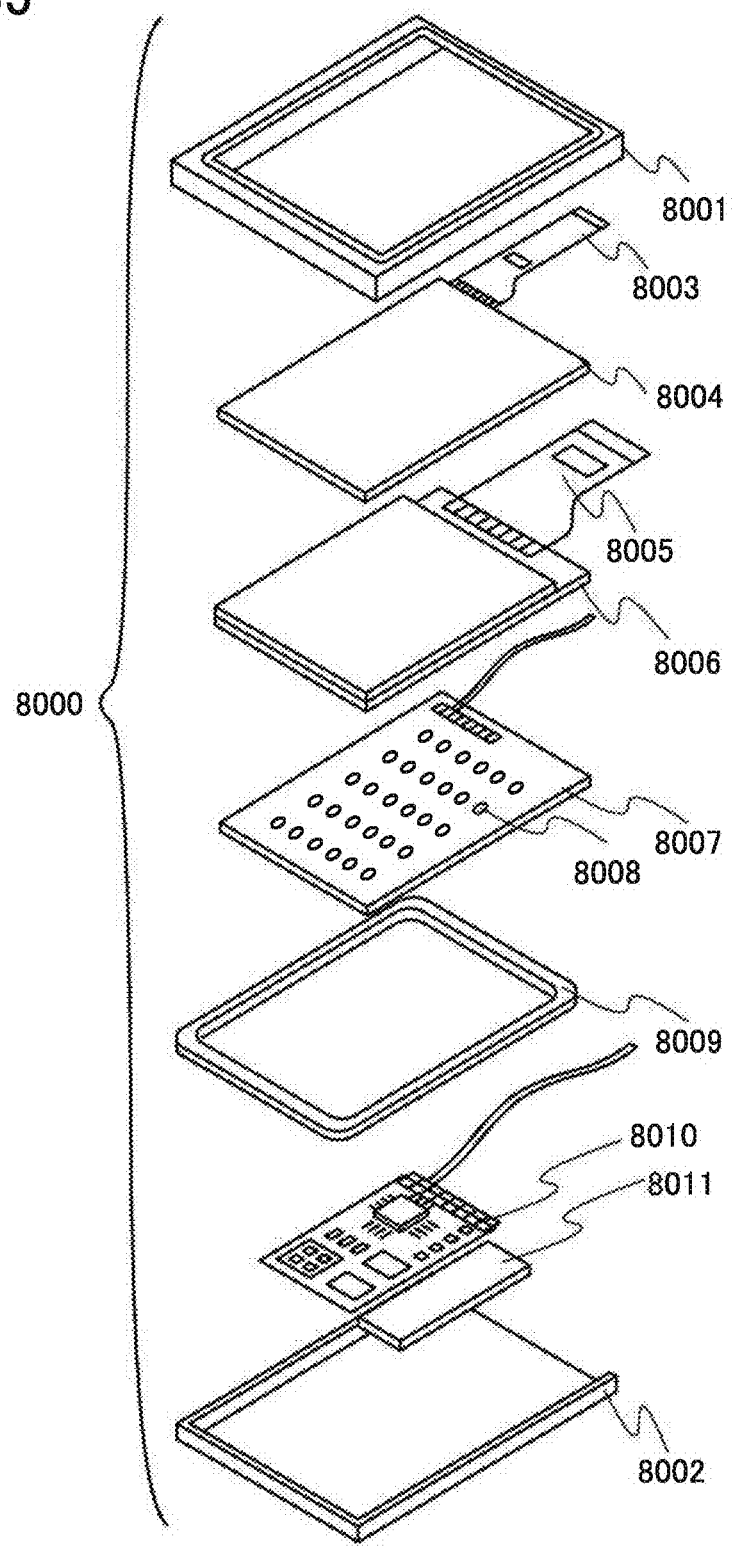
FIG. 35 illustrates a display module.

In a display module 8000 illustrated in FIG. 35, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. Note that although a structure in which the light sources 8008 are provided over the backlight unit 8007 is illustrated in FIG. 35, one embodiment of the present invention is not limited to this structure. For example, a structure in which the light source 8008 is provided at an end portion of the backlight unit 8007 and a light diffusion plate is further provided may be employed. Note that the backlight unit 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 36A to 36H illustrate electronic appliances. These electronic appliances can include a housing 9000, a display portion 9001, a speaker 9003, an LED lamp 9004, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

Figure 36A:
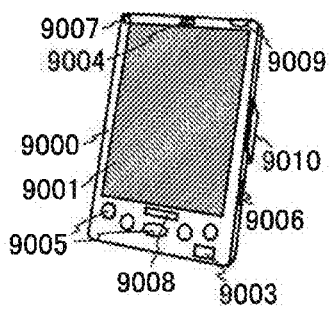
FIGS. 36A to 36H illustrate electronic appliances.
Figure 36B:
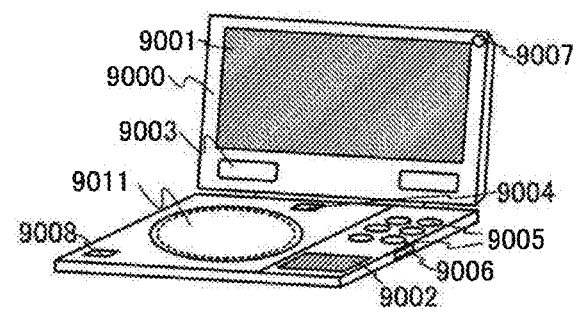
Figure 36C:
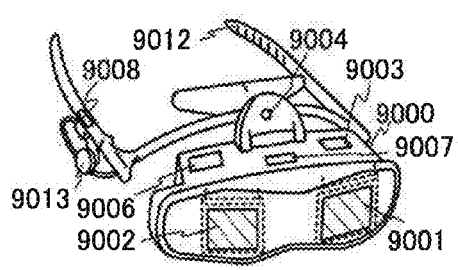
Figure 36D:
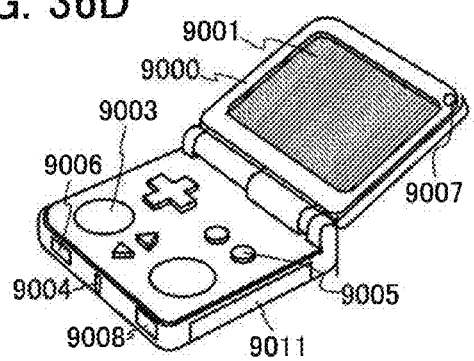
Figure 36E:
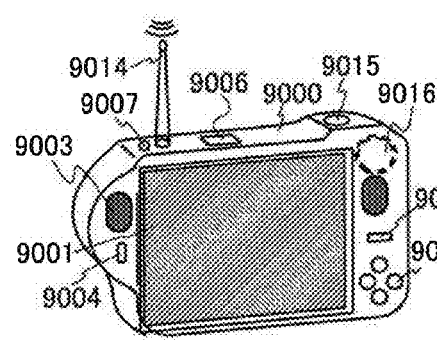
Figure 36F:
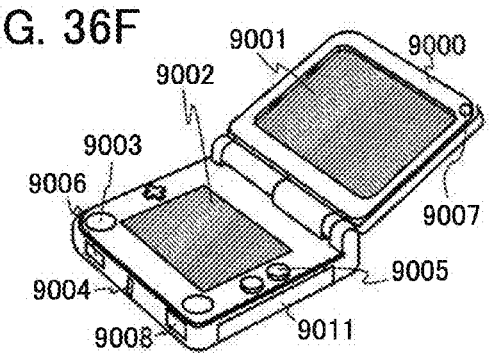
Figure 36G:
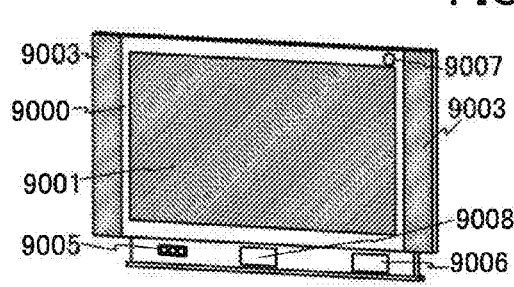
Figure 36H:
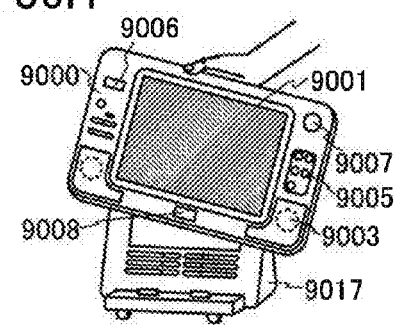

FIG. 36A illustrates a mobile computer that can include a switch 9009, an infrared port 9010, and the like in addition to the above components. FIG. 36B illustrates a portable image reproducing device (e.g., a DVD player) that is provided with a memory medium and can include a second display portion 9002, a memory medium reading portion 9011, and the like in addition to the above components. FIG. 36C illustrates a goggle-type display that can include the second display portion 9002, a support 9012, an earphone 9013, and the like in addition to the above components. FIG. 36D illustrates a portable game machine that can include the memory medium reading portion 9011 and the like in addition to the above components. FIG. 36E illustrates a digital camera that has a television reception function and can include an antenna 9014, a shutter button 9015, an image receiving portion 9016, and the like in addition to the above components. FIG. 36F illustrates a portable game machine that can include the second display portion 9002, the memory medium reading portion 9011, and the like in addition to the above components. FIG. 36G illustrates a television receiver that can include a tuner, an image processing portion, and the like in addition to the above components. FIG. 36H illustrates a portable television receiver that can include a charger 9017 capable of transmitting and receiving signals, and the like in addition to the above components.

The electronic appliances illustrated in FIGS. 36A to 36H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic appliance including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic appliance including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic appliances illustrated in FIGS. 36A to 36H are not limited to those described above, and the electronic appliances can have a variety of functions.

The electronic appliances described in this embodiment each include the display portion for displaying some sort of data. Note that the semiconductor device of one embodiment of the present invention can also be used for an electronic appliance that does not have a display portion.

Example

In this example, the amount of oxygen released from an insulating film included in a semiconductor device of one embodiment of the present invention was measured. Samples 1 to 10 described below were used for evaluation in this example.

(Sample 1)

Sample 1 was formed in such a manner that a 100-nm-thick silicon oxide film was formed over a glass substrate with a sputtering apparatus. The silicon oxide film was deposited under the conditions where the substrate temperature was 100° C., an oxygen gas at a flow rate of 50 sccm was introduced into a chamber, the pressure was 0.5 Pa, and a DC power of 6000 W was supplied to a silicon sputtering target.

(Sample 2)

Sample 2 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment.

(Sample 3)

Sample 3 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Then, oxygen addition treatment is performed on the silicon oxynitride film.

(Sample 4)

Sample 4 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Next, a 5-nm-thick oxide semiconductor film (an IGZO film with In:Ga:Zn=1:1:1) was formed with a sputtering apparatus. Then, oxygen addition treatment was performed through the oxide semiconductor film. After that, the oxide semiconductor film was removed to expose the silicon oxynitride film.

(Sample 5)

Sample 5 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Next, a 5-nm-thick tungsten film was formed with a sputtering apparatus. Then, oxygen addition treatment was performed through the tungsten film. After that, the tungsten film was removed to expose the silicon oxynitride film.

(Sample 6)

Sample 6 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Next, a 5-nm-thick tantalum nitride film was formed with a sputtering apparatus. Then, oxygen addition treatment was performed through the tantalum nitride film. After that, the tantalum nitride film was removed to expose the silicon oxynitride film.

(Sample 7)

Sample 7 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Next, a 5-nm-thick titanium film was formed with a sputtering apparatus. Then, oxygen addition treatment was performed through the titanium film. After that, the titanium film was removed to expose the silicon oxynitride film.

(Sample 8)

Sample 8 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Next, a 5-nm-thick aluminum film was formed with a sputtering apparatus. Then, oxygen addition treatment was performed through the aluminum film. After that, the aluminum film was removed to expose the silicon oxynitride film.

(Sample 9)

Sample 9 was formed in such a manner that a 100-nm-thick silicon nitride film and a 400-nm-thick silicon oxynitride film over the 100-nm-thick silicon nitride film were formed over a glass substrate with a PECVD apparatus and subjected to heat treatment. Next, a 5-nm-thick ITSO film was formed with a sputtering apparatus. Then, oxygen addition treatment was performed through the ITSO film. After that, the ITSO film was removed to expose the silicon oxynitride film. Note that the composition ratio of $In_2O_3$ to $SnO_2$ and $SiO_2$ in the target used for forming the ITSO film was 85:10:5 [wt %].

(Sample 10)

Sample 10 was formed in such a manner that a 100-nm-thick silicon nitride film was formed over a glass substrate with a PECVD apparatus.

The heat treatment performed on each of Samples 2 to 9 was performed at 650° C. for 6 minutes in a nitrogen atmosphere with an RTA apparatus. By the heat treatment, oxygen included in the silicon oxynitride film at the time of deposition is released from the silicon oxynitride film.

The silicon nitride film used in each of Samples 2 to 10 was deposited under the conditions where the substrate temperature was 350° C.; a silane gas at a flow rate of 200 sccm, a nitrogen gas at a flow rate of 2000 sccm, and an ammonia gas at a flow rate of 2000 sccm were introduced into a chamber; the pressure was 100 Pa; and an RF power of 2000 W was supplied between parallel-plate electrodes provided in a PECVD apparatus.

The silicon oxynitride film in each of Samples 2 to 9 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

The oxygen addition treatment performed on each of Samples 3 to 9 was conducted with an etching apparatus under the conditions where the substrate temperature was 40° C., an oxygen gas ($^{16}O$) at a flow rate of 250 sccm was introduced into a chamber, the pressure was 15 Pa, and an RF power of 4500 W was supplied between parallel-plate electrodes provided in the etching apparatus so that a bias would be applied to the substrate side.

The amount of a gas having a mass-to-charge ratio (M/z) of 32, i.e., oxygen ($O_2$), released from each of Samples 1 to 10 was measured. A TDS analysis apparatus was used for measuring the amount of released gas. In this example, the temperature of the film surface in the TDS analysis was higher than or equal to 50° C. and lower than or equal to 550° C.

Figure 50:
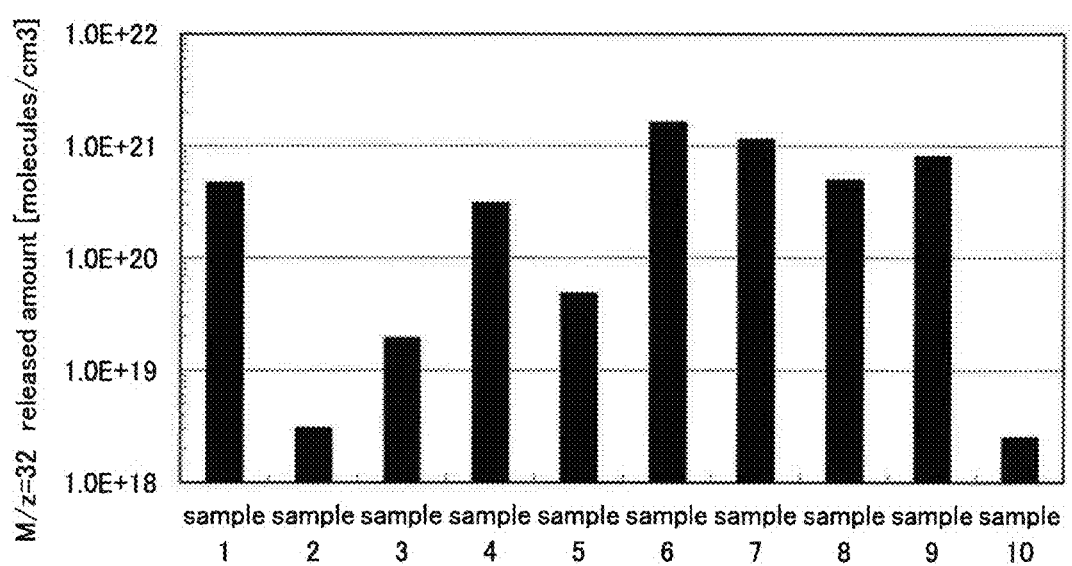
FIG. 50 shows TDS measurement results.

FIG. 50 shows the TDS measurement results of Samples 1 to 10. In FIG. 50, the horizontal axis shows the name of the sample, and the vertical axis represents the amount of released gas with M/z=32.

According to the results in FIG. 50, the amount of a gas with M/z=32 released from Sample 1 was $5 \times 10^{20}/cm^3$. The amount of a gas with M/z=32 released from Sample 2 was $3 \times 10^{18}/cm^3$. The amount of a gas with M/z=32 released from Sample 3 was $2 \times 10^{19}/cm^3$. The amount of a gas with M/z=32 released from Sample 4 was $3 \times 10^{20}/cm^3$. The amount of a gas with M/z=32 released from Sample 5 was $5 \times 10^{19}/cm^3$. The amount of a gas with M/z=32 released from Sample 6 was $2 \times 10^{21}/cm^3$. The amount of a gas with M/z=32 released from Sample 7 was $1\times10^{21}$/cm$^3$. The amount of a gas with M/z=32 released from Sample 8 was $5\times10^{20}$/cm$^3$. The amount of a gas with M/z=32 released from Sample 9 was $8\times10^{20}$/cm$^3$. The amount of a gas with M/z=32 released from Sample 10 was $3\times10^{18}$/cm$^3$.

The results indicate that such an amount of oxygen was released from Sample 1 because a sputtering apparatus was used for depositing the silicon oxide film in Sample 1 and thus the silicon oxide film had excess oxygen, and further, heat treatment was not performed. In addition, the amount of oxygen released from Sample 2 was smaller than those of oxygen released from the other samples because heat treatment was performed after formation of the silicon oxynitride film in Sample 2 to release oxygen from the silicon oxynitride film. Furthermore, the amount of oxygen released from each of Samples 3 to 9 was larger than that of oxygen released from Sample 2 because oxygen addition treatment was performed on each of Samples 3 to 9 after heat treatment. Moreover, the amount of oxygen released from each of Samples 4 to 9 was larger than that of oxygen released from Sample 3 because the metal film, the metal nitride film, or the metal oxide film was provided over the silicon oxynitride film, and oxygen was added to the silicon oxynitride film through the metal film, the metal nitride film, or the metal oxide film. In particular, the amount of oxygen released from Sample 6, i.e., the structure that included a silicon oxynitride film and a tantalum nitride film over the silicon oxynitride film and was subjected to oxygen addition treatment, was the largest of those of oxygen released from the samples. Furthermore, the amount of oxygen released from Sample 10 was small because a gas containing oxygen was not used for deposition.

As described above, Sample 1 and Samples 3 to 9 each included an insulating film capable of releasing oxygen by heating, and the amount of oxygen released from each of Sample 1 and Samples 3 to 9 was, when converted into oxygen molecules, greater than or equal to $1\times10^{19}$/cm$^3$. Therefore, such an insulating film can be used as the fifth insulating film of the semiconductor device of one embodiment of the present invention. Furthermore, the insulating films in Sample 2 and Sample 10 can each be used as the third insulating film over the source electrode or the fourth insulating film over the drain electrode.

The structure described above in this example can be combined with any of the structures described in the other embodiments and examples as appropriate.

EXPLANATION OF REFERENCE

100: transistor, 100A: transistor, 100B: transistor, 100C: transistor, 100D: transistor, 100E: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112: conductive film, 112a: conductive film, 112b: conductive film, 113: insulating film, 113a: insulating film, 113b: insulating film, 114: insulating film, 116: insulating film, 118: insulating film, 120: conductive film, 120a: conductive film, 120b: conductive film, 130: film, 131: insulating film, 140a: mask, 140b: mask, 141: etching gas, 141a: opening, 141b: opening, 142: oxygen, 142a: opening, 142b: opening, 142c: opening, 150: transistor, 150A: transistor, 160: transistor, 160A: transistor, 170: transistor, 170A: transistor, 170B: transistor, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: coloring film, 750: transistor, 752: transistor, 760: connection electrode, 764: insulating film, 766: insulating film, 768: insulating film, 770: planarization insulating film, 772: conductive film, 774: conductive film, 775: liquid crystal element, 776: liquid crystal layer, 778: structure body, 780: anisotropic conductive film, 782: light-emitting element, 784: conductive film, 786: EL layer, 788: conductive film, 790: capacitor, 1100: pellet, 1100a: pellet, 1100b: pellet, 1101: ion, 1120: substrate, 1130: target, 5100: pellet, 5120: substrate, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery, 9000: housing, 9001: display portion, 9002: display portion, 9003: speaker, 9004: LED lamp, 9005: operation key, 9006: connection terminal, 9007: sensor, 9008: microphone, 9009: switch, 9010: infrared port, 9011: memory medium reading portion, 9012: support, 9013: earphone, 9014: antenna, 9015: shutter button, 9016: image receiving portion, 9017: charger.

This application is based on Japanese Patent Application serial no. 2014-039139 filed with Japan Patent Office on Feb. 28, 2014, the entire contents of which are hereby incorporated by reference.

The invention claimed is:

1. A method of forming a semiconductor device comprising steps of:

forming a gate electrode over an insulator;

forming a first insulating film over the gate electrode;

forming an oxide semiconductor film over the first insulating film;

forming a source electrode and a drain electrode each on and in contact with the oxide semiconductor film;

forming a second insulating film over each of the source electrode, the drain electrode, and the oxide semiconductor film;

forming a third insulating film on and in contact with the second insulating film;

forming a fourth insulating film on and in contact with the source electrode; and forming a fifth insulating film on and in contact with the drain electrode, wherein the second insulating film and the third insulating film are formed in succession without exposure to air, and wherein a first amount of oxygen molecules released from the fourth insulating film and a second amount of oxygen molecules released from the fifth insulating film are each smaller than a third amount of oxygen molecules released from the third insulating film in thermal desorption spectroscopy.

2. The method of forming the semiconductor device according to claim 1, wherein the fourth insulating film is in contact with an inner side surface of the source electrode and a top surface of the oxide semiconductor film, and wherein the fifth insulating film is in contact with an inner side surface of the drain electrode and the top surface of the oxide semiconductor film.

3. The method of forming the semiconductor device according to claim 1, wherein the fourth insulating film and the fifth insulating film each include nitrogen and silicon, and wherein the third insulating film includes oxygen, nitrogen, and silicon.

4. The method of forming the semiconductor device according to claim 1, wherein the first amount and the second amount are each less than $1\times10^{19}/cm^3$, and wherein the third amount is greater than or equal to $1\times10^{19}/cm^3$.

5. The method of forming the semiconductor device according to claim 1, wherein the third amount is greater than or equal to $1\times10^{21}/cm^3$.

6. The method of forming the semiconductor device according to claim 1, further comprising a step of forming a film over each of the fourth insulating film, the fifth insulating film, and the oxide semiconductor film, wherein the film inhibits release of oxygen, and wherein oxygen is added to the oxide semiconductor film through the film.

7. The method of forming the semiconductor device according to claim 6, wherein thickness of the film is greater than or equal to 1 nm and less than or equal to 20 nm.

8. The method of forming the semiconductor device according to claim 1, further comprising a step of performing a heat treatment after formation of the third insulating film, wherein the heat treatment is performed at temperature higher than or equal to 150° C. and lower than or equal to 400° C.

9. The method of forming the semiconductor device according to claim 1, further comprising a step of forming a sixth insulating film between the gate electrode and the first insulating film.

10. The method of forming the semiconductor device according to claim 1, wherein the third insulating film is formed just after forming fourth insulating layer by adjusting at least one of a flow rate of a source gas, a pressure, a high-frequency power, and a substrate temperature.

11. The method of forming the semiconductor device according to claim 1, wherein the second insulating film includes a metal and at least one of oxygen and nitrogen, and wherein the metal includes at least one of indium, zinc, titanium, aluminum, tungsten, tantalum, and molybdenum.

12. The method of forming the semiconductor device according to claim 1, wherein the second insulating film includes silicon and at least one of oxygen and nitrogen.

13. A method of forming a semiconductor device comprising steps of:

forming a first insulating film;

forming an oxide semiconductor film over the first insulating film;

forming a source electrode and a drain electrode each on and in contact with the oxide semiconductor film;

forming a second insulating film over each of the source electrode, the drain electrode, and the oxide semiconductor film;

forming a third insulating film on and in contact with the second insulating film;

forming a fourth insulating film on and in contact with the source electrode; and forming a fifth insulating film on and in contact with the drain electrode, wherein the second insulating film and the third insulating film are formed in succession without exposure to air, and wherein a first amount of oxygen molecules released from the fourth insulating film and a second amount of oxygen molecules released from the fifth insulating film are each smaller than a third amount of oxygen molecules released from the third insulating film in thermal desorption spectroscopy.

14. The method of forming the semiconductor device according to claim 13, wherein the fourth insulating film is in contact with an inner side surface of the source electrode and a top surface of the oxide semiconductor film, and wherein the fifth insulating film is in contact with an inner side surface of the drain electrode and the top surface of the oxide semiconductor film.

15. The method of forming the semiconductor device according to claim 13, wherein the fourth insulating film and the fifth insulating film each include nitrogen and silicon, and wherein the third insulating film includes oxygen, nitrogen, and silicon.

16. The method of forming the semiconductor device according to claim 13, wherein the first amount and the second amount are each less than $1\times10^{19}/cm^3$, and wherein the third amount is greater than or equal to $1\times10^{19}/cm^3$.

17. The method of forming the semiconductor device according to claim 13, wherein the third amount is greater than or equal to $1\times10^{21}/cm^3$.

18. The method of forming the semiconductor device according to claim 13, further comprising a step of forming a film over each of the fourth insulating film, the fifth insulating film, and the oxide semiconductor film, wherein the film inhibits release of oxygen, and wherein oxygen is added to the oxide semiconductor film through the film.

19. The method of forming the semiconductor device according to claim 18, wherein thickness of the film is greater than or equal to 1 nm and less than or equal to 20 nm.

20. The method of forming the semiconductor device according to claim 13, further comprising a step of performing a heat treatment after formation of the third insulating film, wherein the heat treatment is performed at temperature higher than or equal to 150° C. and lower than or equal to 400° C.

21. The method of forming the semiconductor device according to claim 13, further comprising a step of forming a sixth insulating film before forming the first insulating film.

22. The method of forming the semiconductor device according to claim 13, wherein the third insulating film is formed just after forming fourth insulating layer by adjusting at least one of a flow rate of a source gas, a pressure, a high-frequency power, and a substrate temperature.

23. The method of forming the semiconductor device according to claim 13, wherein the second insulating film includes a metal and at least one of oxygen and nitrogen, and wherein the metal includes at least one of indium, zinc, titanium, aluminum, tungsten, tantalum, and molybdenum.

24. The method of forming the semiconductor device according to claim 13, wherein the second insulating film includes silicon and at least one of oxygen and nitrogen.

25. A method of forming a semiconductor device comprising steps of:
- forming a first insulating film;
- forming an oxide semiconductor film over the first insulating film;
- forming a source electrode and a drain electrode each on and in contact with the oxide semiconductor film;
- forming a second insulating film over each of the source electrode, the drain electrode, and the oxide semiconductor film;
- forming a third insulating film on and in contact with the second insulating film;
- forming a fourth insulating film on and in contact with the source electrode;
- forming a fifth insulating film on and in contact with the drain electrode; and
- forming a film over each of the fourth insulating film, the fifth insulating film, and the oxide semiconductor film,
- wherein the second insulating film and the third insulating film are formed in succession without exposure to air,
- wherein the film inhibits release of oxygen, and
- wherein oxygen is added to the oxide semiconductor film through the film.

26. The method of forming the semiconductor device according to claim 25,
- wherein the fourth insulating film is in contact with an inner side surface of the source electrode and a top surface of the oxide semiconductor film, and
- wherein the fifth insulating film is in contact with an inner side surface of the drain electrode and the top surface of the oxide semiconductor film.

27. The method of forming the semiconductor device according to claim 25, wherein the fourth insulating film and the fifth insulating film each include nitrogen and silicon, and wherein the third insulating film includes oxygen, nitrogen, and silicon.

28. The method of forming the semiconductor device according to claim 25, wherein thickness of the film is greater than or equal to 1 nm and less than or equal to 20 nm.

29. The method of forming the semiconductor device according to claim 25, further comprising a step of performing a heat treatment after formation of the third insulating film,
- wherein the heat treatment is performed at temperature higher than or equal to 150° C. and lower than or equal to 400° c.

30. The method of forming the semiconductor device according to claim 25, further comprising a step of forming a sixth insulating film before forming the first insulating film.

31. The method of forming the semiconductor device according to claim 25, wherein the third insulating film is formed just after forming fourth insulating layer by adjusting at least one of a flow rate of a source gas, a pressure, a high-frequency power, and a substrate temperature.

32. The semiconductor device according to claim 25, wherein the second insulating film includes a metal and at least one of oxygen and nitrogen, and
- wherein the metal includes at least one of indium, zinc, titanium, aluminum, tungsten, tantalum, and molybdenum.

33. The semiconductor device according to claim 25, wherein the second insulating film includes silicon and at least one of oxygen and nitrogen.

* * * * *